United States Patent
Ohashi et al.

(10) Patent No.: US 12,174,536 B2
(45) Date of Patent: *Dec. 24, 2024

(54) RESIST COMPOSITION AND PATTERN FORMING PROCESS

(71) Applicant: Shin-Etsu Chemical Co., Ltd., Tokyo (JP)

(72) Inventors: Masaki Ohashi, Joetsu (JP); Ryosuke Taniguchi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 349 days.

This patent is subject to a terminal disclaimer.

(21) Appl. No.: 17/524,085

(22) Filed: Nov. 11, 2021

(65) Prior Publication Data

US 2022/0155687 A1 May 19, 2022

(30) Foreign Application Priority Data

Nov. 19, 2020 (JP) ................................. 2020-192128

(51) Int. Cl.
| | | |
|---|---|---|
| G03F 7/004 | (2006.01) |
| G03F 7/039 | (2006.01) |
| G03F 7/20 | (2006.01) |
| G03F 7/30 | (2006.01) |
| G03F 7/32 | (2006.01) |
| G03F 7/40 | (2006.01) |

(52) U.S. Cl.
CPC .......... G03F 7/0042 (2013.01); G03F 7/0045 (2013.01); G03F 7/0392 (2013.01); G03F 7/0397 (2013.01); G03F 7/2004 (2013.01); G03F 7/30 (2013.01); G03F 7/322 (2013.01); G03F 7/40 (2013.01)

(58) Field of Classification Search
CPC .... G03F 7/0392; G03F 7/0045; G03F 7/2004; G03F 7/322; G03F 7/40; G03F 7/004; G03F 7/039; G03F 7/0042; G03F 7/0397; C07C 381/12; C07C 391/00; C07C 391/02; C07C 381/00
USPC ...................................................... 430/270.1
See application file for complete search history.

(56) References Cited

U.S. PATENT DOCUMENTS

| | | |
|---|---|---|
| 6,479,210 B2 | 11/2002 | Kinoshita et al. |
| 6,485,883 B2 | 11/2002 | Kodama et al. |
| 6,492,091 B2 | 12/2002 | Kodama et al. |
| 7,214,467 B2 | 5/2007 | Kanna et al. |
| 9,075,306 B2 | 7/2015 | Takeda et al. |
| 2006/0166133 A1 | 7/2006 | Koitabashi et al. |
| 2010/0009286 A1 | 1/2010 | Takeda et al. |
| 2010/0316955 A1 | 12/2010 | Masunaga et al. |
| 2011/0171577 A1 | 7/2011 | Tsuchimura et al. |
| 2017/0329227 A1* | 11/2017 | Ohashi .................. G03F 7/0397 |
| 2018/0180992 A1 | 6/2018 | Kotake et al. |
| 2018/0180998 A1 | 6/2018 | Kotake et al. |

FOREIGN PATENT DOCUMENTS

| | | |
|---|---|---|
| EP | 1 684 118 A1 | 7/2006 |
| EP | 1 975 711 A1 | 10/2008 |
| JP | H11-327143 A | 11/1999 |
| JP | 2006-201532 A | 8/2006 |
| JP | 2006-215180 A | 8/2006 |
| JP | 3955384 B2 | 8/2007 |
| JP | 4116340 B2 | 7/2008 |
| JP | 2008-249762 A | 10/2008 |
| JP | 4226803 B2 | 2/2009 |
| JP | 2009-53518 A | 3/2009 |
| JP | 4231622 B2 | 3/2009 |
| JP | 2010-100604 A | 5/2010 |
| JP | 4575479 B2 | 11/2010 |
| JP | 2011-22564 A | 2/2011 |
| JP | 5083528 B2 | 11/2012 |

OTHER PUBLICATIONS

Non-Final Office Action dated Jan. 31, 2024, issued in U.S. Appl. No. 17/591,741. (18 pages).
Non-Final Office Action dated Jan. 30, 2024, issued in U.S. Appl. No. 17/591,719. (18 pages).

* cited by examiner

*Primary Examiner* — John S Chu
(74) *Attorney, Agent, or Firm* — WHDA, LLP

(57) ABSTRACT

A resist composition is provided comprising (A) a sulfurane or selenurane compound, (B) an organic solvent, and (C) a base polymer comprising repeat units having an acid labile group. By virtue of the acid diffusion inhibitory function of the compound, the resist composition forms a resist pattern having improved LWR and CDU when it is processed by lithography using high-energy radiation.

8 Claims, 3 Drawing Sheets

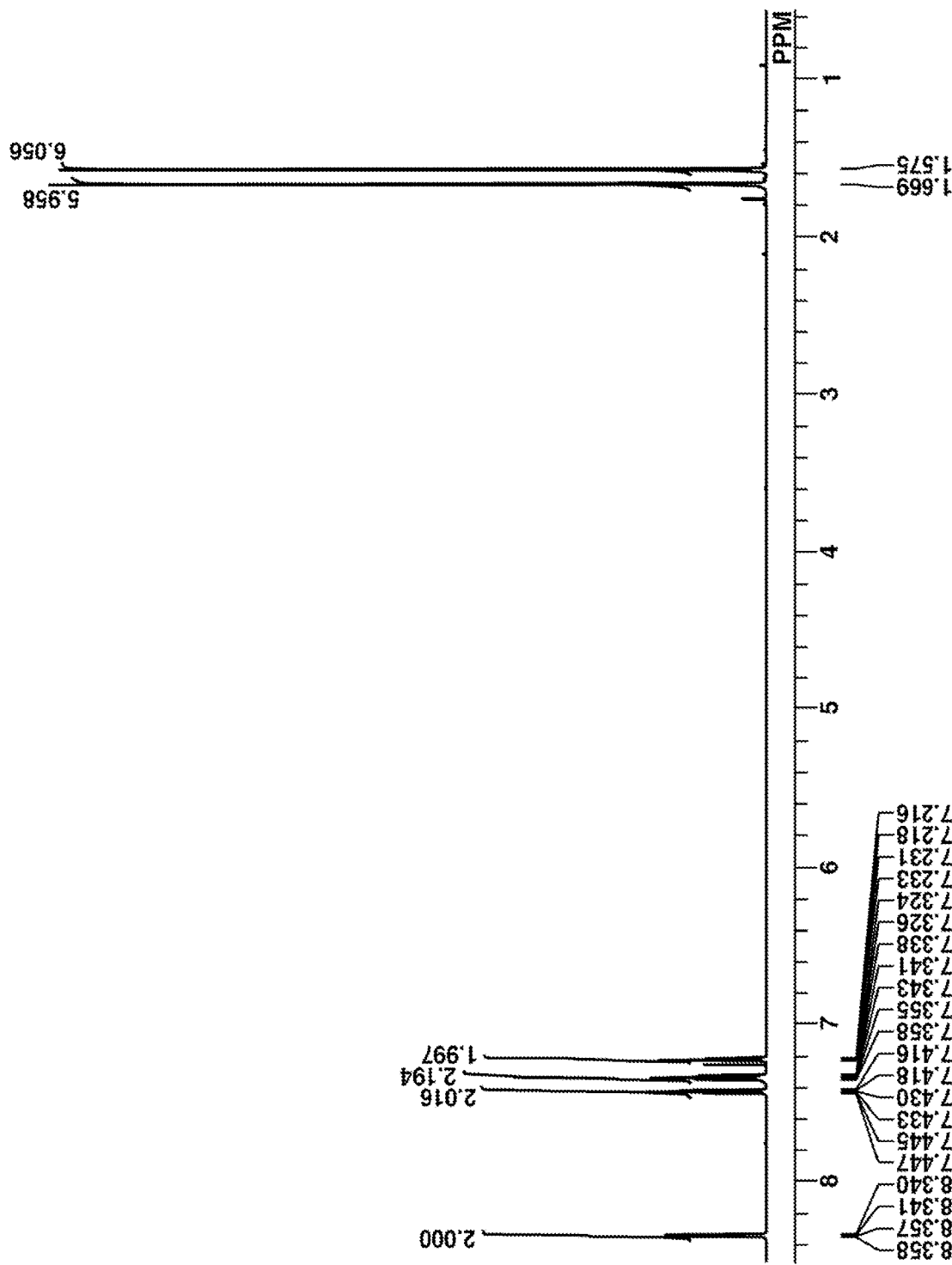

RESIST COMPOSITION AND PATTERN FORMING PROCESS

CROSS-REFERENCE TO RELATED APPLICATION

This non-provisional application claims priority under 35 U.S.C. § 119(a) on Patent Application No. 2020-192128 filed in Japan on Nov. 19, 2020, the entire contents of which are hereby incorporated by reference.

TECHNICAL FIELD

This invention relates to a resist composition and a pattern forming process.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With the rapid progress toward miniaturization, it becomes difficult to form a pattern of desired size from prior art resist materials. As the pattern size is approaching the diffusion length of acid, the influence of acid diffusion becomes more detrimental to the pattern formation after exposure. This eventually invites degradation of contrast, fluctuation of pattern line width, known as line width roughness (LWR), and degradation of critical dimension uniformity (CDU) of patterns.

To solve the outstanding problems, studies are made not only on base polymers and photoacid generators, but also on acid diffusion inhibitors. Amines are typically used as the acid diffusion inhibitor. They are insufficient to improve LWR as an index of pattern roughness, with many problems being left unsolved. Also the use of weak acid onium salts as the acid diffusion inhibitor is under study. For example, Patent Document 1 describes a positive photosensitive composition for ArF excimer laser lithography comprising a carboxylic acid onium salt. The composition is based on the mechanism that a salt exchange occurs between a weak acid onium salt and a strong acid (sulfonic acid) generated by another PAG upon exposure. The strong acid (α,α-difluorosulfonic acid) having high acidity is replaced by a weak acid (alkanesulfonic acid or carboxylic acid), thereby suppressing acid-aided decomposition reaction of acid labile groups and reducing or controlling the distance of acid diffusion. The onium salt apparently functions as a quencher, that is, acid diffusion inhibitor. Such onium salt type acid diffusion inhibitors are effective for improving LWR and CDU to some extent, but still unsatisfactory in the formation of narrower pitch patterns as required in the advanced miniaturization technology. There exists a need for a better resist material.

CITATION LIST

Patent Document 1: JP 4226803 (U.S. Pat. No. 6,492,091)

DISCLOSURE OF INVENTION

An object of the invention is to provide a resist composition comprising a compound having an acid diffusion inhibitory capability that greatly contributes to improvements in lithography performance, especially LWR and CDU, when the composition is processed by high-energy radiation lithography, and a pattern forming process using the resist composition.

The inventors have found that a resist composition comprising a sulfurane or selenurane compound of specific structure can be processed by lithography to form a resist pattern with improved LWR and CDU, and is suited for high accuracy micropatterning.

In one aspect, the invention provides a resist composition comprising (A) a compound having the formula (1), (B) an organic solvent, and (C) a base polymer comprising repeat units having an acid labile group.

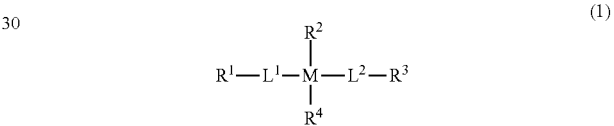

Herein $R^1$ to $R^4$ are each independently a $C_1$-$C_{20}$ hydrocarbyl group which may contain a heteroatom, $R^1$ and $R^2$ may bond together to form a ring with $L^1$ and M to which they are attached, each pair of $R^1$ and $R^2$, and $R^3$ and $R^4$ may bond together to form a spiro ring containing M as the spiro atom. $L^1$ and $L^2$ are each independently —O— or —N(R)—, wherein R is hydrogen or a $C_1$-$C_{20}$ hydrocarbyl group which may contain a heteroatom. M is sulfur or selenium.

In one preferred embodiment, the repeat units having an acid labile group are represented by the formula (a1) or (a2).

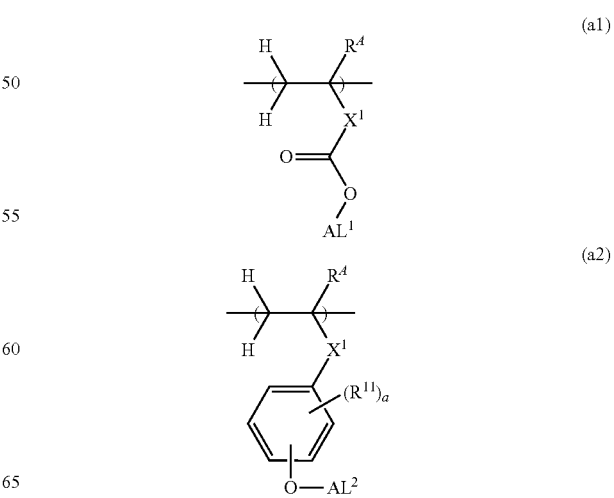

Herein R$^A$ is each independently hydrogen, fluorine, methyl or trifluoromethyl. X$^1$ is a single bond, phenylene group, naphthylene group, or *—C(=O)—O—X$^{11}$—. X$^{11}$ is a C$_1$-C$_{10}$ saturated hydrocarbylene group which may contain a hydroxy moiety, ether bond, ester bond or lactone ring, or phenylene group or naphthylene group. X$^2$ is a single bond or *—C(=O)—O—. The asterisk (*) designates a point of attachment to the carbon atom in the backbone. AL$^1$ and AL$^2$ are each independently an acid labile group. R$^{11}$ is a C$_1$-C$_{20}$ hydrocarbyl group which may contain a heteroatom, and "a" is an integer of 0 to 4.

In one preferred embodiment, the base polymer further comprises repeat units having the formula (b1) or (b2).

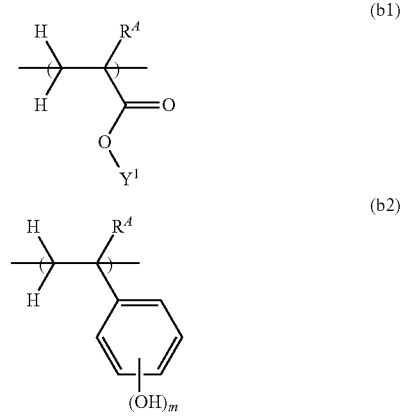

Herein R$^A$ is as defined above. Y$^1$ is hydrogen or a polar group containing at least one moiety selected from hydroxy, cyano, carbonyl, carboxy, ether bond, ester bond, sulfonic ester bond, carbonate bond, lactone ring, sultone ring, and carboxylic anhydride, and m is 1 or 2.

In one preferred embodiment, the base polymer further comprises repeat units having a photoacid generating group.

The resist composition may further comprise (D) a photoacid generator, (E) an acid diffusion inhibitor other than the compound having formula (1), and/or (F) a surfactant.

In another aspect, the invention provides a pattern forming process comprising the steps of applying the resist composition defined above to form a resist film on a substrate, exposing the resist film to KrF excimer laser radiation, ArF excimer laser radiation, EB, or EUV, and developing the exposed resist film in a developer.

Advantageous Effects of Invention

Since the compound having formula (1) displays a satisfactory function as an acid diffusion inhibitor or quencher in a resist composition, the inventive resist composition comprising the same forms a pattern of good profile with a high resolution, low LWR and improved CDU.

BRIEF DESCRIPTION OF ACCOMPANYING DRAWINGS

FIG. 3 is a diagram of $^1$H-NMR spectrum of Compound Q-B obtained in Synthesis Example 1-2.

DESCRIPTION OF EMBODIMENTS

Figure 1:
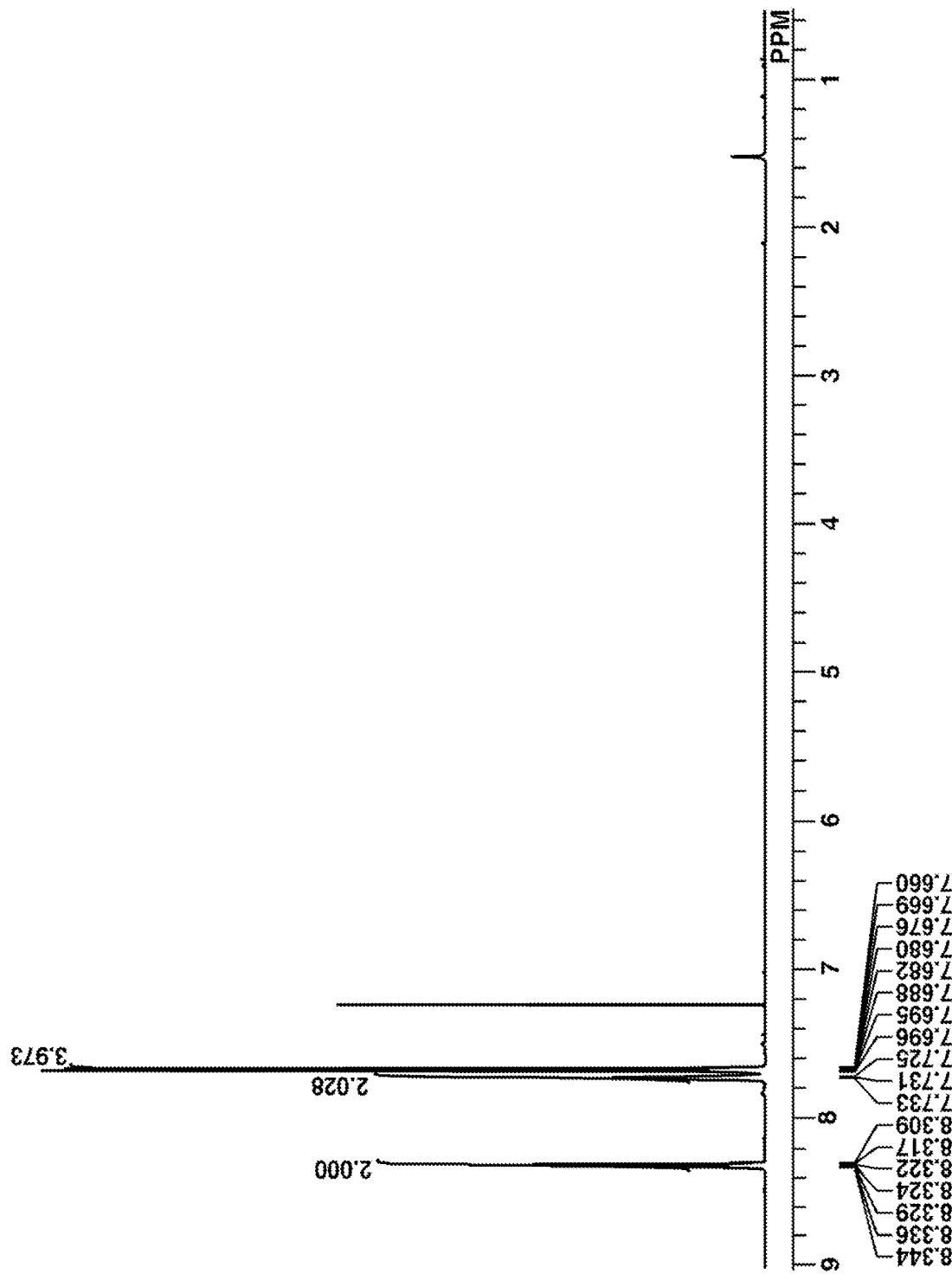
FIG. 1 is a diagram of $^1$H-NMR spectrum of Compound Q-A obtained in Synthesis Example 1-1.

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. The terms "group" and "moiety" are interchangeable. In chemical formulae, the broken line denotes a valence bond; Me stands for methyl, and Ac for acetyl.

The abbreviations and acronyms have the following meaning.
EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity
DOF: depth of focus The resist composition of the invention is characterized by comprising a compound having the formula (1).

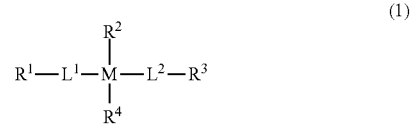

In formula (1), R$^1$ to R$^4$ are each independently a C$_1$-C$_{20}$ hydrocarbyl group which may contain a heteroatom. R$^1$ and R$^2$ may bond together to form a ring with L$^1$ and M to which they are attached, each pair of R$^1$ and R$^2$, and R$^3$ and R$^4$ may bond together to form a spiro ring containing M as the spiro atom. L$^1$ and L$^2$ are each independently —O— or —N(R)—, wherein R is hydrogen or a C$_1$-C$_{20}$ hydrocarbyl group which may contain a heteroatom. M is sulfur or selenium.

The C$_1$-C$_{20}$ hydrocarbyl groups represented by R$^1$ to R$^4$ and R may be saturated or unsaturated and straight, branched or cyclic. Examples thereof include alkyl groups such as methyl, ethyl, propyl, isopropyl, n-butyl, sec-butyl, tert-butyl, n-pentyl, tert-pentyl, n-hexyl, n-octyl, 2-ethylhexyl, n-nonyl, n-decyl; cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.0$^{2,6}$]decanyl, adamantyl, adamantylmethyl; and aryl groups such as phenyl, naphthyl, anthracenyl. Also included are the foregoing groups in which some hydrogen is substituted by a moiety containing a heteroatom such as oxygen, sulfur, nitrogen or halogen exclusive of fluorine, or a moiety containing a heteroatom such as oxygen, sulfur or nitrogen intervenes between carbon atoms, so that the group may contain a hydroxy moiety, cyano moiety, carbonyl moiety, ether bond, thioether bond, ester bond, sulfonic ester bond, carbonate bond, carbamate bond, lactone ring, sultone ring, or carboxylic anhydride.

Examples of the compound having formula (1) are shown below, but not limited thereto.

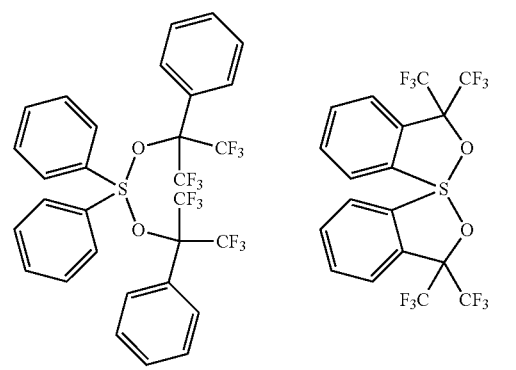
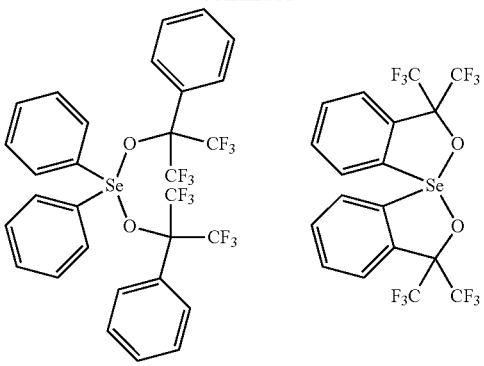
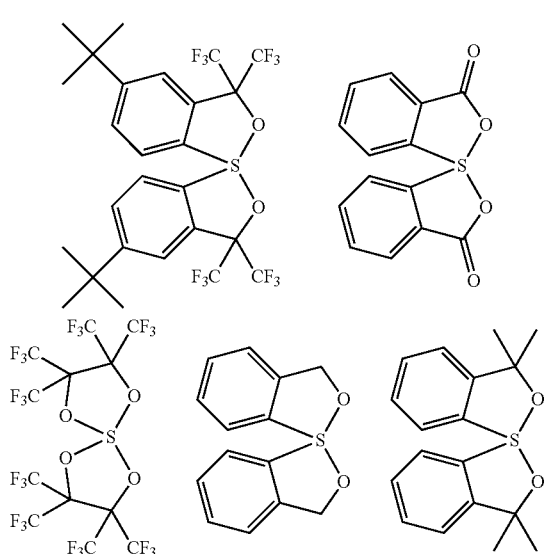
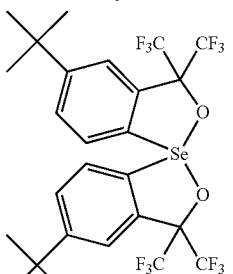
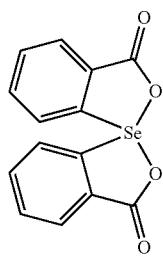
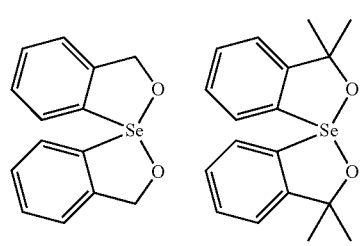
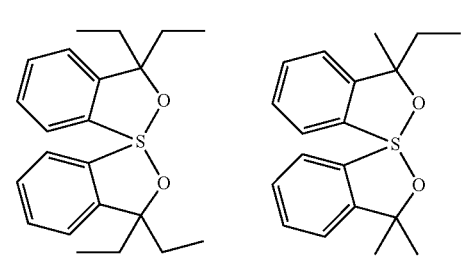
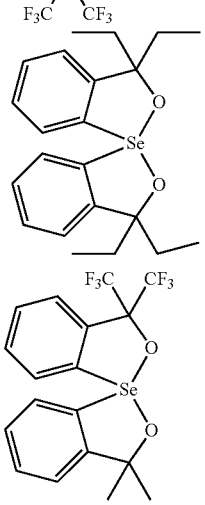
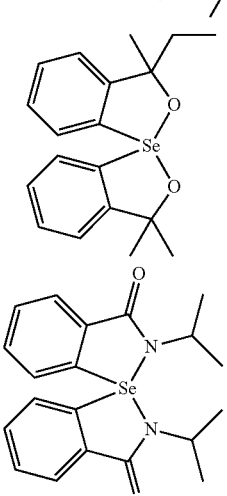
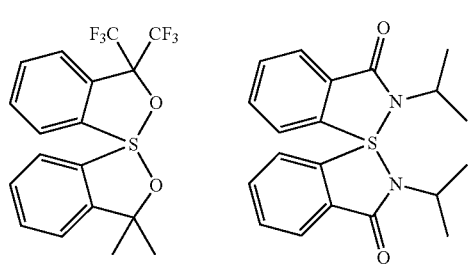

The compound having formula (1) may be synthesized by a combination of well-known organic chemistry methods, for example, with reference to Journal of the Chemical Society [Section] D: Chemical Communications, 1971, 12, p 649-50, Journal of Organic Chemistry, Vol. 42, No. 25, 1977, p 4006-4016, and Journal of Organic Chemistry, Vol. 46, No. 6, 1981, p 1049-1053.

The compound having formula (1) functions as a quite effective acid diffusion inhibitor (or controlling agent) when it is applied to a resist composition. As used herein, the acid diffusion inhibitor is a compound capable of trapping an acid generated by a PAG in a resist composition and preventing the acid from diffusing to the unexposed region, for thereby forming the desired pattern.

Although the acid diffusion controlling mechanism of the compound having formula (1) is not well understood, one assumption is described below. When the acid generated by the PAG acts on the compound, either of M-$L^1$ and M-$L^2$ bonds in the compound is cleaved whereby the compound is converted to a sulfonium cation or selenium cation. The counter anion is a conjugated base of the generated acid, meaning that the generated acid is trapped. As a consequence, the compound having formula (1) functions as an acid diffusion inhibitor.

Amine compounds are used from the past as the acid diffusion inhibitor in photoresist compositions. The amine compound neutralizes and traps the acid generated by the PAG. The amine compound, however, brings about a dark/bright dimensional difference due to its localization within a resist film and its volatilization from a resist film surface layer (known as chemical flare). It is noted that the term "dark" refers to an area including wide light-shielded portion and "bright" refers to an area including wide exposed portion. The amine compound also causes profile faults due to substantial surface insolubilization. Although it is possible to prevent volatilization by designing the compound to a high molecular weight, the problems of localization within resist film and substantial surface insolubilization are left unsolved.

In contrast, the compound having formula (1) is a highly crystalline, non-volatile sulfurane or selenurane compound, which eliminates the risk of chemical flare. Since the compound having formula (1) is low polar and highly compatible with the resist casting solvent (e.g., PGMEA), it is presumed that the compound is uniformly distributed within a resist film. This ensures uniform trapping of the generated acid in the exposed region, leading to improvements in LWR and CDU.

Also known as the acid diffusion inhibitor other than the amine compound are onium salt type acid diffusion inhibitors. The onium salt type acid diffusion inhibitor is a salt compound of weak acid (the weak acid is, for example, a carboxylic acid or alkane sulfonic acid). It undergoes ion exchange with the strong acid (e.g., $\alpha,\alpha'$-difluorosulfonic acid) generated by the PAG, thereby trapping the generated acid. A weak acid is created instead, which is insufficient to cleave the acid labile group on the base polymer in a photoresist composition. Accordingly, the onium salt of weak acid functions as an acid diffusion inhibitor. Examples of the onium salt type acid diffusion inhibitor include salts of carboxylic acids and sulfonic acids as described in Patent Document 1 and JP-A 2003-005376.

As compared with the amine compounds, the onium salt type acid diffusion inhibitors are effective for improving LWR and CDU at the sacrifice of contrast. This is because the acid trapping via ion exchange is not irreversible reaction, but equilibration reaction. That is, insufficient acid diffusion control invites a degradation of contrast.

In contrast, the compound having formula (1) is effective not only for improving LWR and CDU, but also for providing a high contrast and hence, a high resolution. This is because the compound having formula (1) has a high diffusion control function capable of preventing the once trapped acid from being released again, rather than the equilibration reaction of the onium salt.

In the resist composition, the compound having formula (1) is preferably present in an amount of 0.1 to 50 parts by weight, more preferably 1 to 40 parts by weight per 80 parts by weight of the base polymer (C) to be described later. As long as the amount of the compound is within the range, a satisfactory acid diffusion controlling function is exerted, and any performance losses such as a lowering of sensitivity and formation of foreign particles due to a shortage of dissolution are avoided. The compound having formula (1) may be used alone or in admixture of two or more.

Resist Composition

One embodiment of the invention is a resist composition comprising (A) an acid diffusion inhibitor in the form of the compound having formula (1) as an essential component, (B) an organic solvent, (C) a polymer comprising repeat units containing an acid labile group (base polymer), and (D) a photoacid generator as additional components. If necessary, the resist composition may further comprise (E) another acid diffusion inhibitor and (F) a surfactant.

(B) Organic Solvent

Any organic solvent may be used as long as components are soluble therein. Examples of the organic solvent are described in JP-A 2008-111103, paragraphs [0144]-[0145] (U.S. Pat. No. 7,537,880). Exemplary solvents include ketones such as cyclohexanone and methyl-2-n-pentyl ketone; alcohols such as 3-methoxybutanol, 3-methyl-3-methoxybutanol, 1-methoxy-2-propanol, 1-ethoxy-2-propanol and diacetone alcohol; ethers such as propylene glycol monomethyl ether, ethylene glycol monomethyl ether, propylene glycol monoethyl ether, ethylene glycol monoethyl ether, propylene glycol dim ethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Where an acid labile group of acetal form is used, a high-boiling alcohol solvent such as diethylene glycol, propylene glycol, glycerol, 1,4-butanediol or 1,3-butanediol may be added for accelerating deprotection reaction of acetal.

Of the above organic solvents, it is recommended to use 1-ethoxy-2-propanol, PGMEA, cyclohexanone, γ-butyrolactone, and mixtures thereof.

An appropriate amount of the organic solvent (B) used is 200 to 5,000 parts, more preferably 400 to 3,000 parts by weight per 80 parts by weight of the base polymer (C).

(C) Base Polymer

The base polymer used in the resist composition is a polymer comprising repeat units containing an acid labile group, preferably repeat units having the formula (a1) or repeat units having the formula (a2). Notably, the units having formulae (a1) and (a2) are also referred to as units (a1) and (a2), respectively.

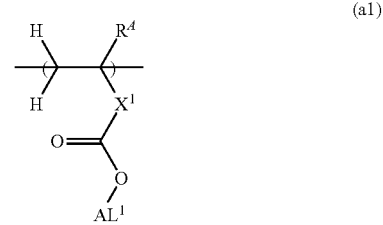

(a1)

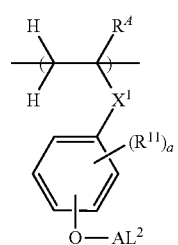

(a2)

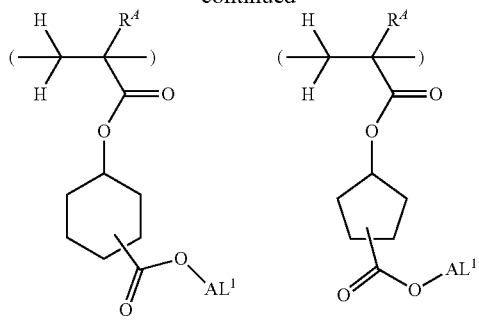

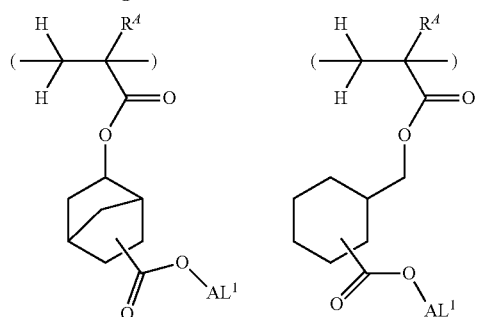

In formulae (a1) and (a2), $R^A$ is each independently hydrogen, fluorine, methyl or trifluoromethyl. $X^1$ is a single bond, phenylene, naphthylene or $*-C(=O)-O-X^{11}-$, wherein $X^{11}$ is a $C_1$-$C_{10}$ saturated hydrocarbylene group which may contain a hydroxy moiety, ether bond, ester bond or lactone ring, or a phenylene or naphthylene group. $X^2$ is a single bond or $*-C(=O)-O-$. The asterisk (*) designates a point of attachment to the carbon atom in the backbone. $AL^1$ and $AL^2$ are each independently an acid labile group.

In formula (a2), $R^{11}$ is a $C_1$-$C_{20}$ hydrocarbyl group which may contain a heteroatom. The hydrocarbyl group may be saturated or unsaturated and straight, branched or cyclic, and examples thereof are as exemplified above for the $C_1$-$C_{20}$ hydrocarbyl groups $R^1$ to $R^4$ and R. The subscript "a" is an integer of 0 to 4, preferably 0 or 1.

Examples of the structure of formula (a1) wherein $X^1$ is a variant are illustrated below, but not limited thereto. Herein $R^A$ and $AL^1$ are as defined above.

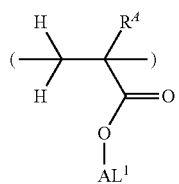 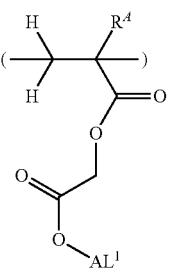 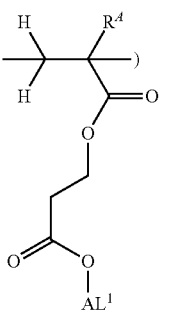

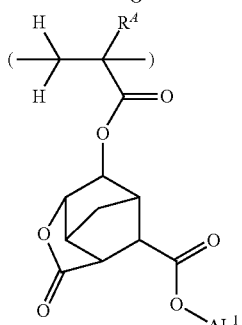 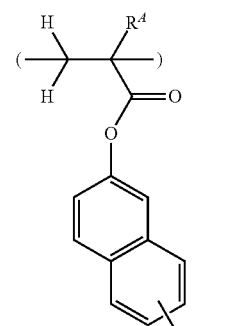

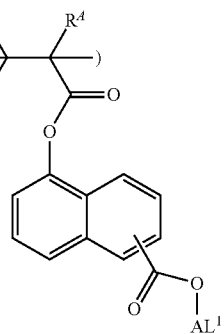 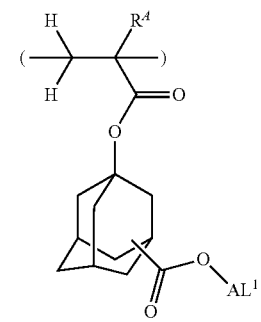

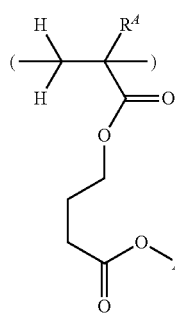 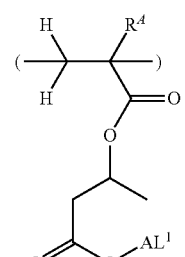 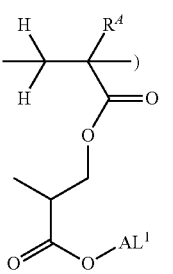

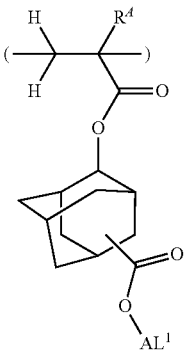 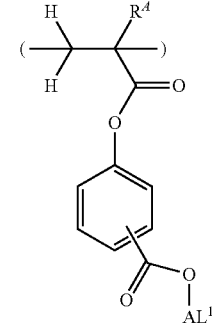

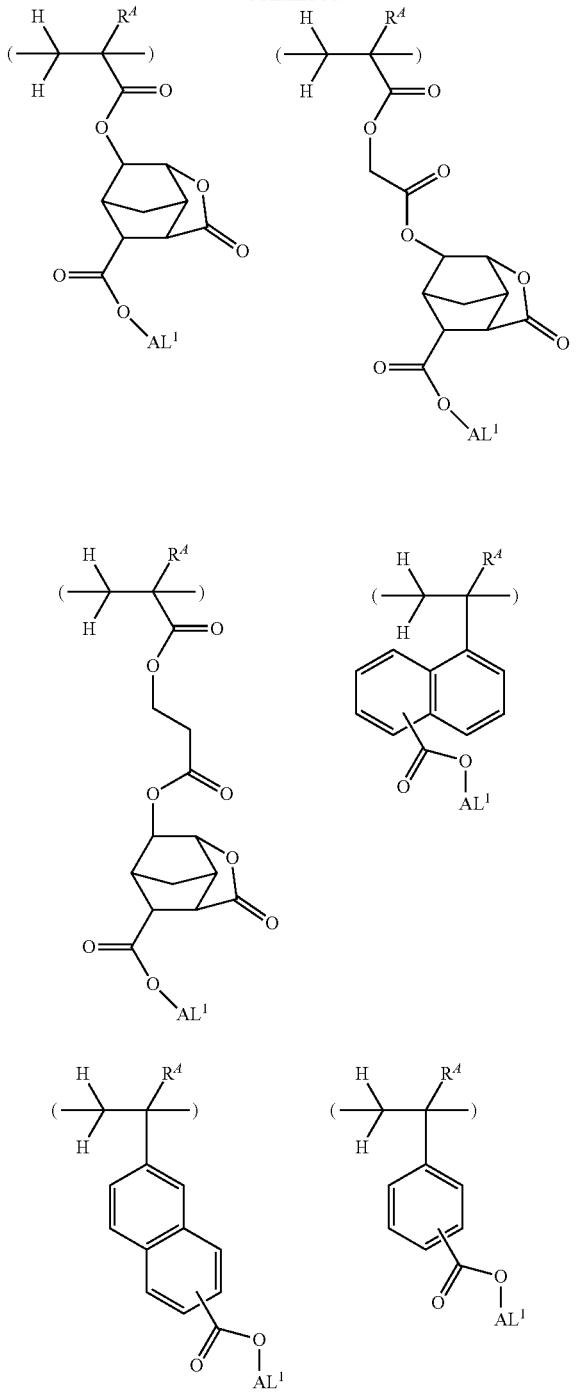

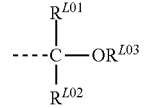
(L1)

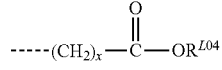
(L2)

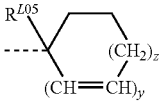
(L3)

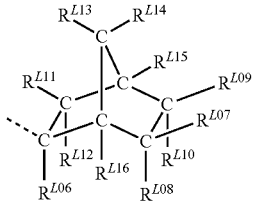
(L4)

In formula (L1), $R^{L01}$ and $R^{L02}$ each are hydrogen or a $C_1$-$C_{18}$, preferably $C_1$-$C_{10}$ saturated hydrocarbyl group. The saturated hydrocarbyl group may be straight, branched or cyclic, and examples thereof include alkyl groups such as methyl, ethyl, propyl, isopropyl, n-butyl, sec-butyl, tert-butyl, n-octyl, 2-ethylhexyl; and cyclic saturated hydrocarbyl groups such as cyclopentyl, cyclohexyl, norbornyl, tricyclodecanyl, tetracyclododecanyl, and adamantyl.

$R^{L03}$ is a $C_1$-$C_{18}$, preferably $C_1$-$C_{10}$ hydrocarbyl group which may contain a heteroatom. The hydrocarbyl group may be saturated or unsaturated, and straight, branched or cyclic, with a saturated hydrocarbyl group being preferred. In the saturated hydrocarbyl group, some or all of the hydrogen atoms may be substituted by hydroxy, saturated hydrocarbyloxy, oxo, amino, saturated hydrocarbylamino or the like, and any constituent —$CH_2$— may be replaced by a moiety containing a heteroatom such as oxygen. Examples of the saturated hydrocarbyl group are as exemplified above for the saturated hydrocarbyl groups $R^{L01}$ and $R^{L02}$. Examples of the substituted saturated hydrocarbyl group are shown below.

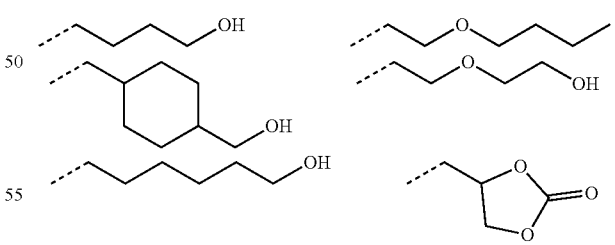

A polymer comprising repeat units having formula (a1) is decomposed under the action of acid to generate a carboxy group and thus turns alkali soluble.

The acid labile group represented by $AL^1$ and $AL^2$ may be selected from a variety of such groups. Examples of the acid labile group include groups of the following formulae (L1) to (L4), $C_4$-$C_{20}$, preferably $C_4$-$C_{15}$ tertiary hydrocarbyl groups, trihydrocarbylsilyl groups in which each hydrocarbyl moiety has 1 to 6 carbon atoms, and $C_4$-$C_{20}$ hydrocarbyl groups containing a carbonyl moiety, ether bond or ester bond.

Any two of $R^{L01}$, $R^{L02}$, and $R^{L03}$ may bond together to form a ring with the carbon atom or carbon and oxygen atoms to which they are attached. Any pair among $R^{L01}$, $R^{L02}$ and $R^{L03}$ which form a ring is each independently preferably a $C_1$-$C_{18}$, more preferably $C_1$-$C_{10}$ alkanediyl group.

In formula (L2), $R^{L04}$ is a $C_4$-$C_{20}$, more preferably $C_4$-$C_{15}$ tertiary hydrocarbyl group, a trialkylsilyl group in which each alkyl moiety has 1 to 6 carbon atoms, a $C_4$-$C_{20}$ saturated hydrocarbyl group containing a carbonyl moiety, ether bond or ester bond, or a group of formula (L1). The subscript x is an integer of 0 to 6.

The tertiary hydrocarbyl group $R^{L04}$ may be branched or cyclic, and examples thereof include tert-butyl, tert-pentyl, 1,1-diethylpropyl, 2-cyclopentylpropan-2-yl, 2-cyclohexyl-propan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkyl-silyl groups are trimethylsilyl, triethylsilyl, and dimethyl-tert-butylsilyl. Examples of the saturated hydrocarbyl group containing a carbonyl moiety, ether bond or ester bond include 3-oxocyclohexyl, 4-methyl-2-oxooxan-4-yl, and 5-methyl-2-oxooxolan-5-yl.

In formula (L3), $R^{L05}$ is an optionally substituted $C_1$-$C_8$ saturated hydrocarbyl group or an optionally substituted $C_6$-$C_{20}$ aryl group. The optionally substituted saturated hydrocarbyl group may be straight, branched or cyclic, and examples thereof include alkyl groups such as methyl, ethyl, propyl, isopropyl, n-butyl, sec-butyl, tert-butyl, tert-pentyl, n-pentyl, n-hexyl; cyclic saturated hydrocarbyl groups such as cyclopentyl and cyclohexyl; and substituted forms of the foregoing in which some or all hydrogen is substituted by hydroxy, $C_1$-$C_8$ saturated hydrocarbyloxy, carboxy, $C_1$-$C_8$ saturated hydrocarbylcarbonyl, oxo, amino, $C_1$-$C_8$ saturated hydrocarbylamino, cyano, mercapto, $C_1$-$C_8$ saturated hydrocarbylthio, sulfo or the like. Examples of the optionally substituted aryl groups include phenyl, methylphenyl, naphthyl, anthryl, phenanthryl, and pyrenyl, and substituted forms of the foregoing in which some or all hydrogen is substituted by hydroxy, $C_1$-$C_8$ saturated hydrocarbyloxy, carboxy, $C_1$-$C_8$ saturated hydrocarbylcarbonyl, oxo, amino, $C_1$-$C_8$ saturated hydrocarbylamino, cyano, mercapto, $C_1$-$C_8$ saturated hydrocarbylthio, sulfo or the like.

In formula (L3), y is equal to 0 or 1, z is an integer of 0 to 3, and 2y+z is equal to 2 or 3.

In formula (L4), $R^{L06}$ is an optionally substituted $C_1$-$C_8$ saturated hydrocarbyl group to or an optionally substituted $C_6$-$C_{20}$ aryl group. Examples of the optionally substituted saturated hydrocarbyl group and aryl group are as exemplified above for $R^{L05}$.

In formula (L4), $R^{L07}$ to $R^{L16}$ are each independently hydrogen or an optionally substituted $C_1$-$C_{15}$ hydrocarbyl group. The hydrocarbyl group may be saturated or unsaturated and straight, branched or cyclic, with a saturated hydrocarbyl group being preferred. Examples of the hydrocarbyl group include alkyl groups such as methyl, ethyl, propyl, isopropyl, n-butyl, sec-butyl, tert-butyl, tert-pentyl, n-pentyl, n-hexyl, n-octyl, n-nonyl, n-decyl; cyclic saturated hydrocarbyl groups such as cyclopentyl, cyclohexyl, cyclopentylmethyl, cyclopentylethyl, cyclopentylbutyl, cyclohexylmethyl, cyclohexylethyl and cyclohexylbutyl; and substituted forms of the foregoing in which some or all hydrogen is substituted by hydroxy, $C_1$-$C_8$ saturated hydrocarbyloxy, carboxy, $C_1$-$C_8$ saturated hydrocarbyloxycarbonyl, oxo, amino, $C_1$-$C_8$ saturated hydrocarbylamino, cyano, mercapto, $C_1$-$C_8$ saturated hydrocarbylthio, sulfo or the like. Alternatively, two of $R^{L07}$ to $R^{L16}$ may bond together to form a ring with the carbon atom to which they are attached (for example, a pair of $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each pair of $R^{L07}$ to $R^{L16}$ which form a ring is a $C_1$-$C_{15}$ hydrocarbylene group. Examples of the hydrocarbylene group include those obtained by removing one hydrogen atom from the exemplary groups described above for the hydrocarbyl group. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, $R^{L14}$ and $R^{L15}$, or a similar pair).

Of the acid labile groups having formula (L1), the straight and branched ones are exemplified by the following groups, but not limited thereto.

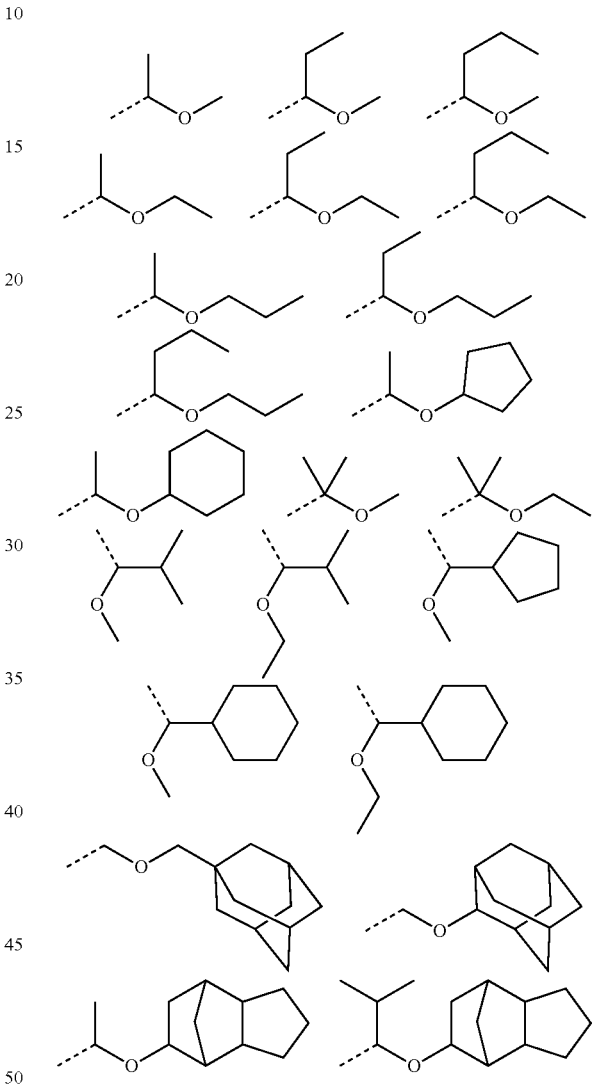

Of the acid labile groups having formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile group having formula (L2) include tert-butoxycarbonyl, tert-butoxycarbonylmethyl, tert-pentyloxycarbonyl, tert-pentyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile group having formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

Of the acid labile groups having formula (L4), groups having the following formulae (L4-1) to (L4-4) are preferred.

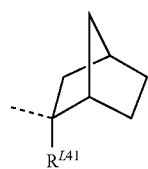
(L4-1)

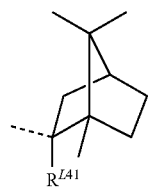
(L4-2)

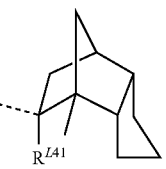
(L4-3)

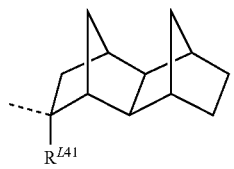
(L4-4)

In formulae (L4-1) to (L4-4), the broken line denotes a bonding site and direction. $R^{L41}$ is each independently a $C_1$-$C_{10}$ hydrocarbyl group. The hydrocarbyl group may be saturated or unsaturated and straight, branched or cyclic, with a saturated hydrocarbyl group being preferred. Examples of the hydrocarbyl group include alkyl groups such as methyl, ethyl, propyl, isopropyl, n-butyl, sec-butyl, tert-butyl, tert-pentyl, n-pentyl, n-hexyl, and cyclic saturated hydrocarbyl groups such as cyclopentyl and cyclohexyl.

For formulae (L4-1) to (L4-4), there can exist stereoisomers (enantiomers or diastereomers). Each of formulae (L4-1) to (L4-4) collectively represents all such stereoisomers. Where the acid labile group is a group having formula (L4), a plurality of stereoisomers may be contained.

For example, the formula (L4-3) represents one or a mixture of two selected from groups having the following formulas (L4-3-1) and (L4-3-2).

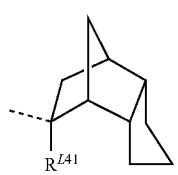
(L4-3-1)

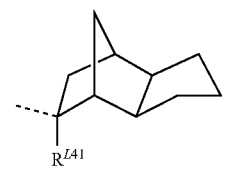
(L4-3-2)

Herein $R^{L41}$ is as defined above.

Similarly, the Formula (L4-4) Represents One or a Mixture of Two or More Selected from Groups Having the Following Formulas (L4-4-1) to (L4-4-4).

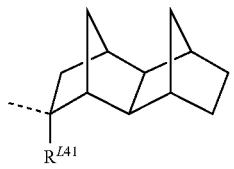
(L4-4-1)

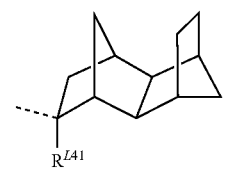
(L4-4-2)

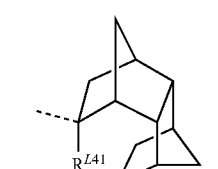
(L4-4-3)

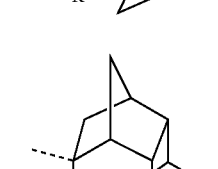
(L4-4-4)

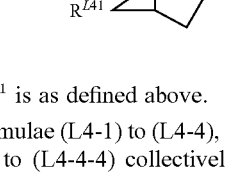

Herein $R^{L41}$ is as defined above.

Each of formulae (L4-1) to (L4-4), (L4-3-1) and (L4-3-2), and (L4-4-1) to (L4-4-4) collectively represents an enantiomer thereof and a mixture of enantiomers.

It is noted that in the above formulae (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-saturated hydrocarbyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)
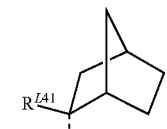

(L4-2-endo)
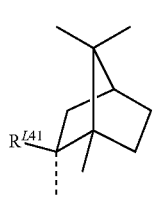

(L4-3-endo)
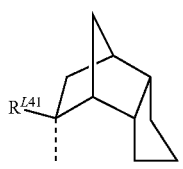

(L4-4-endo)
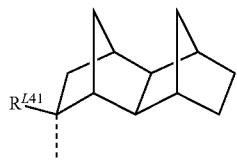

Herein $R^{L41}$ as defined above.

Examples of the acid labile group having formula (L4) are given below

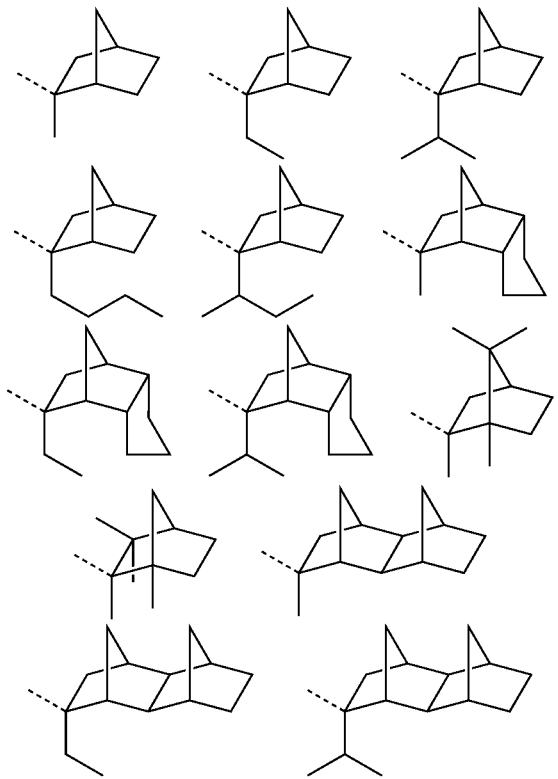

Of the acid labile groups $AL^1$ and $AL^2$, examples of the $C_4$-$C_{20}$ tertiary hydrocarbyl group, trihydrocarbylsilyl group in which each hydrocarbyl moiety has 1 to 6 carbon atoms, and $C_4$-$C_{20}$ saturated hydrocarbyl group containing carbonyl, ether bond or ester bond are as exemplified above for $R^{L04}$.

Examples of the repeat unit (a1) are given below, but not limited thereto. Herein $R^A$ is as defined above.

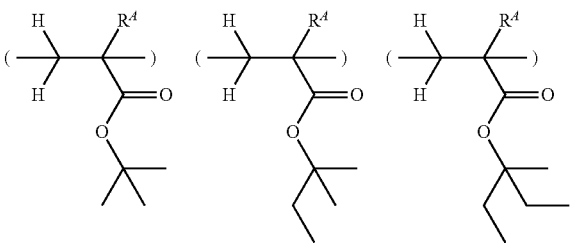
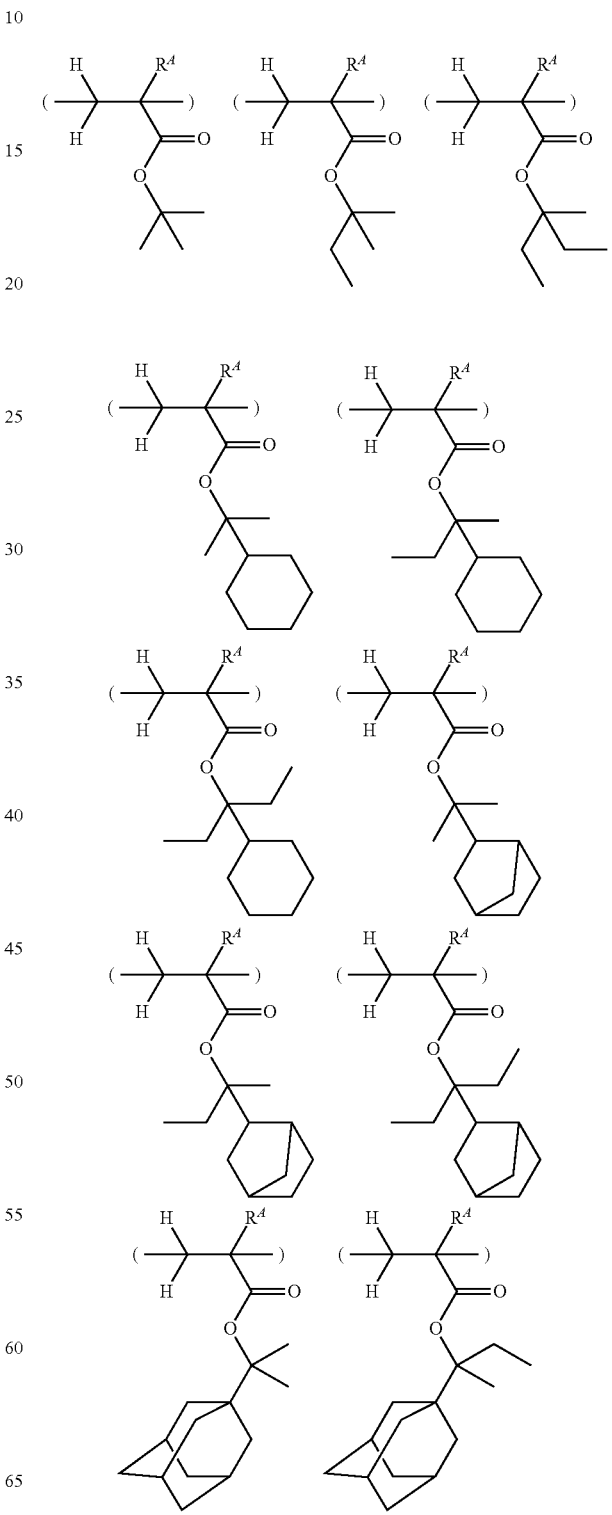

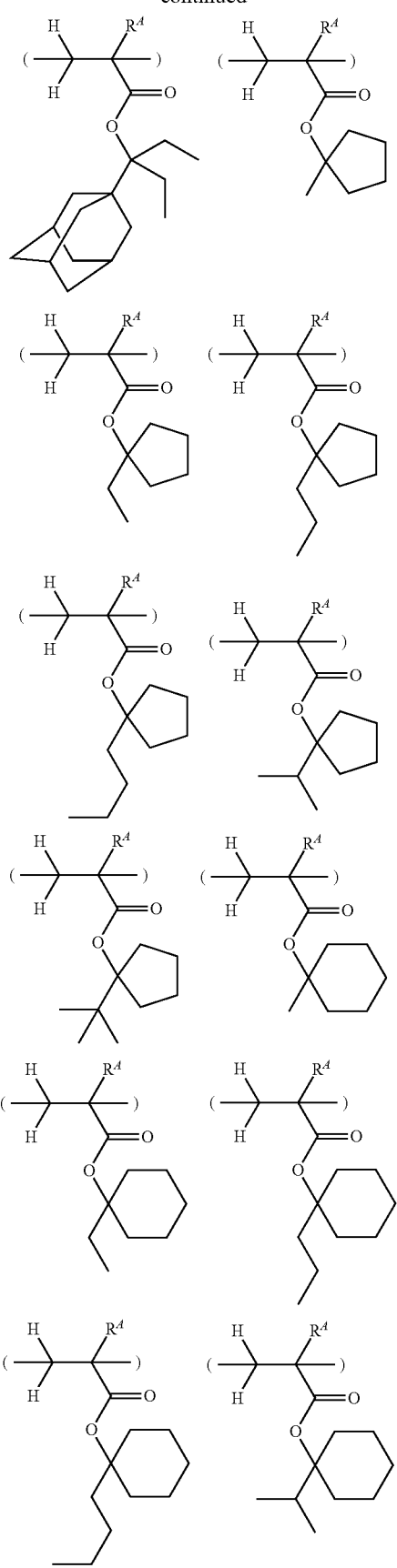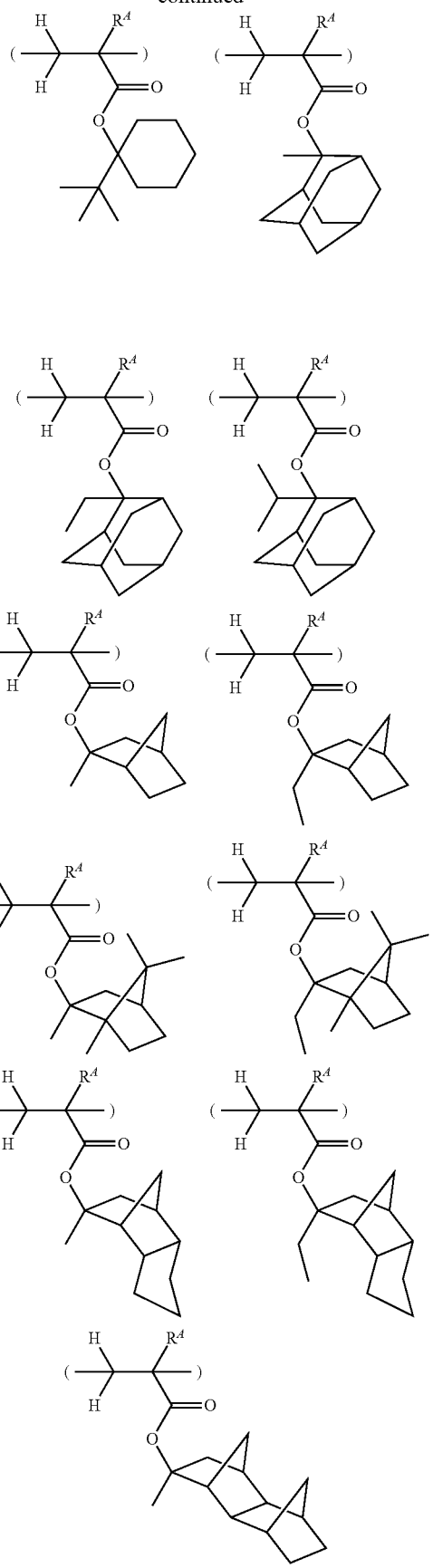

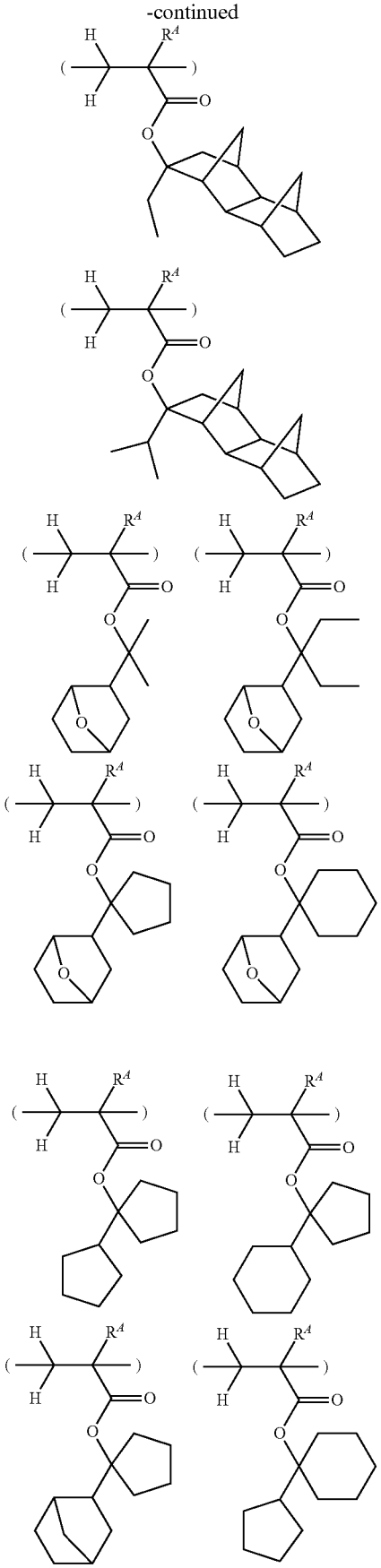
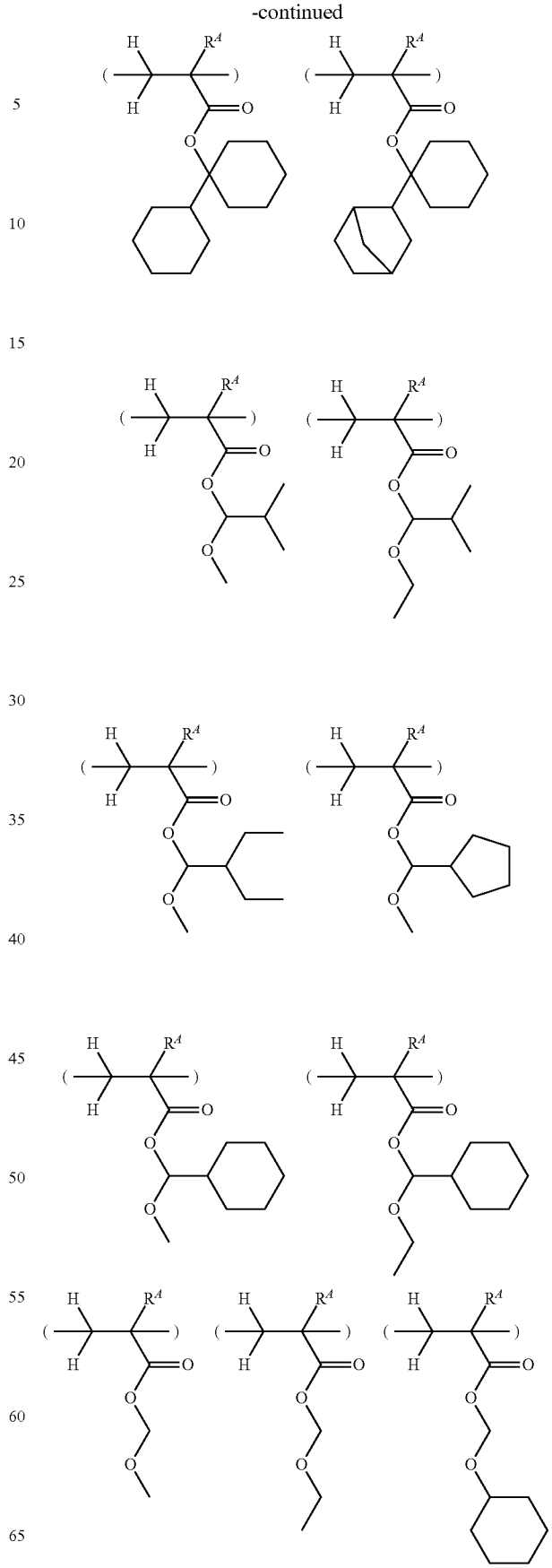

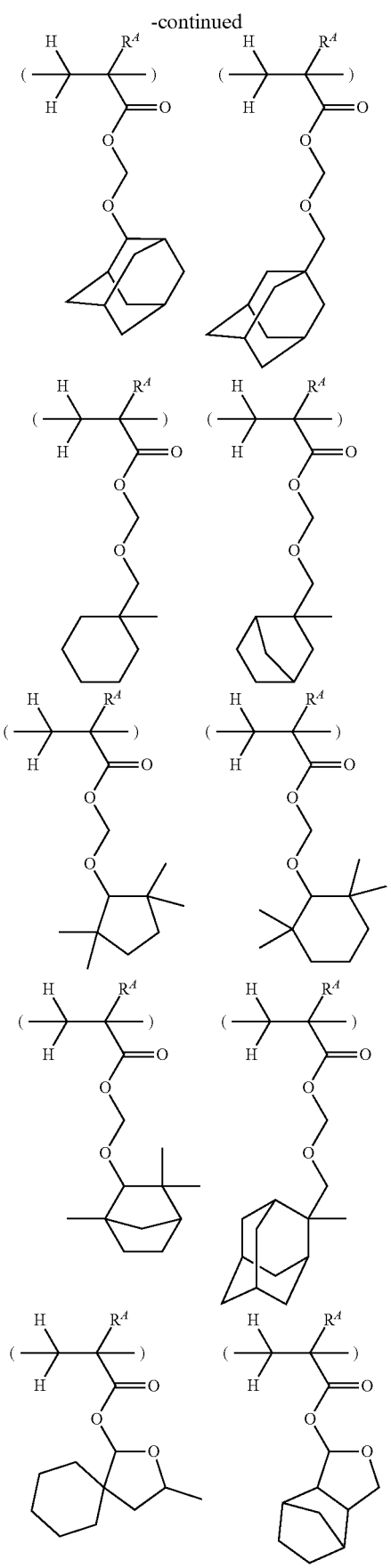
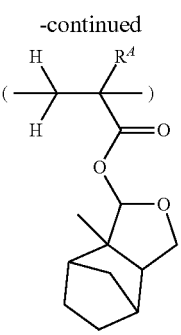

The above examples correspond to those units (a1) wherein $X^1$ is a single bond. Where $X^1$ is other than a single bond, a combination with a similar acid labile group is possible. Thus examples of the repeat units (a1) wherein $X^1$ is other than a single bond are as illustrated above.

Like a polymer comprising repeat units (a1), a polymer comprising repeat units (a2) is decomposed under the action of acid to generate a hydroxy group and thus turns alkali soluble.

Examples of the repeat unit (a2) are given below, but not limited thereto. Herein $R^A$ is as defined above.

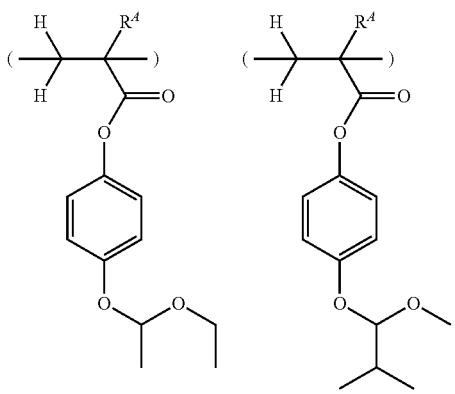
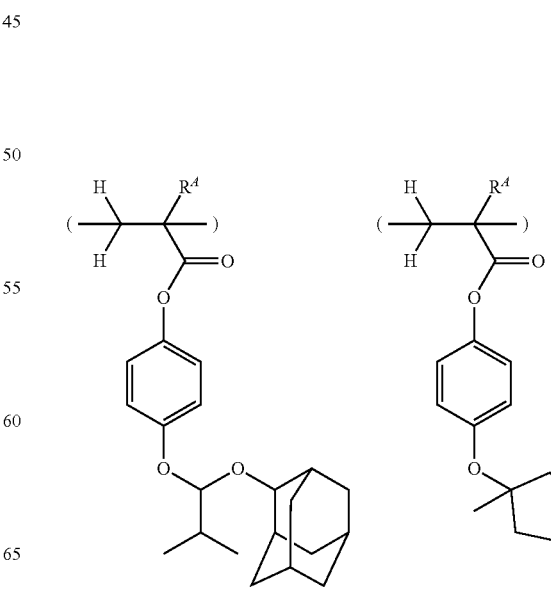

-continued
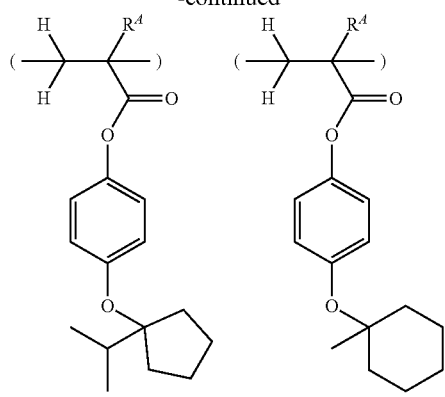
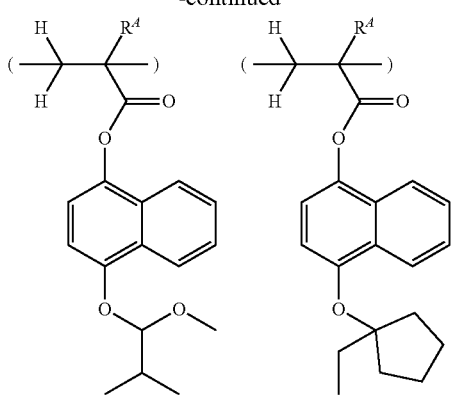
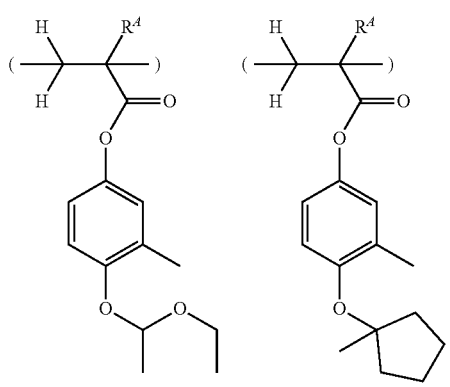
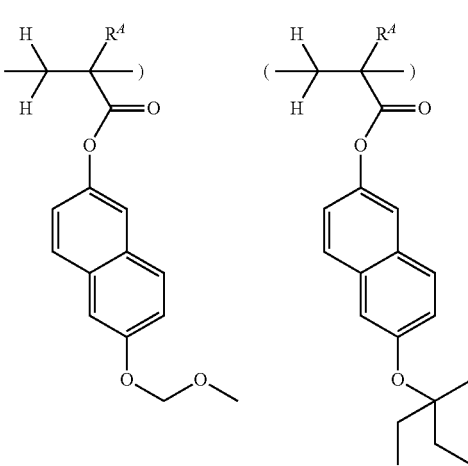
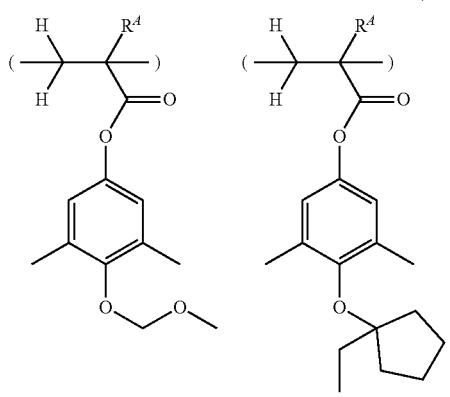
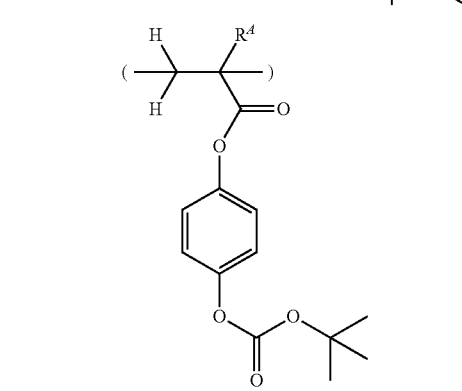
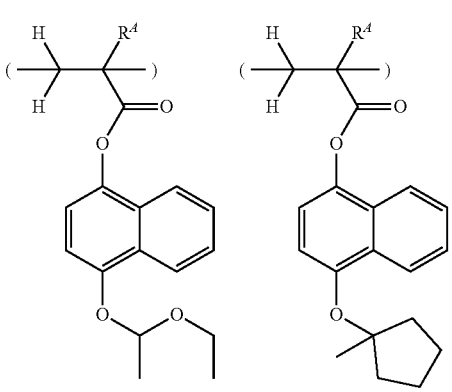
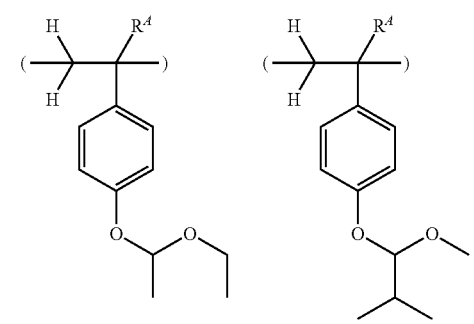

-continued

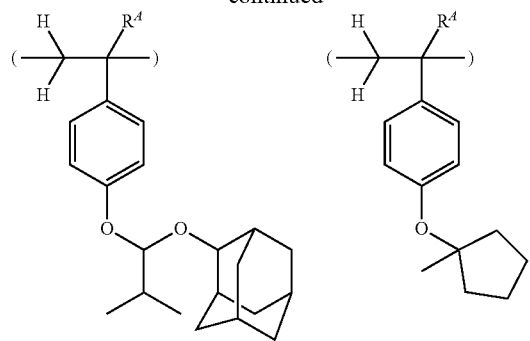
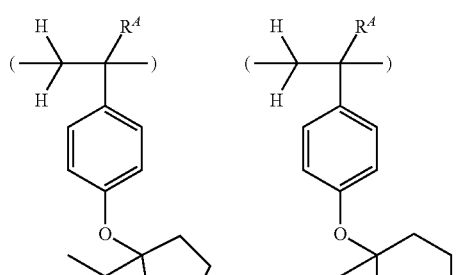
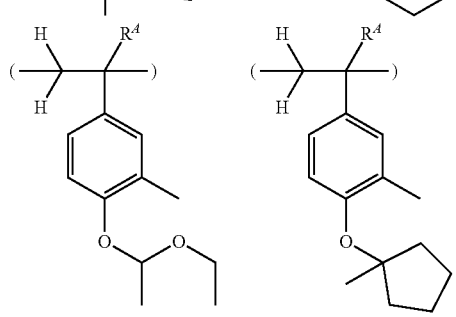
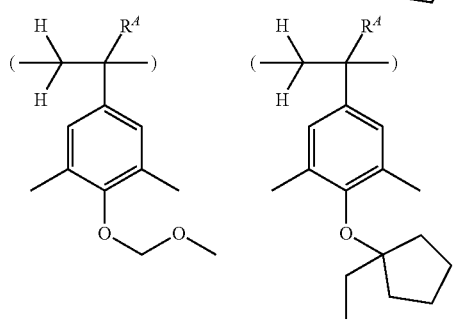
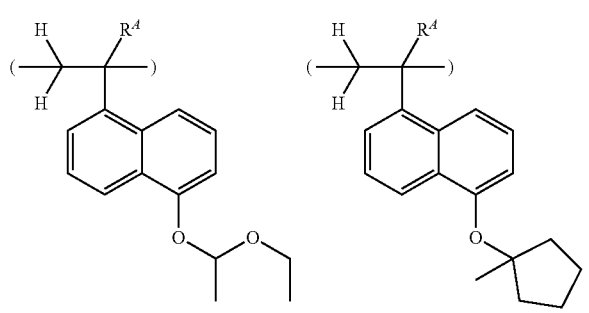

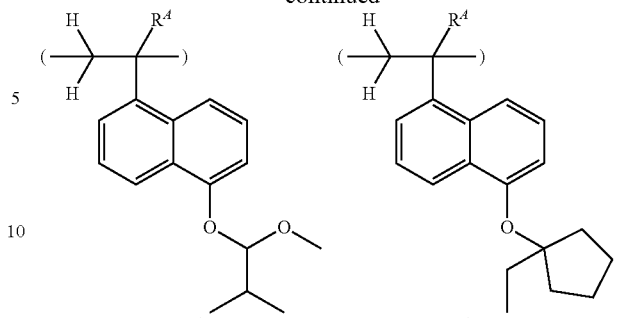
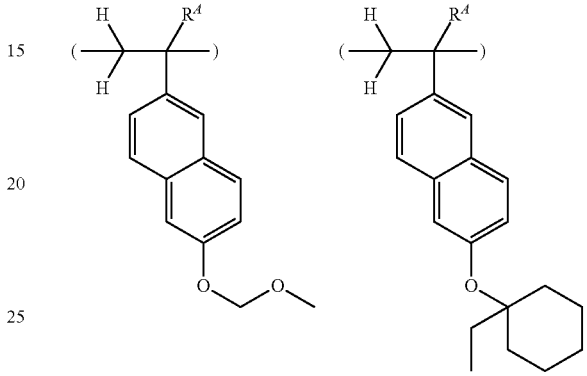
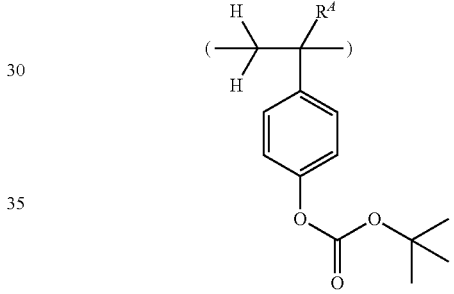

In a preferred embodiment, the base polymer further comprises repeat units having the formula (b1) or repeat units having the formula (b2). Notably, the units having formula (b1) or (b2) are sometimes referred to as repeat units (b1) or (b2).

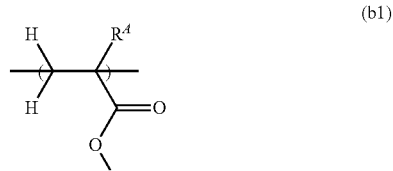

(b1)

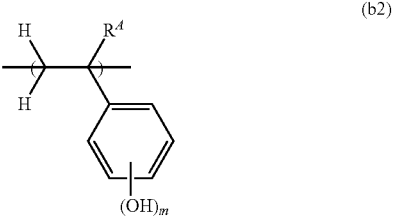

(b2)

In formulae (b1) and (b2), $R^A$ is as defined above. $Y^1$ is hydrogen or a polar group containing at least one structure selected from among hydroxy, cyano, carbonyl, carboxy, ether bond, ester bond, sulfonic ester bond, carbonate bond, lactone ring, sultone ring and carboxylic anhydride, and in is 1 or 2.
Examples of the repeat unit (b1) are given below, but not limited thereto. Herein $R^A$ is as defined above.
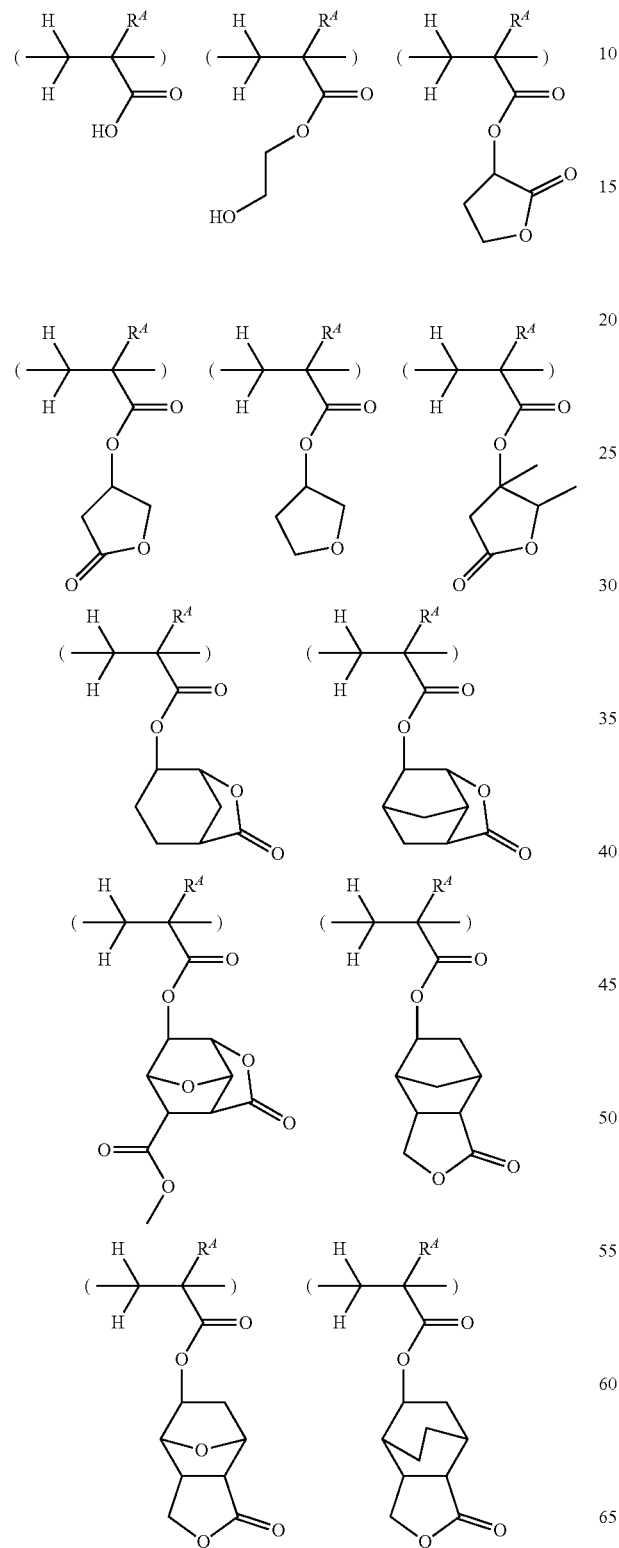
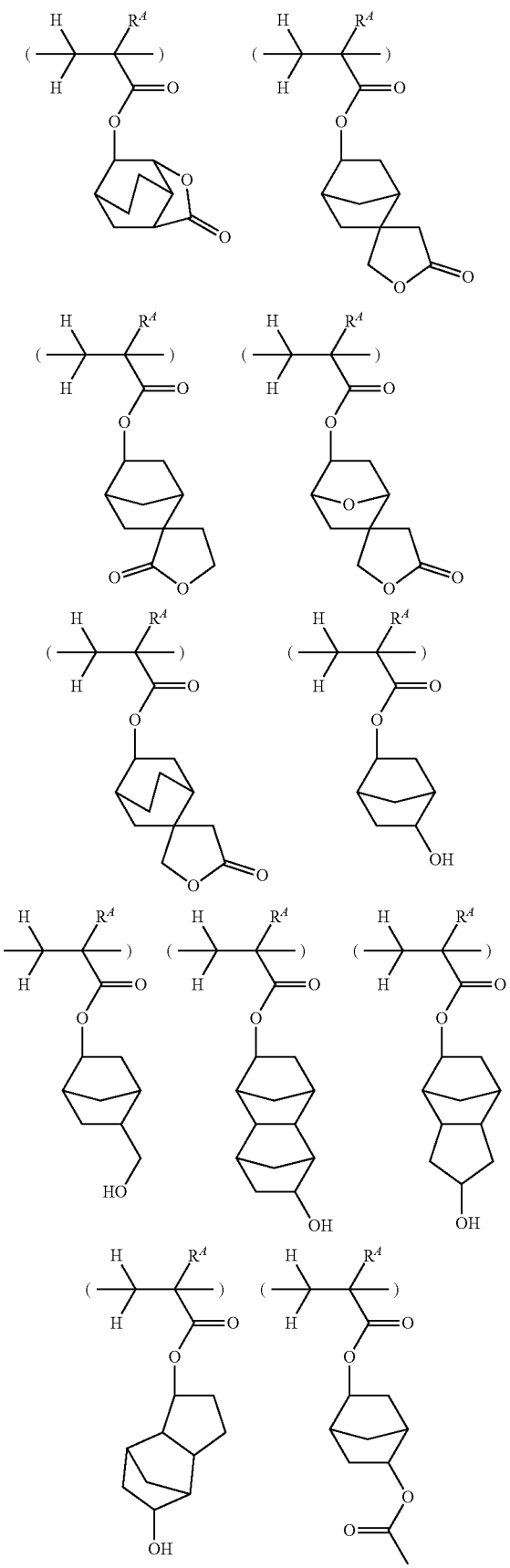

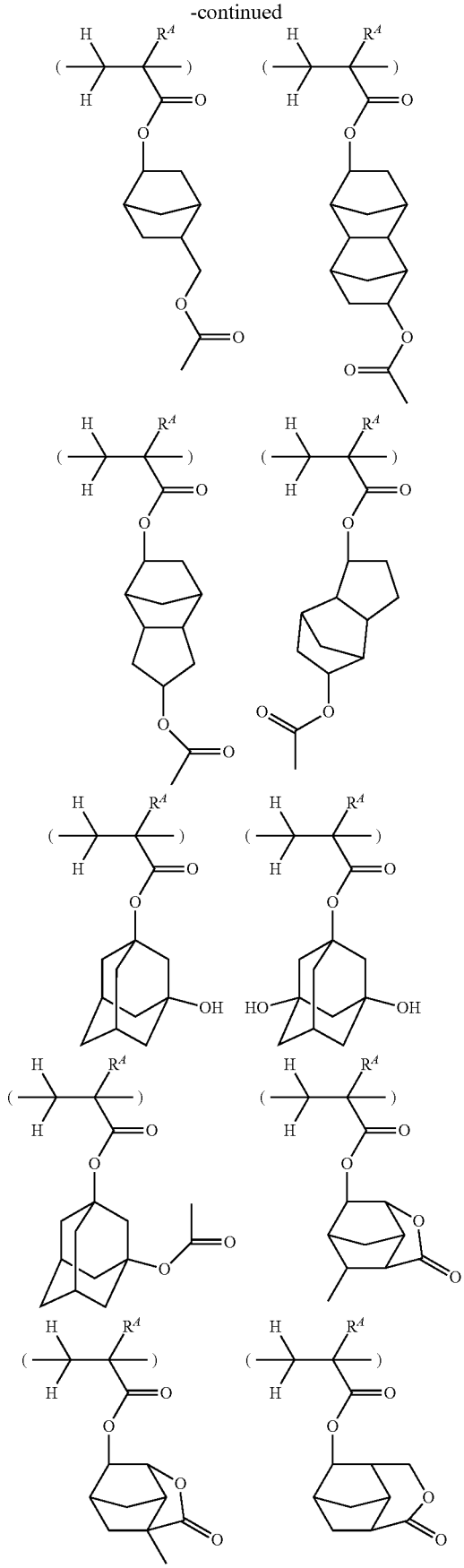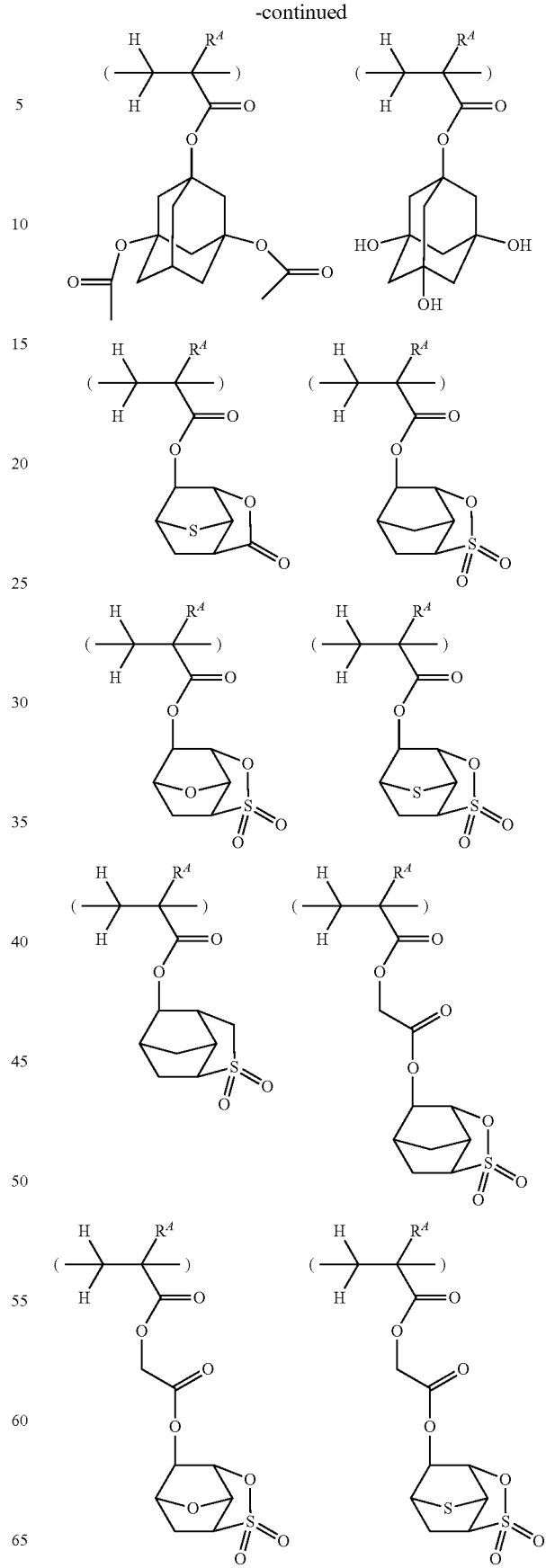

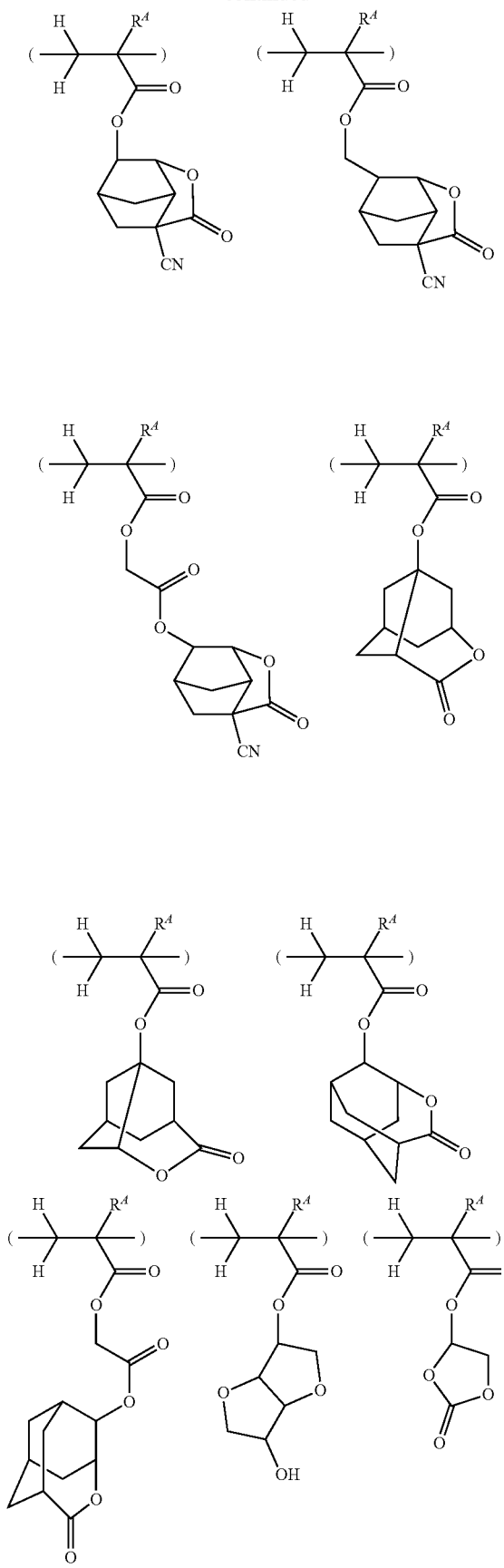
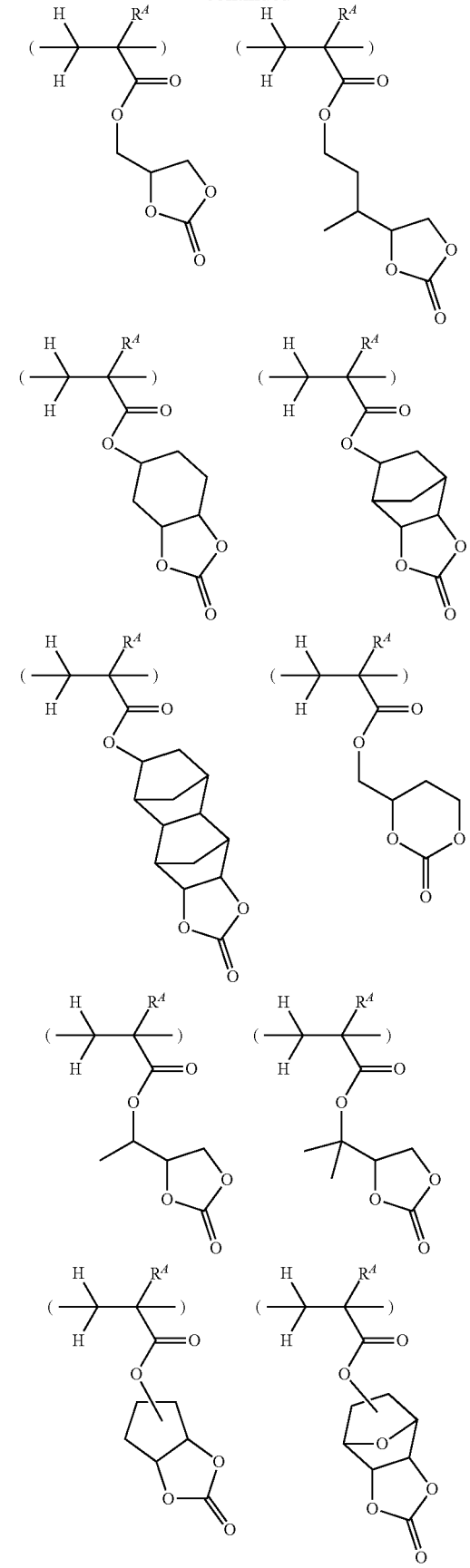

-continued
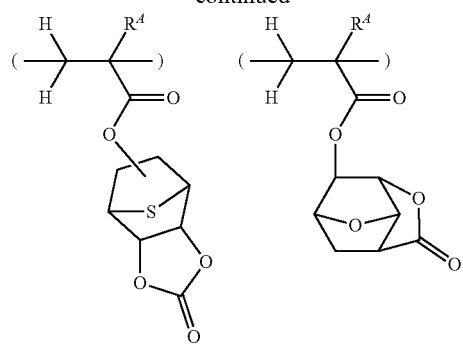
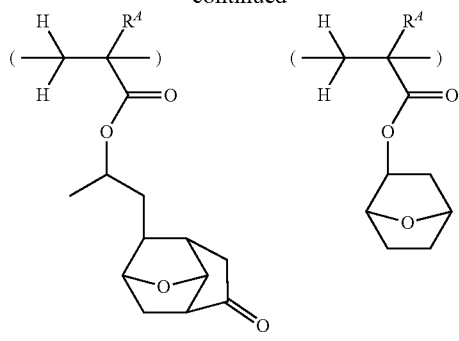
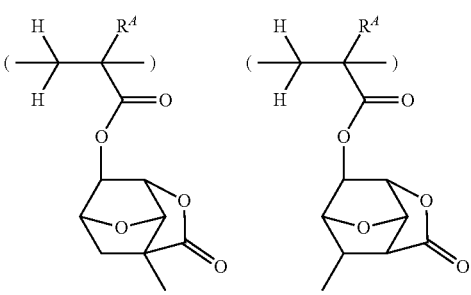
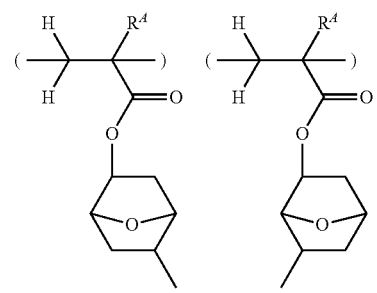
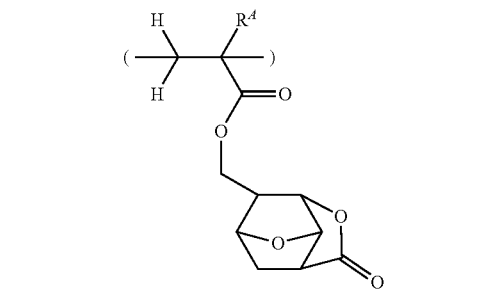
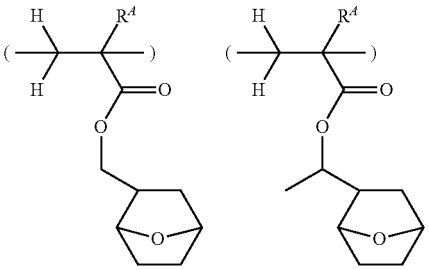
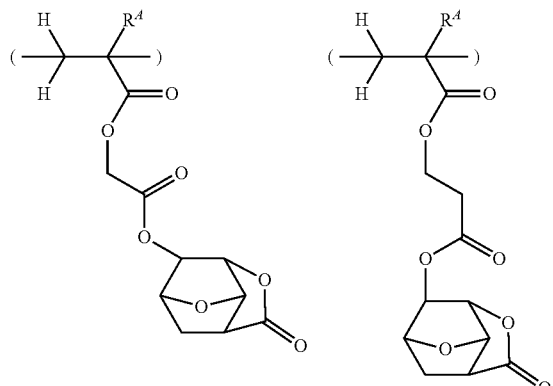
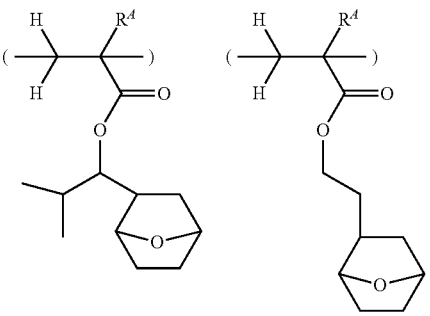
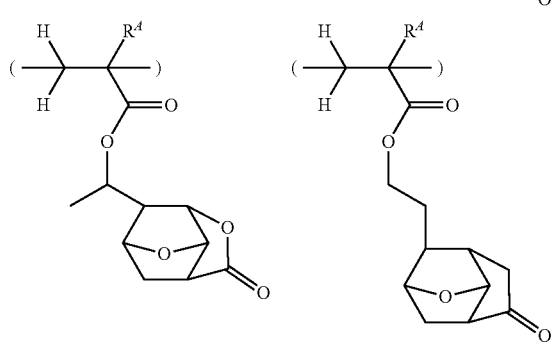
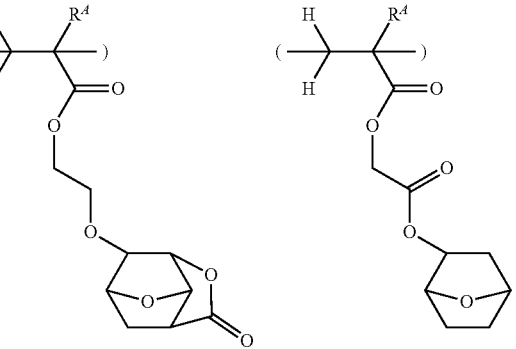

-continued
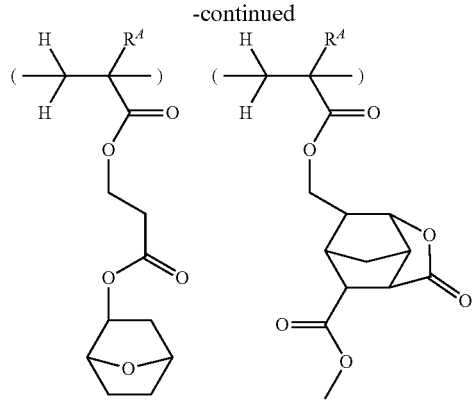
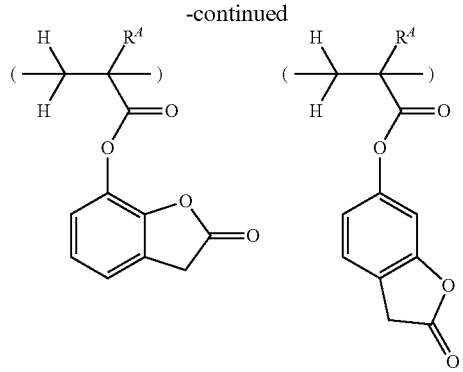
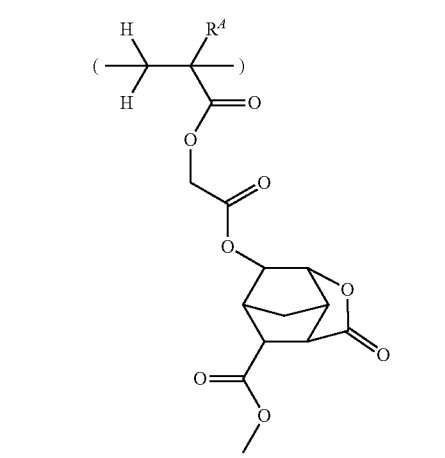
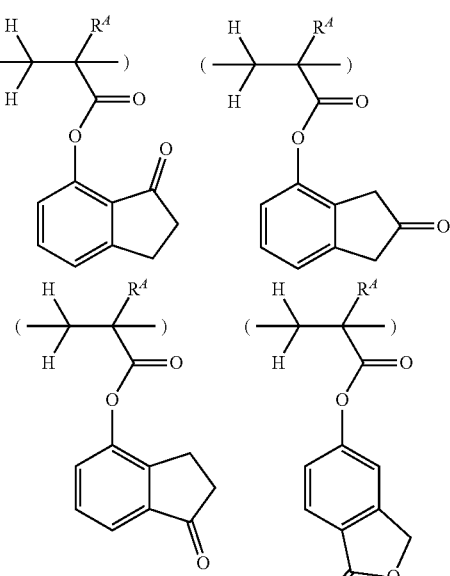
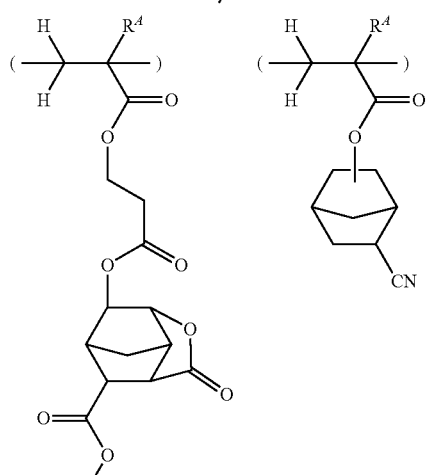
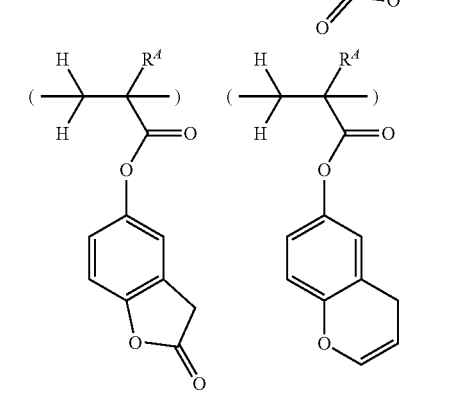
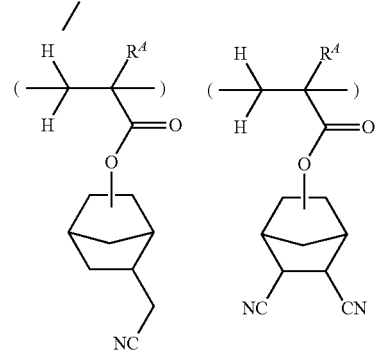
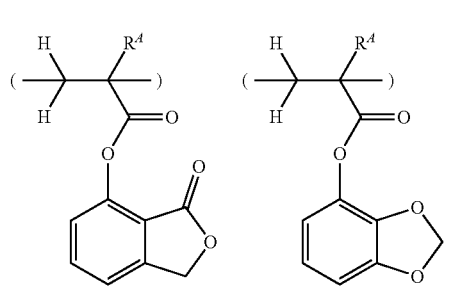

-continued
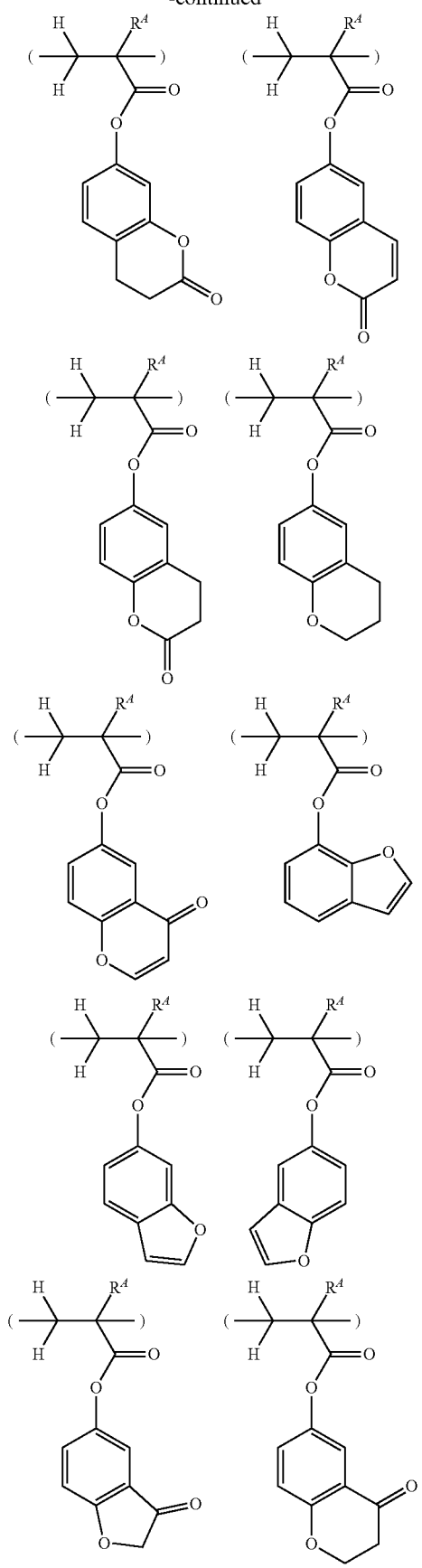
-continued
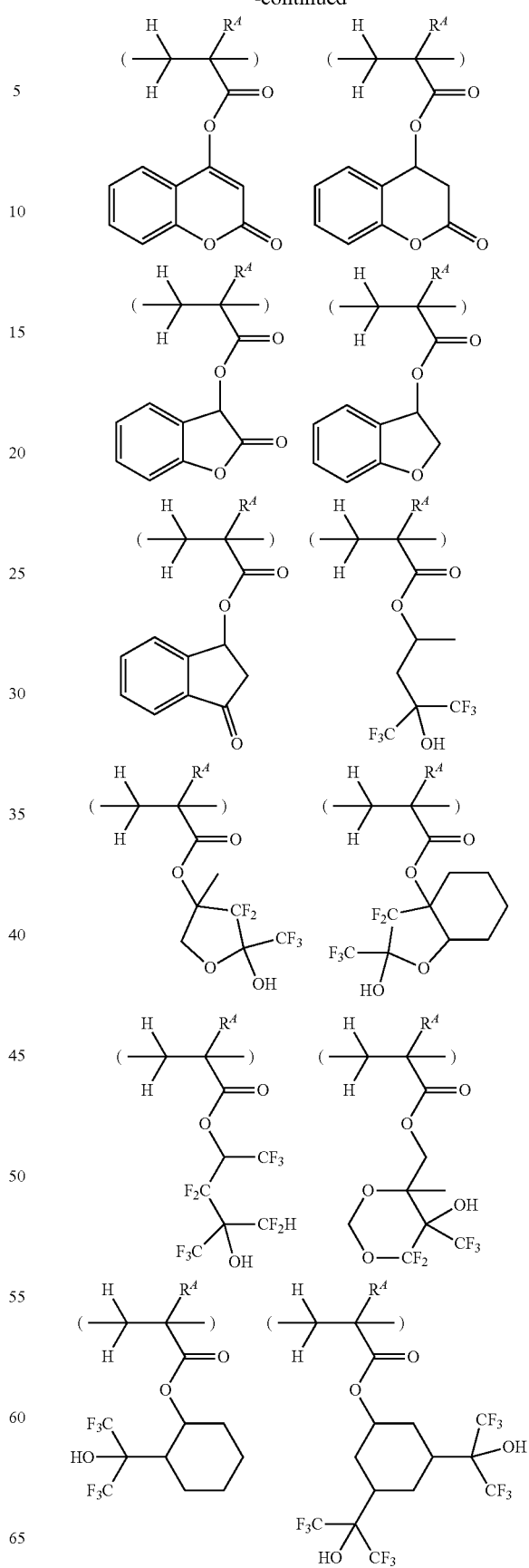

-continued
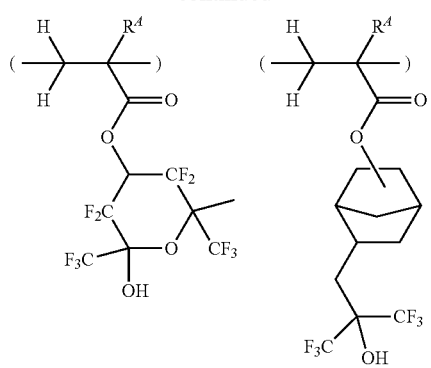 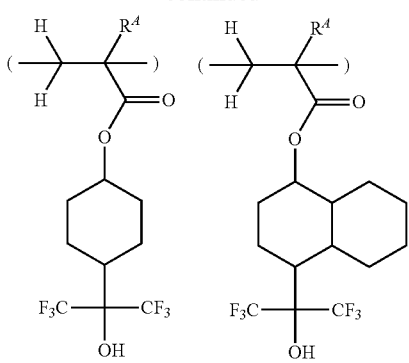
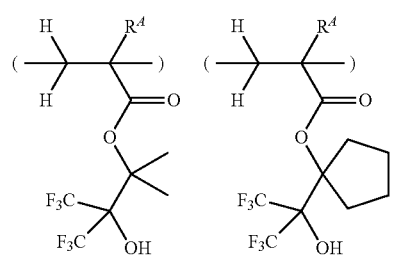 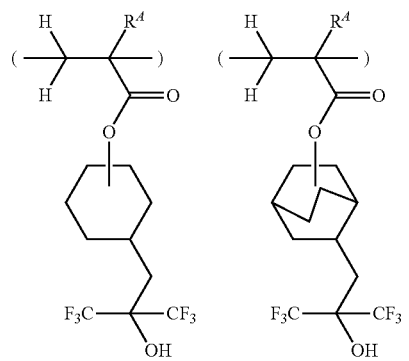
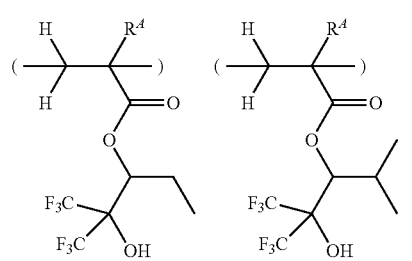 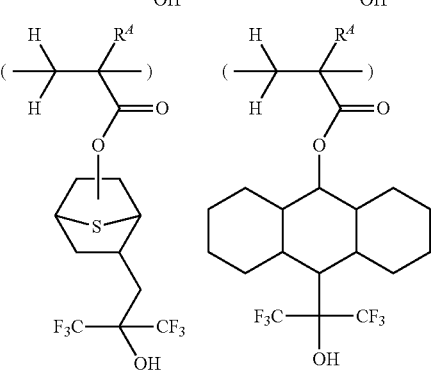
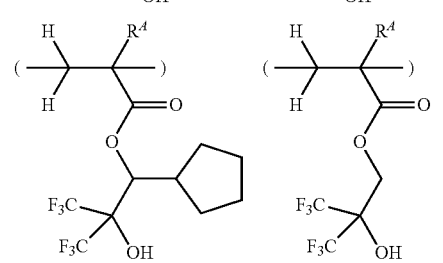
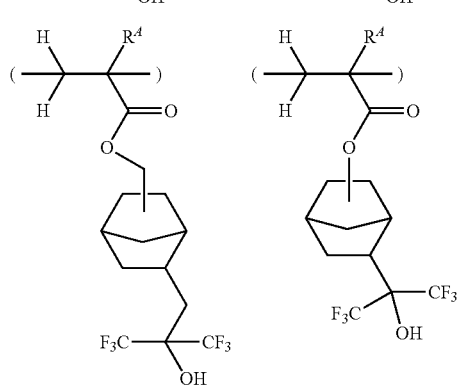 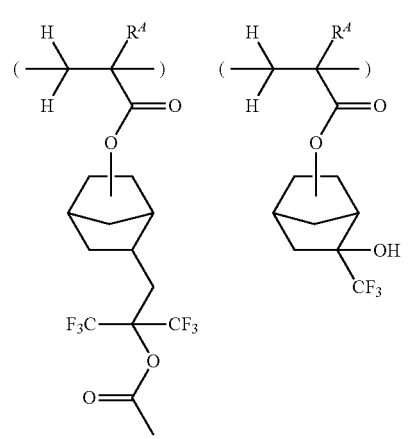

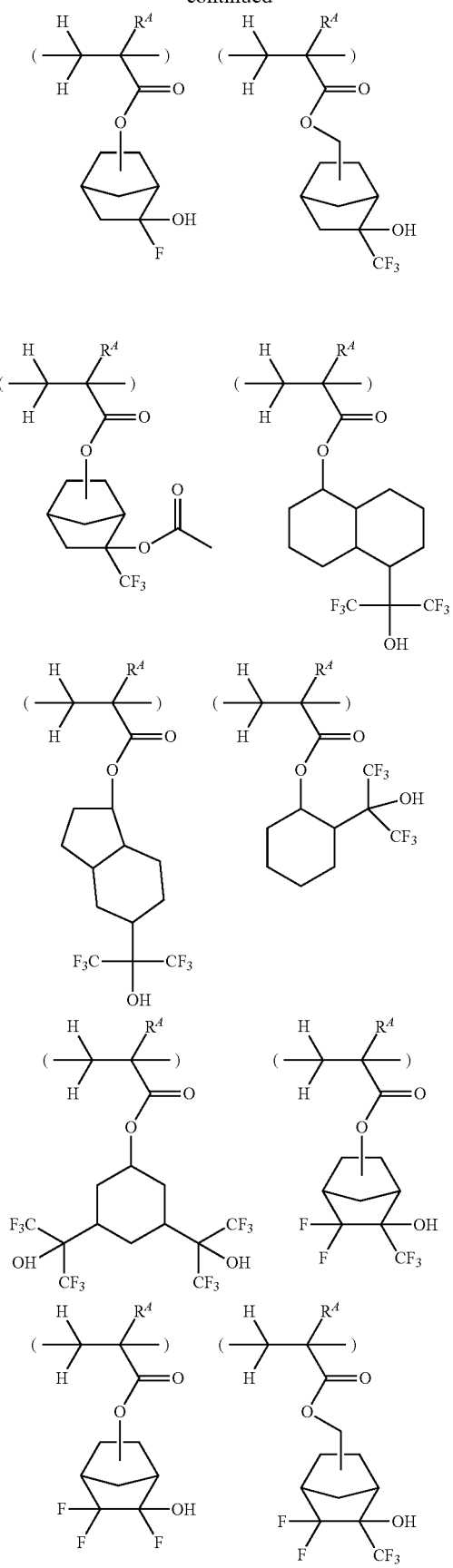
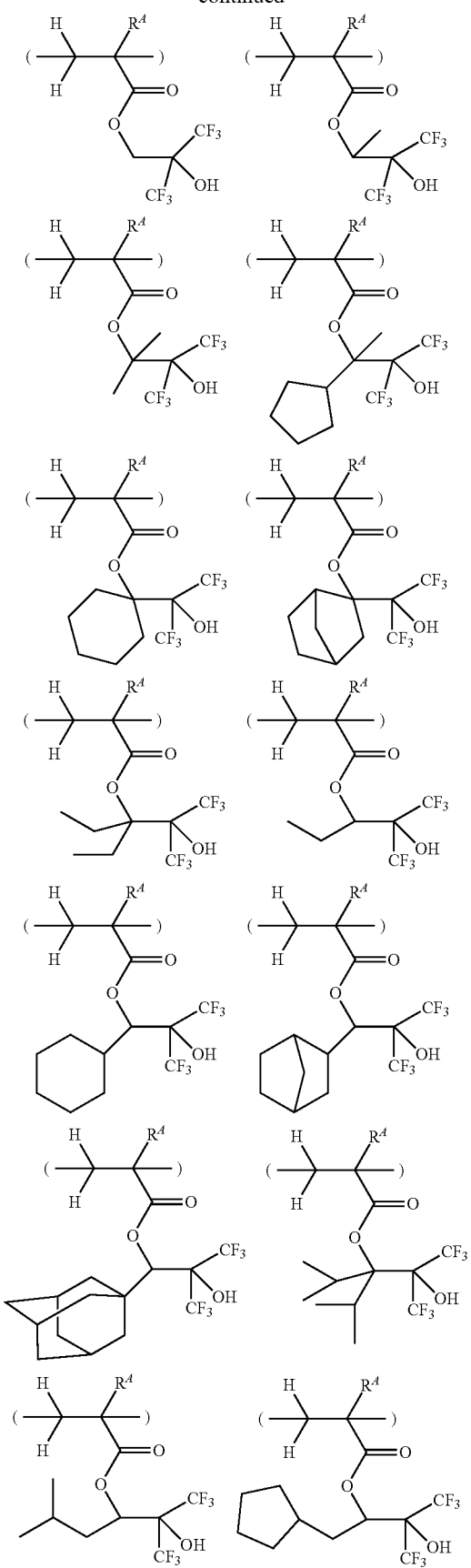

-continued
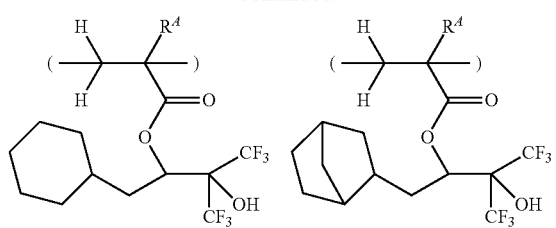
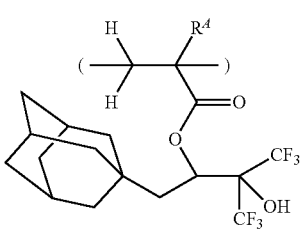
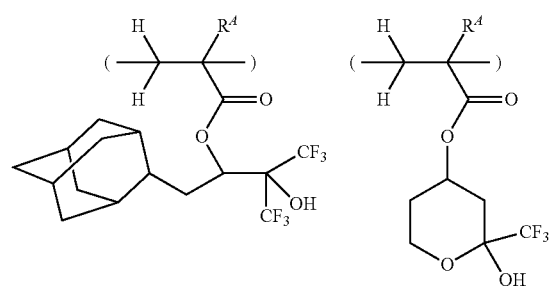
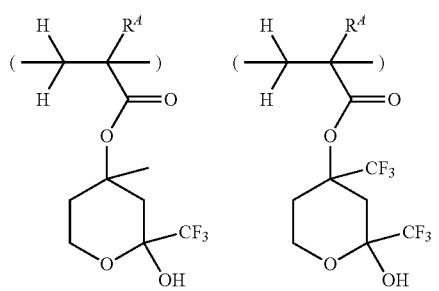
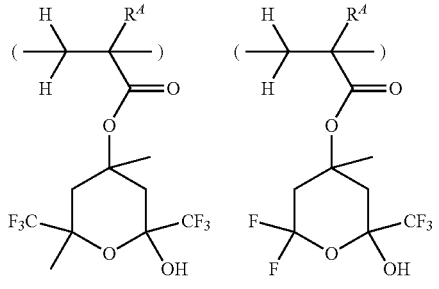
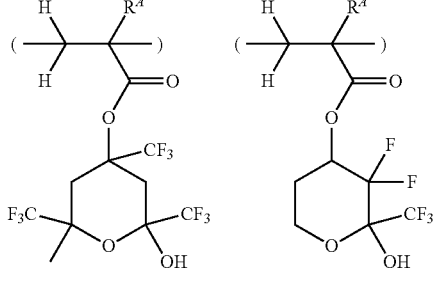
-continued
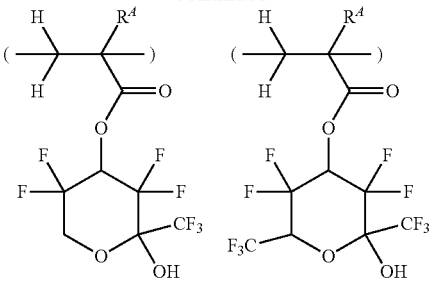
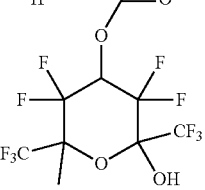
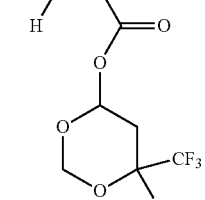
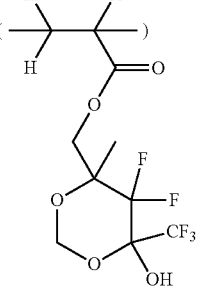
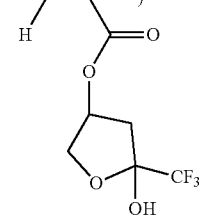
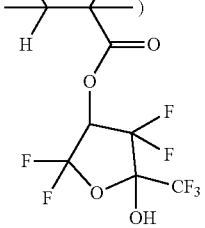

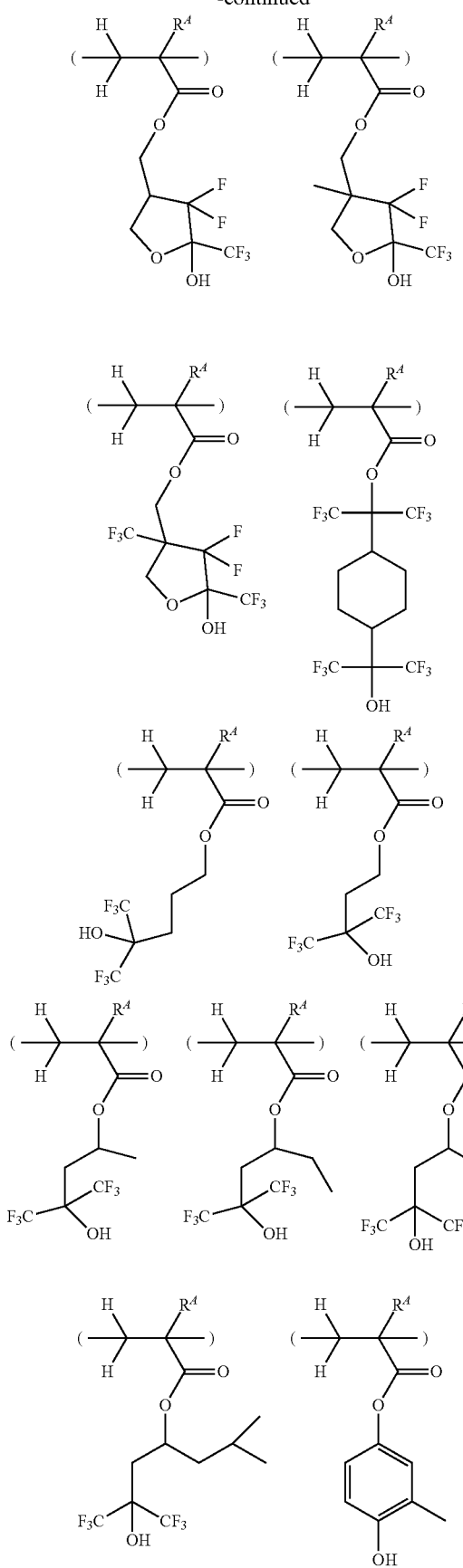
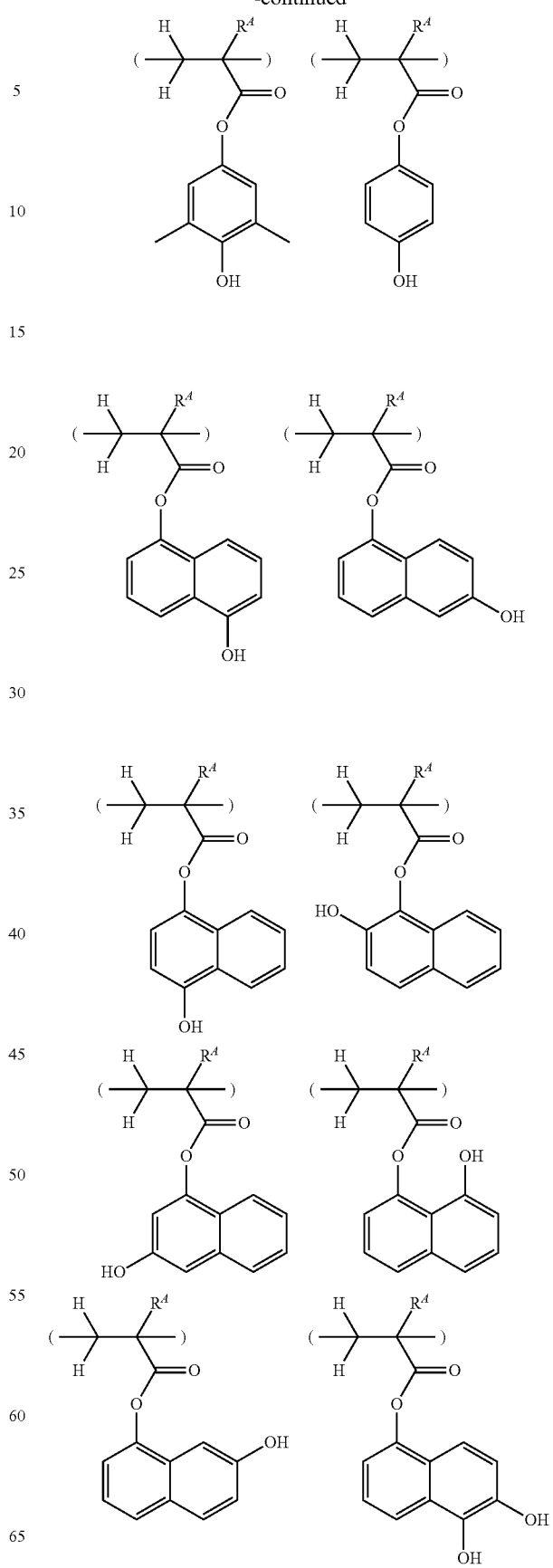

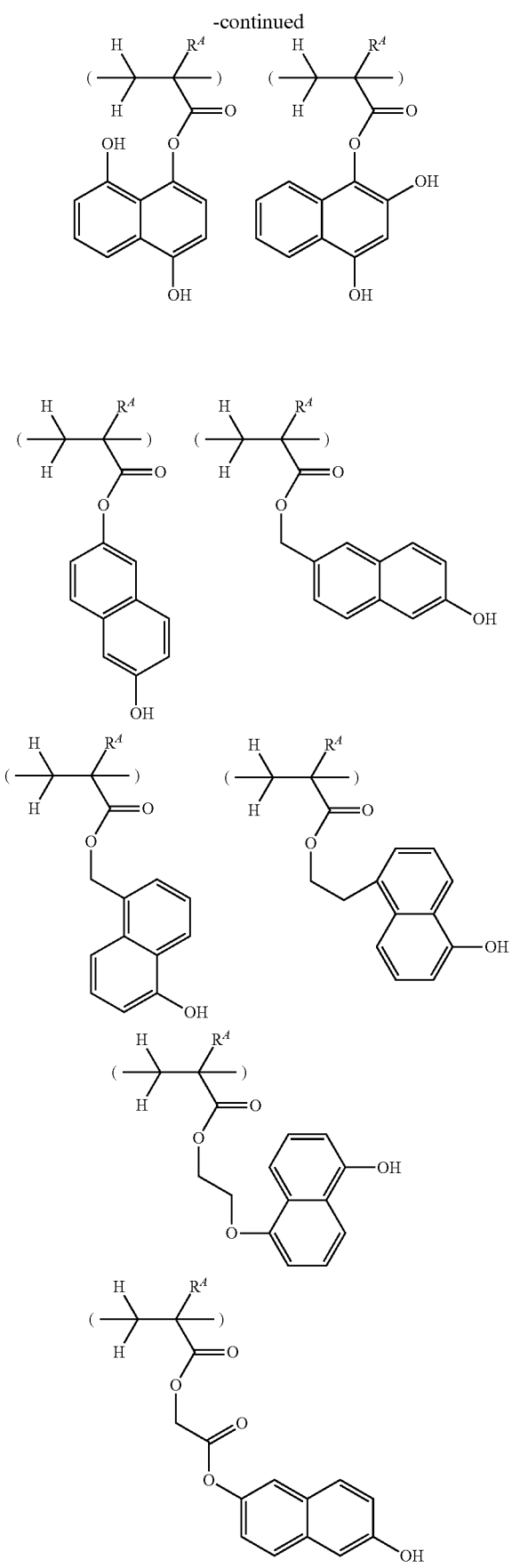

Examples of the repeat unit (b2) are given below, but not limited thereto. Herein $R^A$ is as defined above.

Of the repeat units (b1) or (b2), those units having a lactone ring as the polar group are preferred in the ArF lithography process and those units having a phenolic hydroxy group are preferred in the KrF, EB and EUV lithography processes.

The base polymer may further comprise repeat units having the formula (c1) or (c2). Notably, the units having formula (c1) or (c2) are sometimes referred to as repeat units (c1) or (c2). They are repeat units having a photoacid generating group.

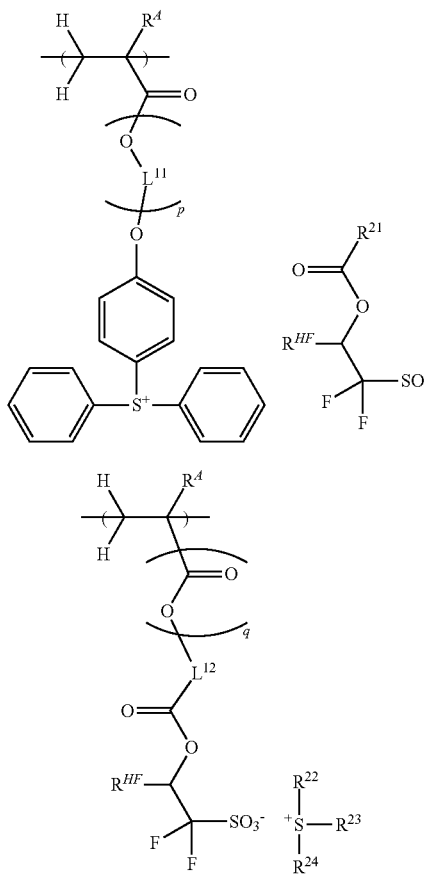

In formulae (c1) and (c2), $R^A$ is as defined above. $R^{21}$ is a $C_1$-$C_{20}$ hydrocarbyl group which may contain a heteroatom. $R^{22}$, $R^{23}$ and $R^{24}$ are each independently a $C_1$-$C_{20}$ hydrocarbyl group which may contain a heteroatom. The hydrocarbyl groups $R^{21}$, $R^{22}$, $R^{23}$ and $R^{24}$ may be saturated or unsaturated and straight, branched or cyclic. Examples thereof are as exemplified above for the $C_1$-$C_{20}$ hydrocarbyl groups $R^1$ to $R^4$ and R.

In formula (c1), $L^{11}$ is a $C_2$-$C_5$ alkanediyl group. Examples thereof include ethane-1,2-diyl, propane-1,2-diyl, propane-1,3-diyl, butane-1,3-diyl, and butane-1,4-diyl.

In formula (c2), $L^{12}$ is a single bond or a $C_1$-$C_{20}$ hydrocarbylene group which may contain a heteroatom. The hydrocarbylene group $L^{12}$ may be saturated or unsaturated and straight, branched or cyclic. Examples thereof include alkanediyl groups such as methanediyl, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; cyclic saturated hydrocarbylene groups such as cyclopentanediyl, cyclohexanediyl, norbornanediyl and adamantanediyl; and arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene, and tert-butylnaphthylene. Also included are substituted forms of the foregoing groups in which some or all hydrogen is substituted by a moiety containing a heteroatom such as oxygen, sulfur, nitrogen, or halogen, or any constituent —$CH_2$— is replaced by a moiety containing a heteroatom such as oxygen, sulfur or nitrogen, so that the group may contain a hydroxy moiety, cyano moiety, carbonyl moiety, ether bond, thioether bond, ester bond, sulfonic ester bond, carbonate bond, carbamate bond, lactone ring, sultone ring, carboxylic anhydride or haloalkyl moiety.

In formulae (c1) and (c2), $R^{HF}$ is each independently hydrogen or trifluoromethyl, preferably trifluoromethyl. The subscript p is 0 or 1, and q is 0 or 1, q being 0 when $L^2$ is a single bond.

Illustrative structures of the anion in formula (c1) include those described in JP-A 2010-113209 and JP-A 2007-145797. Illustrative structures of the anion in formula (c2) wherein $R^{HF}$ is hydrogen include those described in JP-A 2010-116550. Illustrative structures of the anion in formula (c2) wherein $R^{HF}$ is trifluoromethyl include those described in JP-A 2010-077404.

In addition to the foregoing units, the base polymer may further comprise other repeat units, for example, repeat units derived from monomers such as substituted acrylic esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[6.2.1.1$^{3,6}$.0$^{2,7}$]dodecene derivatives, unsaturated acid anhydrides such as itaconic anhydride, and other monomers.

The base polymer has a weight average molecular weight (Mw) of preferably 1,000 to 500,000, and more preferably 3,000 to 100,000, as measured versus polystyrene standards by gel permeation chromatography (GPC) using tetrahydrofuran (THF) solvent. When Mw is within the range, satisfactory etch resistance is achievable, and a drop of resolution due to difficulty to gain a dissolution rate difference before and after exposure may be avoided.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0 in order to provide a resist composition suitable for micropatterning to a small feature size.

A single polymer or a blend of two or more polymers which differ in compositional ratio, Mw and/or Mw/Mn may be used as the base polymer (C).

The base polymer may be synthesized by any desired method, for example, by dissolving a monomer or monomers from which the aforementioned repeat units are derived in an organic solvent, adding a radical initiator, and heating for polymerization. Suitable organic solvents used herein include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the reaction temperature is 50 to 80° C. and the reaction time is 2 to 100 hours, more preferably 5 to 20 hours. The acid labile group that has been incorporated in the monomer may be kept as such, or the polymer may be protected or partially protected therewith at the end of polymerization.

In the base polymer, appropriate molar fractions (mol %) of the respective repeat units derived from the monomers are given below although the invention is not limited thereto. The polymer may comprise:

(I) 1 to 60 mol %, preferably 5 to 50 mol %, and more preferably 10 to 50 mol % of repeat units of at least one type selected from formulae (a1) and (a2), (II) 40 to 99 mol %, preferably 50 to 95 mol %, and more preferably 50 to 90 mol % of repeat units of at least one type selected from formulae (b1) and (b2), and (III) 0 to 50 mol %, preferably 0 to 40 mol %, and more preferably 0 to 30 mol % of repeat units of at least one type derived from another monomer.

(D) Photoacid Generator

The resist composition may further comprise a photoacid generator (PAG) capable of generating a strong acid in response to actinic light or radiation. As used herein, the term "strong acid" refers to a compound having a sufficient acidity to induce deprotection reaction of an acid labile group on the base polymer.

The PAG may be any compound capable of generating an acid upon exposure to high-energy radiation such as UV, deep UV, EB, EUV, x-ray, excimer laser, γ-ray, and synchrotron radiation. Suitable PAGs include sulfonium salts, iodonium salts, sulfonyldiazomethanes, N-sulfonyloxydicarboxyimides, O-arylsulfonyloximes, and O-alkylsulfonyloximes, which may be used alone or in admixture. Suitable examples are described in JP-A 2007-145797, paragraphs [0102]-[0113], for example.

Sulfonium salts having the formula (2) are preferred as the PAG.

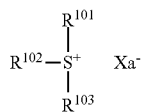

(2)

In formula (2), $R^{101}$, $R^{102}$ and $R^{103}$ are each independently a $C_1$-$C_{20}$ hydrocarbyl group which may contain a heteroatom. The $C_1$-$C_{20}$ hydrocarbyl groups represented by $R^{101}$, $R^{102}$ and $R^{103}$ may be saturated or unsaturated and straight, branched or cyclic. Examples thereof include $C_1$-$C_{10}$ alkyl groups such as methyl, ethyl, propyl, isopropyl, n-butyl, sec-butyl, tert-butyl, n-pentyl, tert-pentyl, n-hexyl, n-octyl, 2-ethylhexyl, n-nonyl, and n-decyl; cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.0$^{2,6}$]decanyl, adamantyl, and adamantylmethyl; aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl, and anthracenyl; and combinations thereof. Also included are substituted forms of the foregoing groups in which some or all of the hydrogen atoms are substituted by a moiety containing a heteroatom such as oxygen, sulfur, nitrogen or halogen, or any constituent —CH2-is replaced by a moiety containing a heteroatom such as oxygen, sulfur or nitrogen, so that the group may contain a hydroxy moiety, fluorine, chlorine, bromine, iodine, cyano moiety, carbonyl moiety, ether bond, thioether bond, ester bond, sulfonic ester bond, carbonate bond, carbamate bond, lactone ring, sultone ring, carboxylic anhydride or haloalkyl moiety.

A pair of $R^{101}$ and $R^{102}$ may bond together to form a ring with the sulfur atom to which they are attached. Preferred examples of the ring are shown by the following structures.

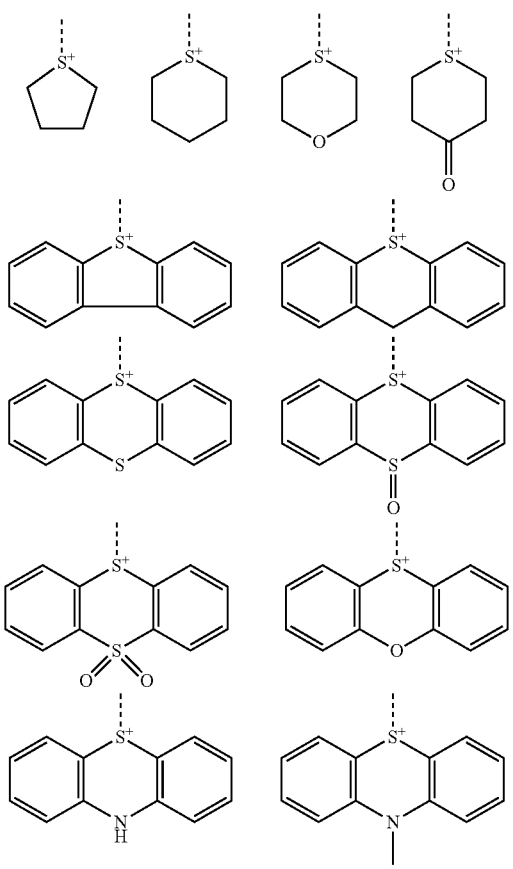

Herein the broken line designates a point of attachment to $R^{103}$.

Examples of the sulfonium cation in the sulfonium salt having formula (2) include triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl) sulfonium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris (4-dimethylaminophenyl)sulfonium, 2-naphthyldiphenylsulfonium, (4-hydroxy-3,5-dimethylphenyl)diphenylsulfonium, (4-n-hexyloxy-3,5-dimethylphenyl)diphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl-2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, and 2-methoxynaphthyl-1-thiacyclopentanium.

Other examples of the sulfonium cation in the sulfonium salt having formula (2) are shown below.

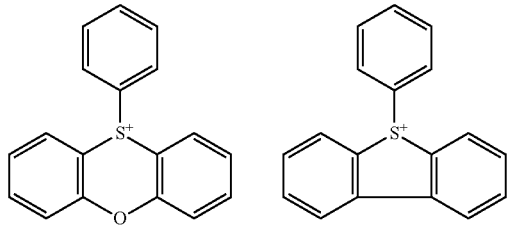

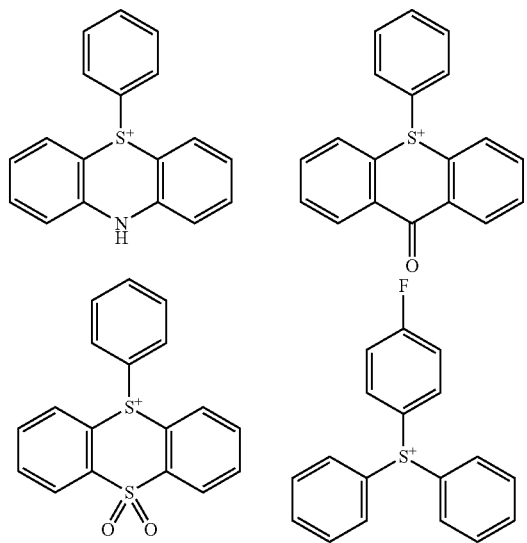

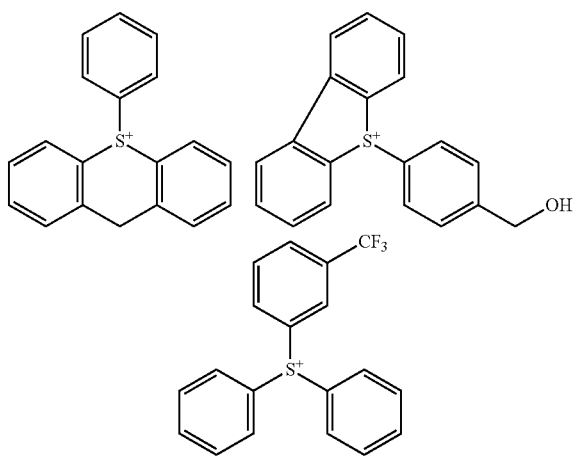

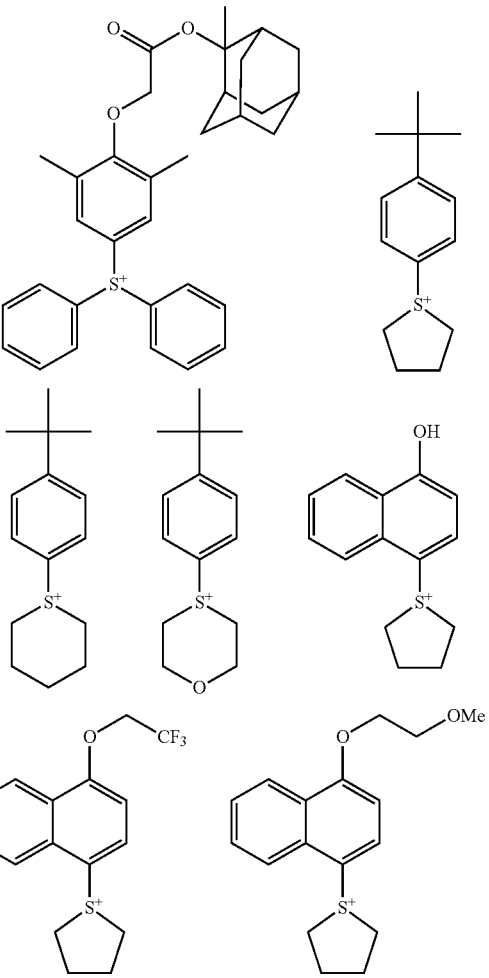

Of these, triphenylsulfonium, 4-tert-butylphenyldiphenylsulfonium, 4-tert-butoxyphenyldiphenylsulfonium, tris(4-tert-butylphenyl)sulfonium, tris(4-tert-butoxyphenyl)sulfonium, and dimethylphenylsulfonium are more preferred.

In formula (2), $X_a^-$ is an anion selected from the formulae (2A) to (2D).

      (2A)

      (2B)

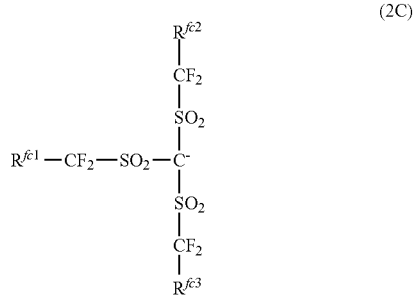      (2C)

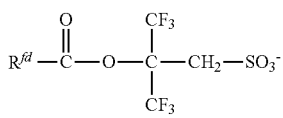

(2D)

In formula (2A), $R^{fa}$ is fluorine or a $C_1$-$C_{40}$ hydrocarbyl group which may contain a heteroatom. The hydrocarbyl group may be saturated or unsaturated and straight, branched or cyclic.

Of the anions of formula (2A), a structure having the formula (2A') is especially preferred.

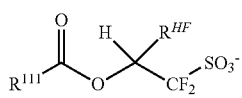

(2A')

In formula (2A'), $R^{HF}$ is hydrogen or trifluoromethyl. $R^{111}$ is a $C_1$-$C_{30}$ hydrocarbyl group which may contain a heteroatom. Suitable heteroatoms include oxygen, nitrogen, sulfur and halogen, with oxygen being preferred. Of the hydrocarbyl groups, those of 6 to 30 carbon atoms are preferred because a high resolution is available in fine pattern formation.

The hydrocarbyl group $R^{111}$ may be saturated or unsaturated and straight, branched or cyclic. Examples thereof include $C_1$-$C_{30}$ alkyl groups such as methyl, ethyl, propyl, isopropyl, butyl, isobutyl, sec-butyl, tert-butyl, pentyl, neopentyl, hexyl, heptyl, 2-ethylhexyl, nonyl, undecyl, tridecyl, pentadecyl, heptadecyl, and icosanyl; $C_3$-$C_{30}$ cyclic saturated hydrocarbyl groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl; $C_2$-$C_{30}$ unsaturated aliphatic hydrocarbyl groups such as allyl and 3-cyclohexenyl; $C_6$-$C_{30}$ aryl groups such as phenyl, 1-naphthyl and 2-naphthyl; $C_7$-$C_{30}$ aralkyl groups such as benzyl and diphenylmethyl, and combinations thereof.

Also included are substituted forms of the foregoing groups in which some or all of the hydrogen atoms are substituted by a moiety containing a heteroatom such as oxygen, sulfur, nitrogen or halogen, or some carbon is replaced by a moiety containing a heteroatom such as oxygen, sulfur or nitrogen, so that the group may contain a hydroxy, fluorine, chlorine, bromine, iodine, cyano, nitro, carbonyl, ether bond, ester bond, sulfonic ester bond, carbonate bond, lactone ring, sultone ring, carboxylic anhydride or haloalkyl moiety. Examples of the heteroatom-containing hydrocarbyl group include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of a sulfonium salt having the anion of formula (2A'), reference is made to JP-A 2007-145797, JP-A 2008-106045, JP-A 2009-007327, and JP-A 2009-258695.

Examples of the anion having formula (2A) include nonafluorobutane sulfonate ions, partially fluorinated sulfonate ions described in JP-A 2012-189977, paragraphs [0247]-[0251], and partially fluorinated sulfonate ions described in JP-A 2013-101271, paragraphs [0261]-[0265].

Further examples of the anion having formula (2A) include the following, but are not limited thereto.

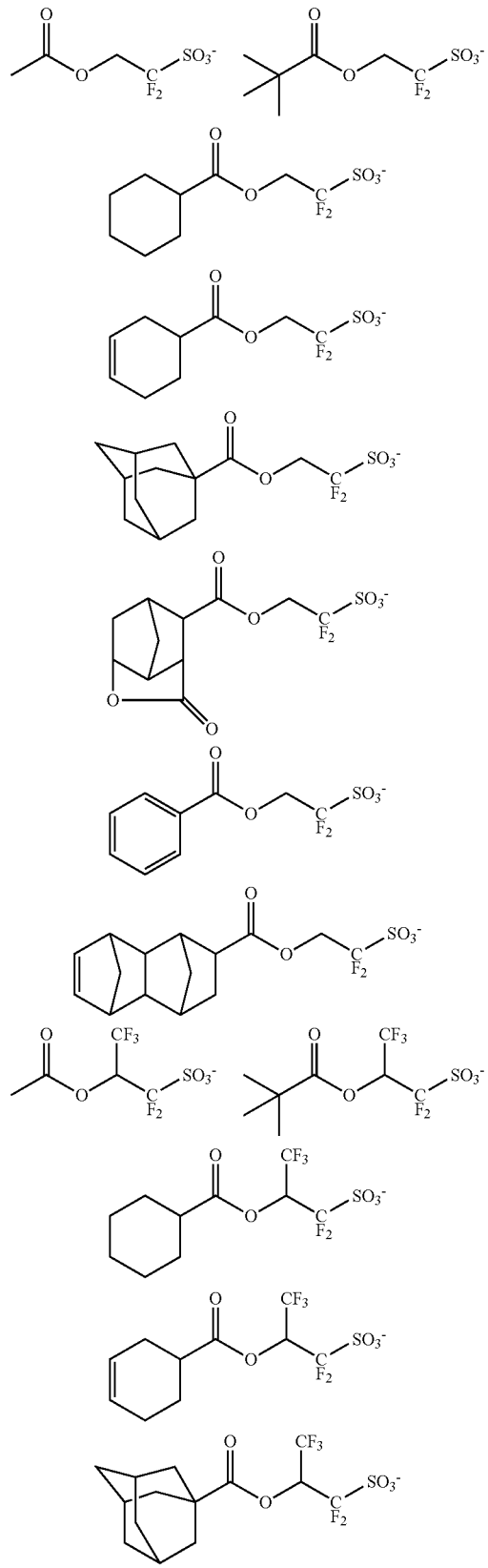

59
-continued
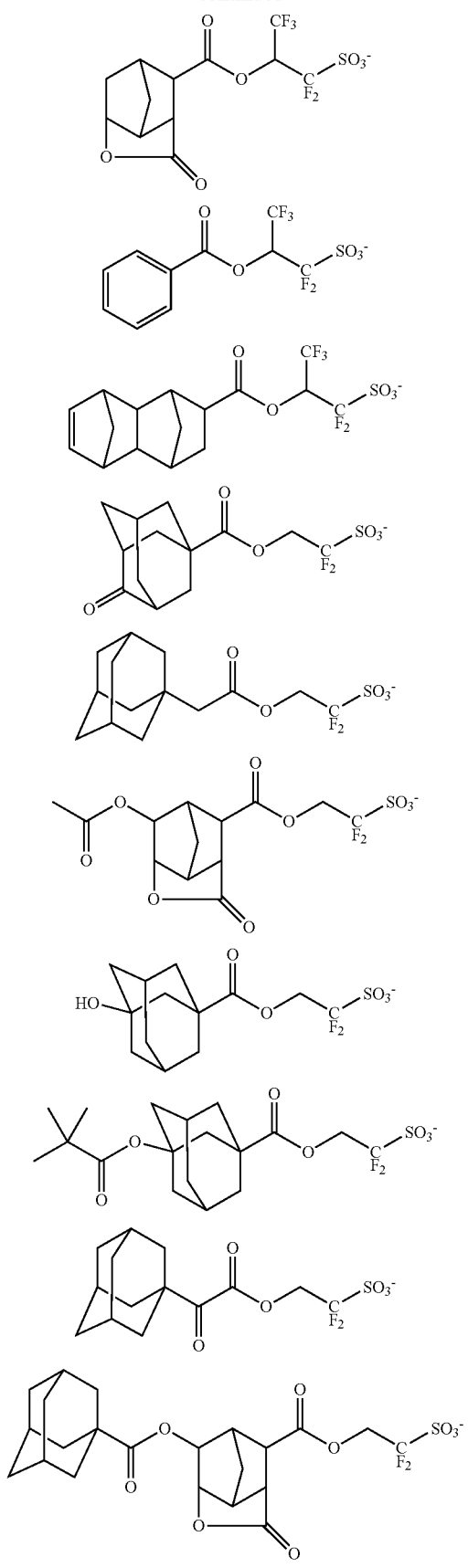
60
-continued
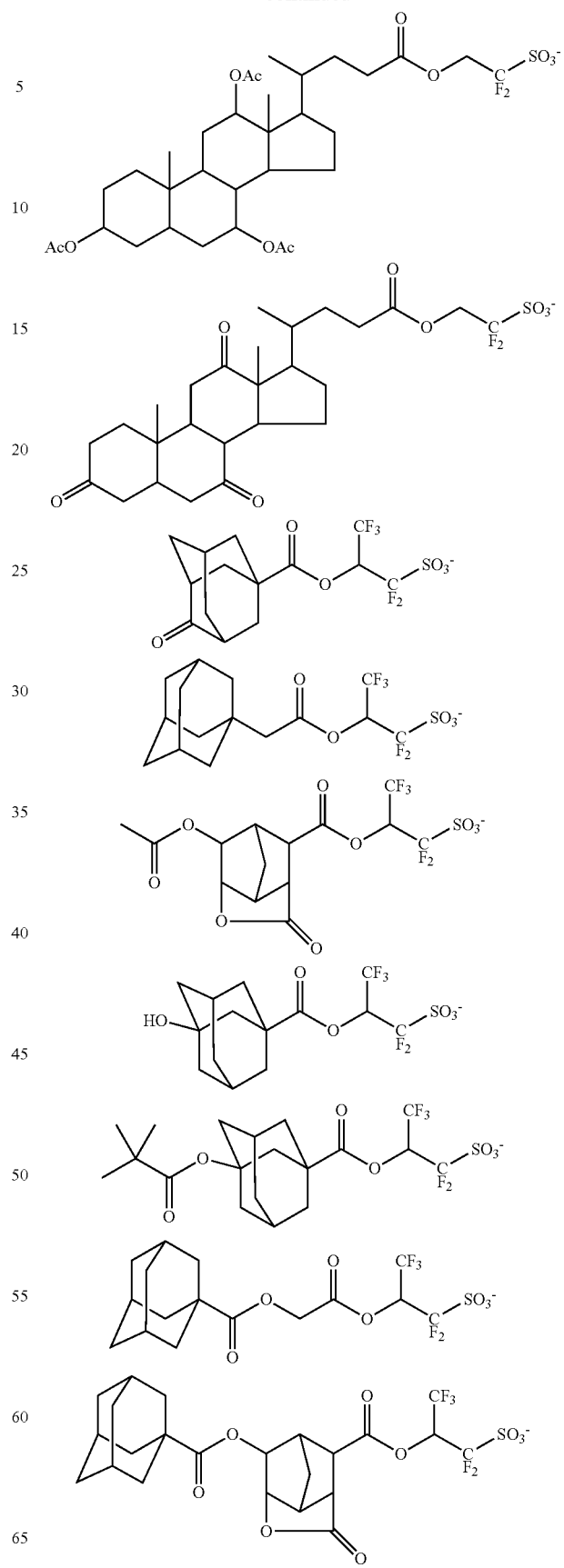

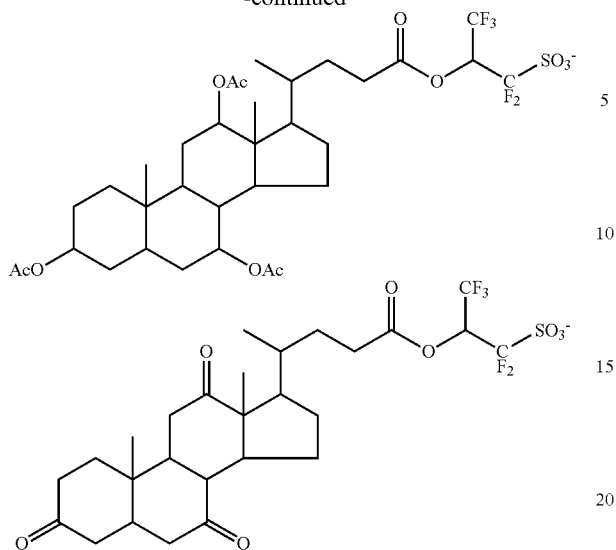

In formula (2B), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic. Examples thereof are as exemplified for the hydrocarbyl group $R^{111}$ in formula (1A'). Preferably $R^{fb1}$ and $R^{fb2}$ are fluorine or $C_1$-$C_4$ straight fluorinated alkyl groups. Also, $R^{fb1}$ and $R^{fb2}$ may bond together to form a ring with the linkage: —$CF_2$—$SO_2$—$N^-$—$SO_2$—$CF_2$— to which they are attached. In this case, the combination of $R^{fb1}$ and $R^{fb2}$ is preferably a fluorinated ethylene or fluorinated propylene group.

In formula (2C), $R^{fc1}$, $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic. Examples thereof are as exemplified for the hydrocarbyl group $R^{111}$ in formula (1A'). Preferably $R^{fc1}$, $R^{fc2}$ and $R^{fc3}$ are fluorine or $C_1$-$C_4$ straight fluorinated alkyl groups. Also, $R^{fc1}$ and $R^{fc2}$ may bond together to form a ring with the linkage: —$CF_2$—$SO_2$—$C^-$—$SO_2$—$CF_2$— to which they are attached. In this case, the combination of $R^{fc1}$ and $R^{fc2}$ is preferably a fluorinated ethylene or fluorinated propylene group.

In formula (2D), $R^{fd}$ is a $C_1$-$C_{40}$ hydrocarbyl group which may contain a heteroatom. The hydrocarbyl group may be saturated or unsaturated and straight, branched or cyclic. Examples thereof are as exemplified for the hydrocarbyl group $R^{111}$ in formula (1A').

With respect to the synthesis of a sulfonium salt having the anion of formula (2D), reference is made to JP-A 2010-215608.

Examples of the anion having formula (2D) include the following, but are not limited thereto.

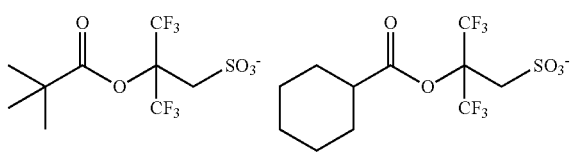

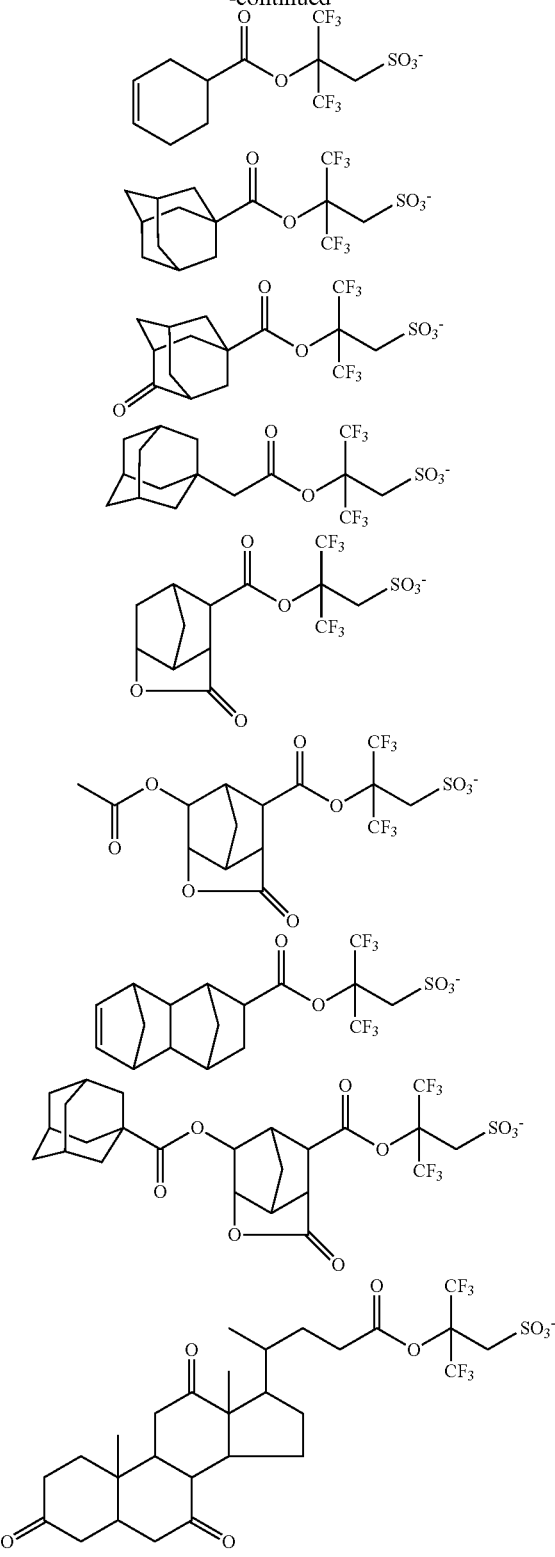

Notably, the compound having the anion of formula (2D) does not have fluorine at the α-position relative to the sulfo group, but two trifluoromethyl groups at the β-position. For this reason, it has a sufficient acidity to sever the acid labile groups in the base polymer. Thus the compound is an effective PAG.

Another preferred PAG (D) is a compound having the formula (3).

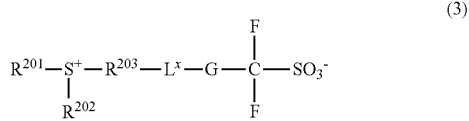

In formula (3), $R^{201}$ and $R^{202}$ are each independently a $C_1$-$C_{20}$ hydrocarbyl group which may contain a heteroatom. $R^{203}$ is a $C_1$-$C_{20}$ hydrocarbylene group which may contain a heteroatom. Any two of $R^{201}$, $R^{202}$ and $R^{203}$ may bond together to form a ring with the sulfur atom to which they are attached. Examples of the ring are as exemplified above for the ring that $R^{101}$ and $R^{102}$ in formula (2), taken together, form with the sulfur atom to which they are attached.

The hydrocarbyl groups represented by $R^{201}$ and $R^{202}$ may be saturated or unsaturated and straight, branched or cyclic. Examples thereof include $C_1$-$C_{20}$ alkyl groups such as methyl, ethyl, propyl, isopropyl, n-butyl, sec-butyl, tert-butyl, n-pentyl, tert-pentyl, n-hexyl, n-octyl, 2-ethylhexyl; $C_3$-$C_{20}$ cyclic saturated hydrocarbyl groups such as cyclopentyl, cyclohexyl, cyclopentylmethyl, cyclopentylethyl, cyclohexylmethyl, cyclohexylethyl, norbornyl, oxanorbornyl, tricyclo[5.2.1.0$^{2,6}$]decanyl, adamantyl; $C_6$-$C_{30}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, and tert-butylnaphthyl; and combinations thereof. Also included are substituted forms of the foregoing groups in which some or all of the hydrogen atoms are substituted by a moiety containing a heteroatom such as oxygen, sulfur, nitrogen, or halogen, or any constituent —$CH_2$— is replaced by a moiety containing a heteroatom such as oxygen, sulfur or nitrogen, so that the group may contain a hydroxy, fluorine, chlorine, bromine, iodine, cyano, nitro, carbonyl moiety, ether bond, ester bond, sulfonic ester bond, carbonate bond, lactone ring, sultone ring, carboxylic anhydride or haloalkyl moiety. Of these, optionally substituted aryl groups are preferred as $R^{201}$ and $R^{202}$.

The hydrocarbylene group $R^{203}$ may be saturated or unsaturated and straight, branched or cyclic. Examples thereof include $C_1$-$C_{20}$ alkanediyl groups such as methanediyl, ethane-1,1-diyl, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; $C_3$-$C_{20}$ cyclic saturated hydrocarbylene groups such as cyclopentanediyl, cyclohexanediyl, norbornanediyl and adamantanediyl; and $C_6$-$C_{30}$ arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene, tert-butylnaphthylene, and combinations thereof. Also included are substituted forms of the foregoing groups in which some or all of the hydrogen atoms are substituted by a moiety containing a heteroatom such as oxygen, sulfur, nitrogen, or halogen and any constituent —$CH_2$— is replaced by a moiety containing a heteroatom such as oxygen, sulfur or nitrogen, so that the group may contain a hydroxy, fluorine, chlorine, bromine, iodine, cyano, nitro, carbonyl, ether bond, ester bond, sulfonic ester bond, carbonate bond, lactone ring, sultone ring, carboxylic anhydride or haloalkyl moiety. Of these, optionally substituted aryl groups are preferred as $R^{203}$.

In formula (3), G is a single bond or a $C_1$-$C_{20}$ hydrocarbylene group which may contain a heteroatom. The hydrocarbylene group G may be saturated or unsaturated and straight, branched or cyclic. Examples thereof are as exemplified above for the hydrocarbylene group $R^{203}$. In these groups, some or all of the hydrogen atoms may be substituted by a moiety containing a heteroatom such as oxygen, sulfur, nitrogen, or halogen and any constituent —$CH_2$— may be replaced by a moiety containing a heteroatom such as oxygen, sulfur or nitrogen, so that the group may contain a hydroxy, fluorine, chlorine, bromine, iodine, cyano, nitro, carbonyl, ether bond, ester bond, sulfonic ester bond, carbonate bond, lactone ring, sultone ring, carboxylic anhydride or haloalkyl moiety. Preferably, G is methylene or methylene whose hydrogen is substituted by fluorine or trifluoromethyl.

In formula (3), $L^x$ is a divalent linking group. Suitable linking groups include an ether bond, ester bond, thioether bond, sulfonic ester bond, sulfonic ester bond, carbonate bond and carbamate bond.

Examples of the PAG having formula (3) are as exemplified for the PAG having formula (3) in JP-A 2018-062503 (U.S. Pat. No. 10,173,975).

In the resist composition, the PAG (D) is used in an amount of 0 to 40 parts by weight, and when added, preferably 0.1 to 40 parts by weight, more preferably 0.1 to 20 parts by weight per 80 parts by weight of the base polymer (C). As long as the amount of PAG is in the range, a satisfactory resolution is achieved and the problem of foreign particles after resist development or during stripping is avoided. The PAG may be used alone or in admixture.

(E) Other Acid Diffusion Inhibitor

While the resist composition essentially contains (A) the acid diffusion inhibitor having formula (1), it may further contain an acid diffusion inhibitor other than the compound having formula (1), which is referred to as other acid diffusion inhibitor, hereinafter. Typical of the other acid diffusion inhibitor are amine compounds and onium salt compounds. Suitable amine compounds include primary, secondary and tertiary amine compounds, specifically amine compounds having a hydroxy group, ether bond, ester bond, lactone ring, cyano group, or sulfonic ester bond, as described in JP-A 2008-111103, paragraphs [0146]-[0164], and primary and secondary amine compounds protected with a carbamate to group, as described in JP 3790649. Suitable onium salt compounds include those described in Patent Document 1 and JP-A 2003-005376.

Also a sulfonium salt of sulfonic acid having a nitrogen-containing substituent may be used as component (E). This compound functions as a quencher in the unexposed region, but as a so-called photo-degradable base in the exposed region because it loses the quencher function in the exposed region due to neutralization thereof with the acid generated by itself. Using a photo-degradable base, the contrast between exposed and unexposed regions can be further enhanced. With respect to the photo-degradable base, reference may be made to JP-A 2009-109595 and 2012-046501, for example.

When used, the other acid diffusion inhibitor (E) is preferably formulated in an amount of 0.001 to 12 parts by weight, more preferably 0.01 to 8 parts by weight per 80 parts by weight of the base polymer (C). The other acid diffusion inhibitor may be used alone or in admixture.

(F) Surfactant

The resist composition may further comprise (F) a surfactant. It is typically a surfactant which is insoluble or substantially insoluble in water and alkaline developer, or a surfactant which is insoluble or substantially insoluble in water and soluble in alkaline developer. For the surfactant, reference should be made to those compounds described in JP-A 2010-215608 and JP-A 2011-016746.

While many examples of the surfactant which is insoluble or substantially insoluble in water and alkaline developer are described in the patent documents cited herein, preferred examples are fluorochemical surfactants FC-4430 (3M), Olfine® E1004 (Nissin Chemical Co., Ltd.), Surflon® S-381, KH-20 and KH-30 (AGC Seimi Chemical Co., Ltd). Partially fluorinated oxetane ring-opened polymers having the formula (surf-1) are also useful.

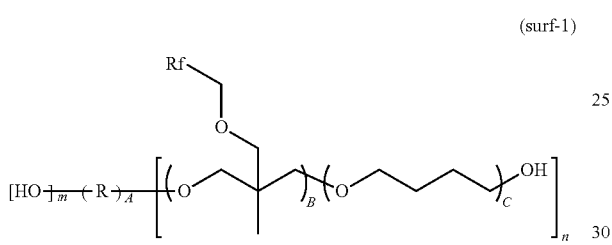

(surf-1)

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent aliphatic groups include ethylene, 1,4-butylene, 1,2-propylene, 2,2-dimethyl-1,3-propylene and 1,5-pentylene. Exemplary tri- and tetra-valent groups are shown below.

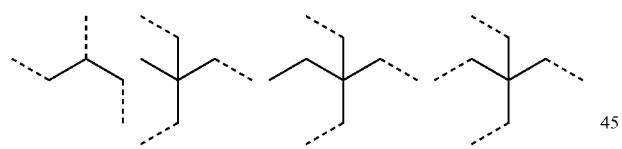

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferred.

Rf is trifluoromethyl or pentafluoroethyl, and preferably trifluoromethyl. The subscript m is an integer of 0 to 3, n is an integer of 1 to 4, and the sum of m and n, which represents the valence of R, is an integer of 2 to 4. "A" is equal to 1, B is an integer of 2 to 25, and C is an integer of 0 to 10. Preferably, B is an integer of 4 to 20, and C is 0 or 1. Note that the formula (surf-1) does not prescribe the arrangement of respective constituent units while they may be arranged either blockwise or randomly. For the preparation of surfactants in the form of partially fluorinated oxetane ring-opened polymers, reference should be made to U.S. Pat. No. 5,650,483, for example.

The surfactant which is insoluble or substantially insoluble in water and soluble in alkaline developer is useful when ArF immersion lithography is applied to the resist composition in the absence of a resist protective film. In this embodiment, the surfactant has a propensity to segregate on the surface of a resist film for achieving a function of minimizing water penetration or leaching. The surfactant is also effective for preventing water-soluble components from being leached out of the resist film for minimizing any damage to the exposure tool. The surfactant becomes solubilized during alkaline development following exposure and PEB, and thus forms few or no foreign particles which become defects. The preferred surfactant is a polymeric surfactant which is insoluble or substantially insoluble in water, but soluble in alkaline developer, also referred to as "hydrophobic resin" in this sense, and especially which is water repellent and enhances water sliding.

Suitable polymeric surfactants include those containing repeat units of at least one type selected from the formulae (4A) to (4E).

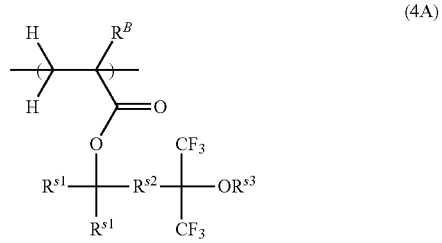

(4A)

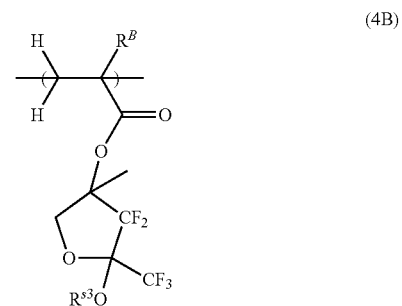

(4B)

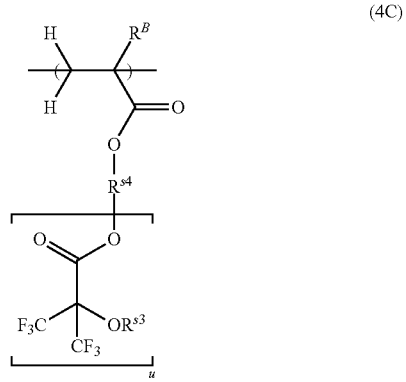

(4C)

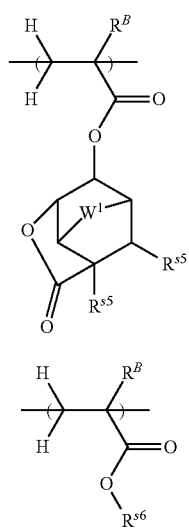

(4D)

(4E)

In formulae (4A) to (4E), $R^B$ is hydrogen, fluorine, methyl or trifluoromethyl. $W^1$ is —$CH_2$—, —$CH_2CH_2$— or —O—, or two separate —H. $R^{s1}$ is each independently hydrogen or a $C_1$-$C_{10}$ hydrocarbyl group. $R^{s2}$ is a single bond or a $C_1$-$C_5$ straight or branched hydrocarbylene group. $R^{s3}$ is each independently hydrogen, a $C_1$-$C_{15}$ hydrocarbyl or fluorinated hydrocarbyl group, or an acid labile group. When $R^{s3}$ is a hydrocarbyl or fluorinated hydrocarbyl group, an ether bond or carbonyl moiety may intervene in a carbon-carbon bond. $R^{s4}$ is a $C_1$-$C_{20}$ (u+1)-valent hydrocarbon or fluorinated hydrocarbon group, and u is an integer of 1 to 3. $R^{s5}$ is each independently hydrogen or a group: —C(=O)—O—$R^{s7}$ wherein $R^{s7}$ is a $C_1$-$C_{20}$ fluorinated hydrocarbyl group. $R^{s6}$ is a $C_1$-$C_{15}$ hydrocarbyl or fluorinated hydrocarbyl group in which an ether bond or carbonyl moiety may intervene in a carbon-carbon bond.

The hydrocarbyl group $R^{s1}$ may be straight, branched or cyclic. Examples thereof include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, n-octyl, n-nonyl, n-decyl, adamantyl, and norbornyl. Inter alia, $C_1$-$C_6$ groups are preferred.

The hydrocarbylene group $R^{s2}$ may be straight, branched or cyclic. Examples thereof include methylene, ethylene, propylene, butylene, and pentylene.

The hydrocarbyl group $R^{s3}$ or $R^{s6}$ may be straight, branched or cyclic. Examples thereof include alkyl, alkenyl, and alkynyl groups, with the alkyl groups being preferred. Suitable alkyl groups include those exemplified for the hydrocarbyl group represented by to $R^{s1}$ as well as n-undecyl, n-dodecyl, tridecyl, tetradecyl, and pentadecyl. Examples of the fluorinated hydrocarbyl group represented by $R^{s3}$ or $R^{s6}$ include the foregoing hydrocarbyl groups in which some or all carbon-bonded hydrogen atoms are substituted by fluorine atoms. In these groups, an ether bond or carbonyl moiety may intervene in a carbon-carbon bond as mentioned above.

Examples of the acid labile group represented by $R^{s3}$ include groups of the above formulae (L1) to (L4), $C_4$-$C_{20}$, preferably $C_4$-$C_{15}$ tertiary hydrocarbyl groups, trialkylsilyl groups in which each alkyl moiety has 1 to 6 carbon atoms, and $C_4$-$C_{20}$ oxoalkyl groups.

The (u+1)-valent hydrocarbon or fluorinated hydrocarbon group represented by $R^{s4}$ may be straight, branched or cyclic, and examples thereof include the foregoing hydrocarbyl or fluorinated hydrocarbyl groups from which the number (u) of hydrogen atoms are eliminated.

The fluorinated hydrocarbyl group represented by $R^{s7}$ may be straight, branched or cyclic, and examples thereof include the foregoing hydrocarbyl groups in which some or all hydrogen atoms are substituted by fluorine atoms. Illustrative examples include trifluoromethyl, 2,2,2-trifluoroethyl, 3,3,3-trifluoro-1-propyl, 3,3,3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 2-(perfluorodecyl)ethyl.

Examples of the repeat units having formulae (4A) to (4E) are shown below, but not limited thereto. Herein $R^B$ is as defined above.

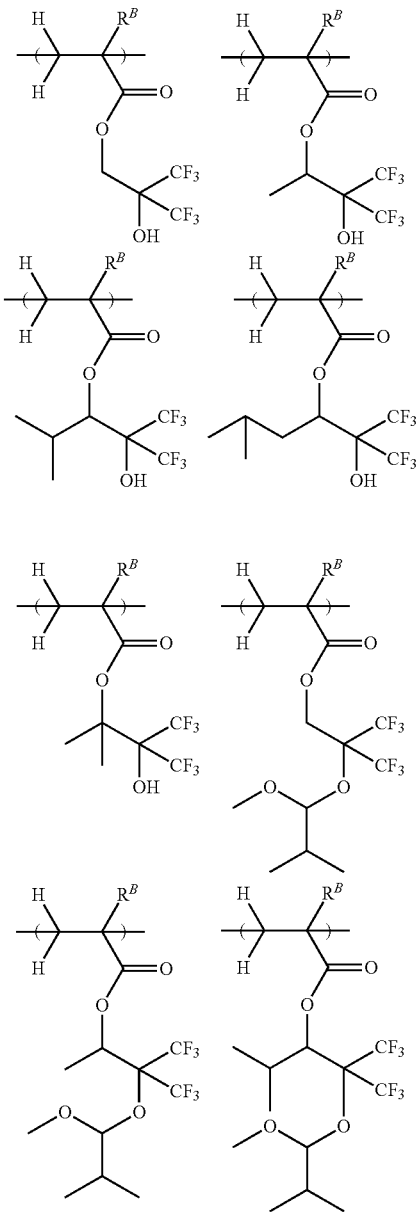

-continued
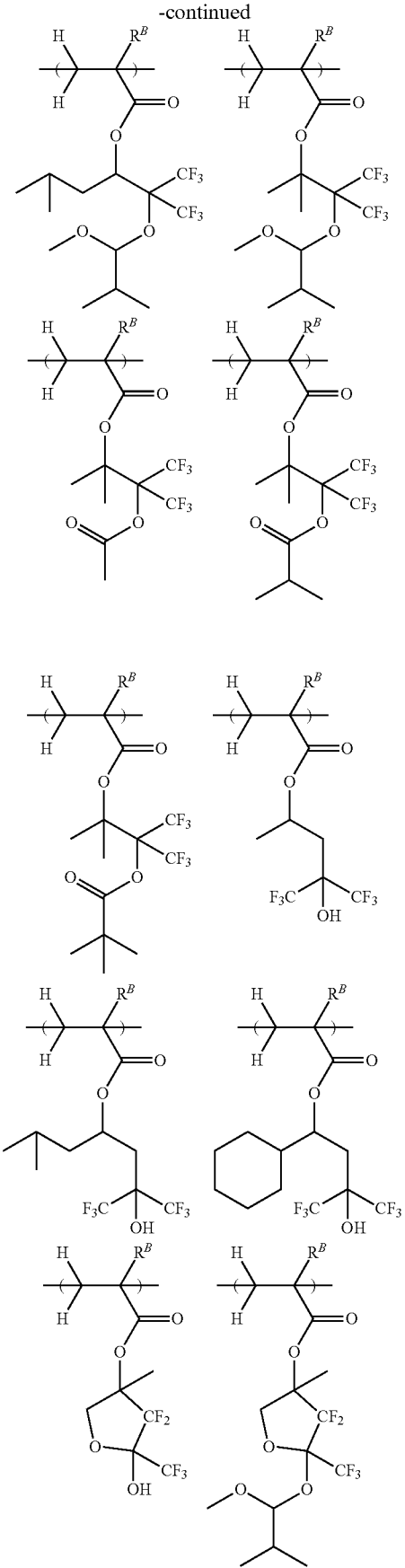
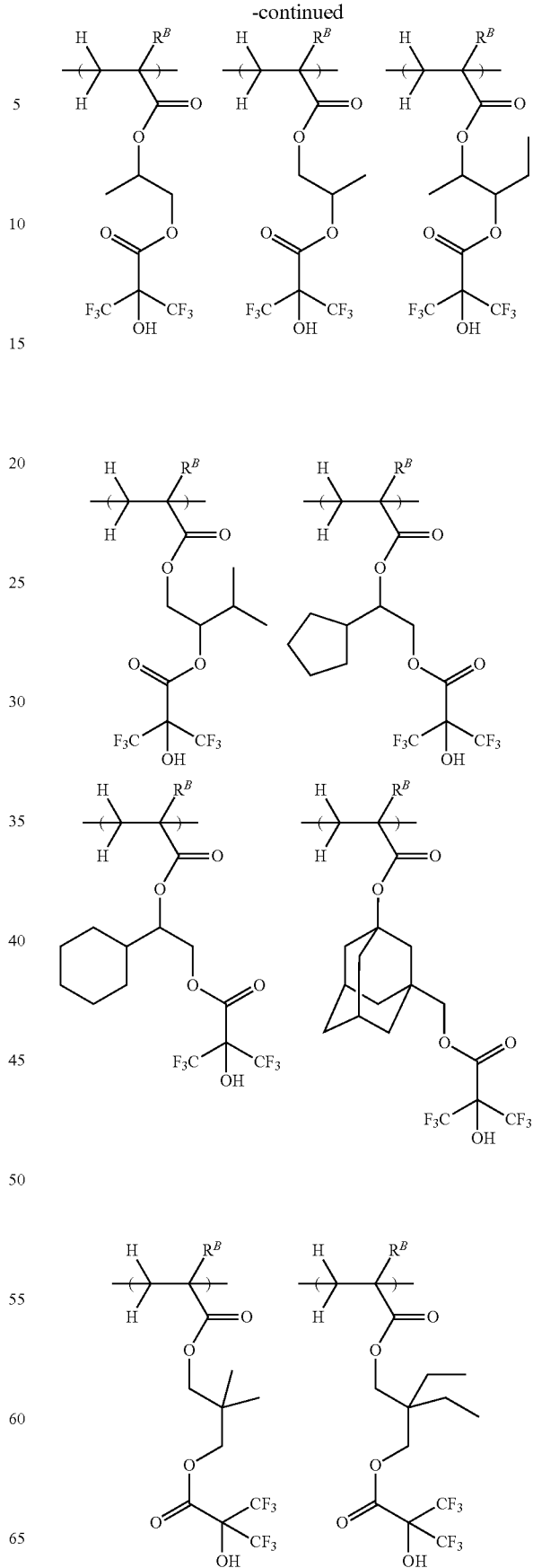

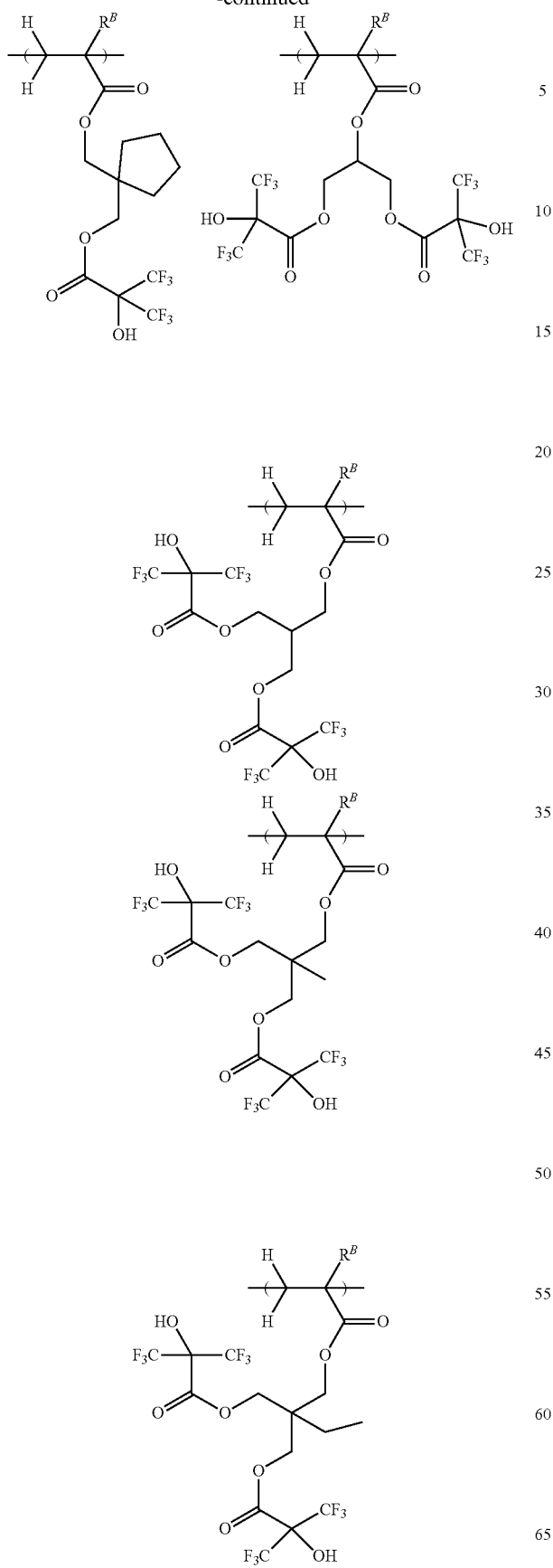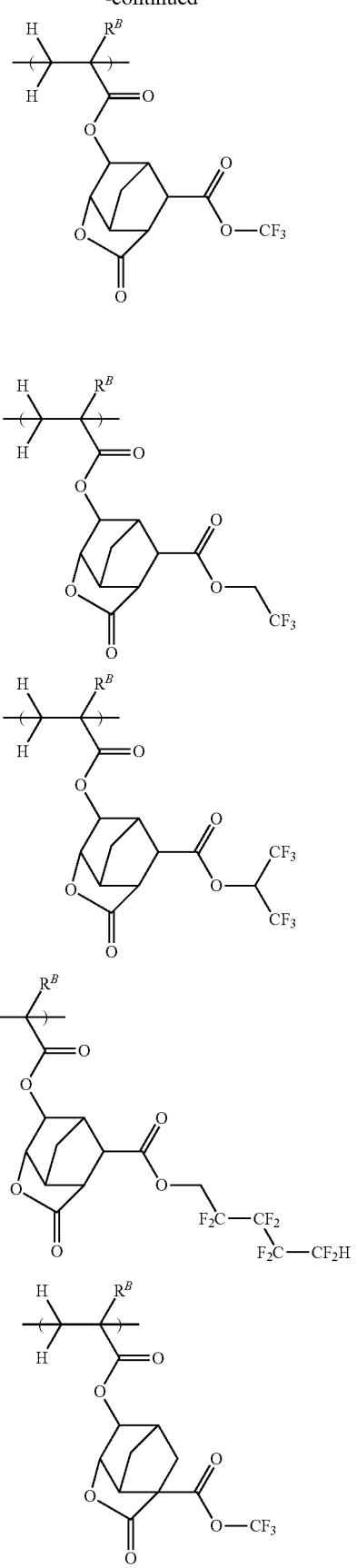

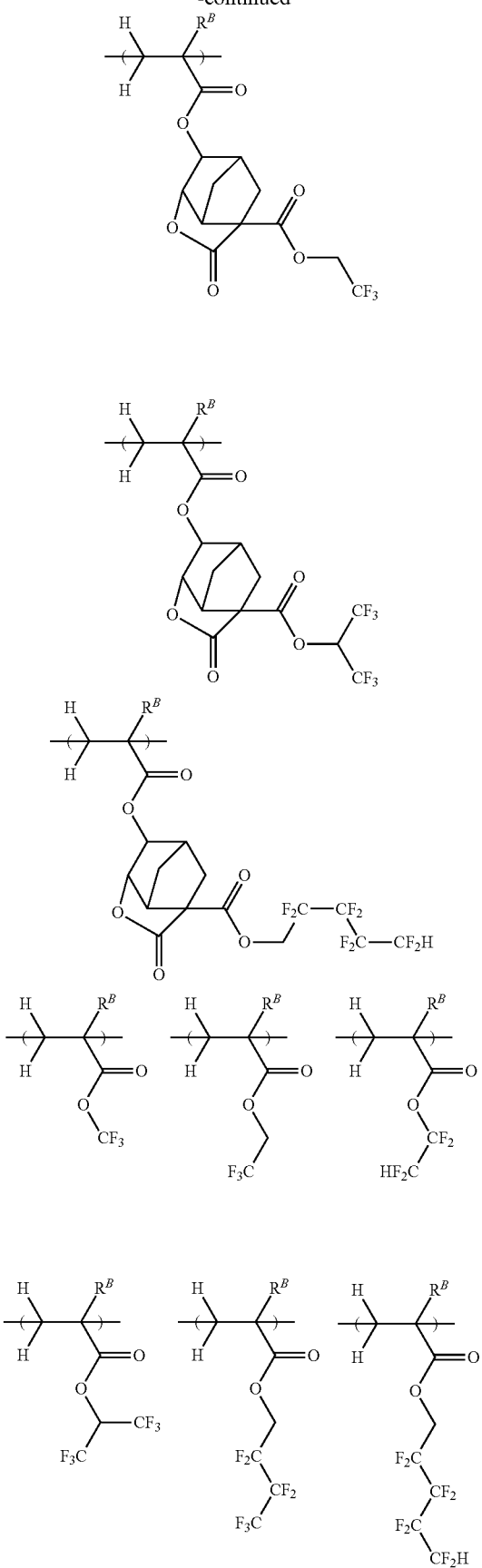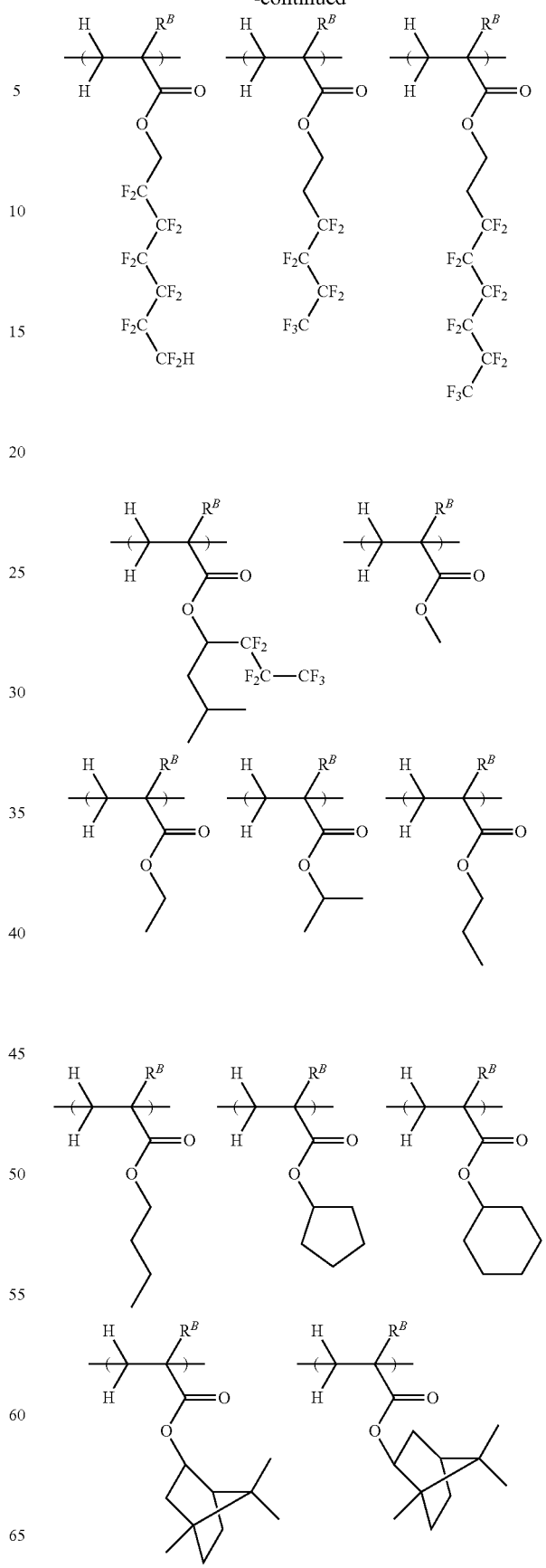

-continued

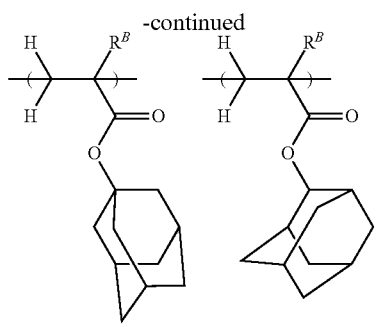

The polymeric surfactant may further contain repeat units other than the repeat units having formulae (4A) to (4E). Typical other repeat units are those derived from methacrylic acid and α-trifluoromethylacrylic acid derivatives. In the polymeric surfactant, the content of the repeat units having formulae (4A) to (4E) is preferably at least 20 mol %, more preferably at least 60 mol %, most preferably 100 mol % of the overall repeat units.

The polymeric surfactant preferably has a Mw of 1,000 to 500,000, more preferably 2,000 to 30,000. A polymeric surfactant having a Mw within the range exerts a satisfactory surface-modifying effect and causes no or few development defects.

The polymeric surfactant may be synthesized, for example, by dissolving an unsaturated bond-containing monomer or monomers, from which repeat units having formulae (4A) to (4E) and optional other repeat units are derived, in an organic solvent, adding a radical initiator, and heating for polymerization. Suitable organic solvents used herein include toluene, benzene, THF, diethyl ether, and dioxane. Examples of the polymerization initiator used herein include AIBN, 2,2'-azobis(2,4-dimethylvaleronitrile), dimethyl 2,2-azobis(2-methylpropionate), benzoyl peroxide, and lauroyl peroxide. Preferably the reaction temperature is 50 to 100° C. and the reaction time is 4 to 24 hours. The acid labile group that has been incorporated in the monomer may be kept as such, or the polymer may be protected or partially protected therewith at the end of polymerization.

During the synthesis of the polymeric surfactant, any of well-known chain transfer agents such as dodecylmercaptan and 2-mercaptoethanol may be used for the purpose of adjusting molecular weight. An appropriate amount of the chain transfer agent is 0.01 to 10 mol % based on the total of monomers to be polymerized.

For the surfactant which is insoluble or substantially insoluble in water and soluble in alkaline developer, reference may be made to JP-A 2008-122932, 2009-098638, 2009-191151, 2009-192784, 2009-276363, 2010-107695, 2010-134012, 2010-250105, and 2011-042789.

The surfactant (F) is preferably formulated in an amount of 0 to 20 parts by weight per 80 parts by weight of the base polymer (C). When used, the amount of the surfactant is preferably at least 0.001 part, more preferably at least 0.01 part by weight and up to 15 parts, more preferably up to 10 parts by weight. The surfactant (F) may be used alone or in admixture.

Process

Another embodiment of the invention is a pattern forming process comprising the steps of applying the resist composition defined above onto a substrate to form a resist film thereon, exposing the resist film to KrF or ArF excimer laser, EB or EUV, and developing the exposed resist film in a developer to form a resist pattern.

The substrate used herein may be selected from, for example, substrates for IC fabrication, e.g., Si, $SiO_2$, SiN, SiON, TiN, WSi, BPSG, SOG, and organic antireflective coating, and substrates for mask circuit fabrication, e.g., Cr, CrO, CrON, $MoSi_2$, and $SiO_2$.

The resist composition is first applied onto a substrate by a suitable coating technique such as spin coating. The coating is prebaked on a hotplate preferably at a temperature of 60 to 150° C. for 1 to 10 minutes, more preferably at 80 to 140° C. for 1 to 5 minutes to form a resist film of 0.05 to 2 μm thick. Once the resist film is formed, pure water rinsing may be carried out to extract the acid generator or the like from the film surface or wash away particles.

Then the resist film is exposed patternwise to KrF or ArF excimer laser, EUV or EB. On use of KrF or ArF excimer laser or EUV, the resist film is exposed through a mask having a desired pattern, preferably in a dose of 1 to 200 $mJ/cm^2$, more preferably 10 to 100 $mJ/cm^2$. On use of EB, a pattern may be written directly or through a mask having the desired pattern, preferably in a dose of 1 to 300 $\mu C/cm^2$, more preferably 10 to 200 $\mu C/cm^2$.

The exposure may be performed by conventional lithography whereas the immersion lithography of holding a liquid having a refractive index of at least 1.0 between the resist film and the projection lens may be employed if desired. In the case of immersion lithography, a protective film which is insoluble in water may be formed on the resist film.

While the water-insoluble protective film serves to prevent any components from being leached out of the resist film and to improve water slippage at the film surface, it is generally divided into two types. The first type is an organic solvent-strippable protective film which must be stripped, prior to alkaline development, with an organic solvent in which the resist film is not dissolvable. The second type is an alkali-soluble protective film which is soluble in an alkaline developer so that it can be removed simultaneously with the removal of solubilized regions of the resist film. The protective film of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective film of the second type is formed.

After the exposure, rinsing or post-soaking may be carried out for removing any residual water on the resist film. After the exposure, the resist film may be baked (PEB), for example, on a hotplate preferably at 60 to 150° C. for 1 to 5 minutes, and more preferably at 80 to 140° C. for 1 to 3 minutes.

Finally, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. In this way the desired pattern is formed on the substrate.

A pattern may also be formed by a double patterning process. The double patterning process includes a trench process of processing an underlay to a 1:3 trench pattern by a first step of exposure and etching, shifting the position, and forming a 1:3 trench pattern by a second step of exposure for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

In the pattern forming process, an alkaline aqueous solution is often used as the developer. Instead, the negative tone development technique wherein the unexposed region of resist film is dissolved in an organic solvent developer is also applicable.

In the organic solvent development, the organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, phenyl acetate, propyl formate, butyl formate, isobutyl formate, pentyl formate, isopentyl formate, methyl valerate, methyl pentenoate, methyl crotonate, ethyl crotonate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

EXAMPLES

Examples and Comparative Examples are given below by way of illustration and not by way of limitation. All parts are by weight (pbw). Analytic instruments are as shown below.
IR: NICOLET 6700 by Thermo Fisher Scientific Inc.
$^1$H-NMR: ECA-500 by JEOL Ltd.
$^{19}$F-NMR: ECA-500 by JEOL Ltd.
LC-MS: 6100 series Quadrupole LC/MS system by Agilent Technologies

[1] Synthesis of Acid Diffusion Inhibitor

Synthesis Example 1-1

Synthesis of Compound Q-A 3,3,3',3'-tetrakis(trifluoromethyl)-1λ4-1,1'-spirobi[3H-2,1-benzoxathiol]

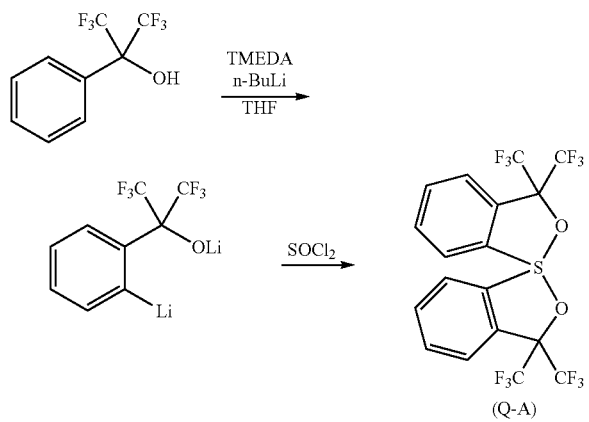

(Q-A)

Under ice cooling, 2.1 g of N,N,N,N-tetramethylethylenediamine (TMEDA) was added dropwise to 32 mL of hexane solution of n-butyllithium (n-BuLi), followed by 30 minutes of aging. Under ice cooling, a mixture of 9.8 g of 1,1,1,3,3,3-hexafluoro-2-phenyl-2-propanol and THF was added dropwise thereto, followed by 20 hours of stirring. Further 50 g of THF was added to the solution, yielding a dilithio compound. A reactor was charged with 21.2 g of thionyl chloride. Under ice cooling, the THF solution of the dilithio compound was added dropwise to the reactor where it was aged for 18 hours. Thereafter, a saturated ammonium chloride aqueous solution was added to the solution to quench the reaction. The organic layer was taken out, washed with water, and concentrated under reduced pressure. Hexane was added to the concentrate for recrystallization. The crystals were collected by filtration and dried in vacuum, obtaining 4.2 g of the target compound Q-A (yield 41%).

Figure 2:
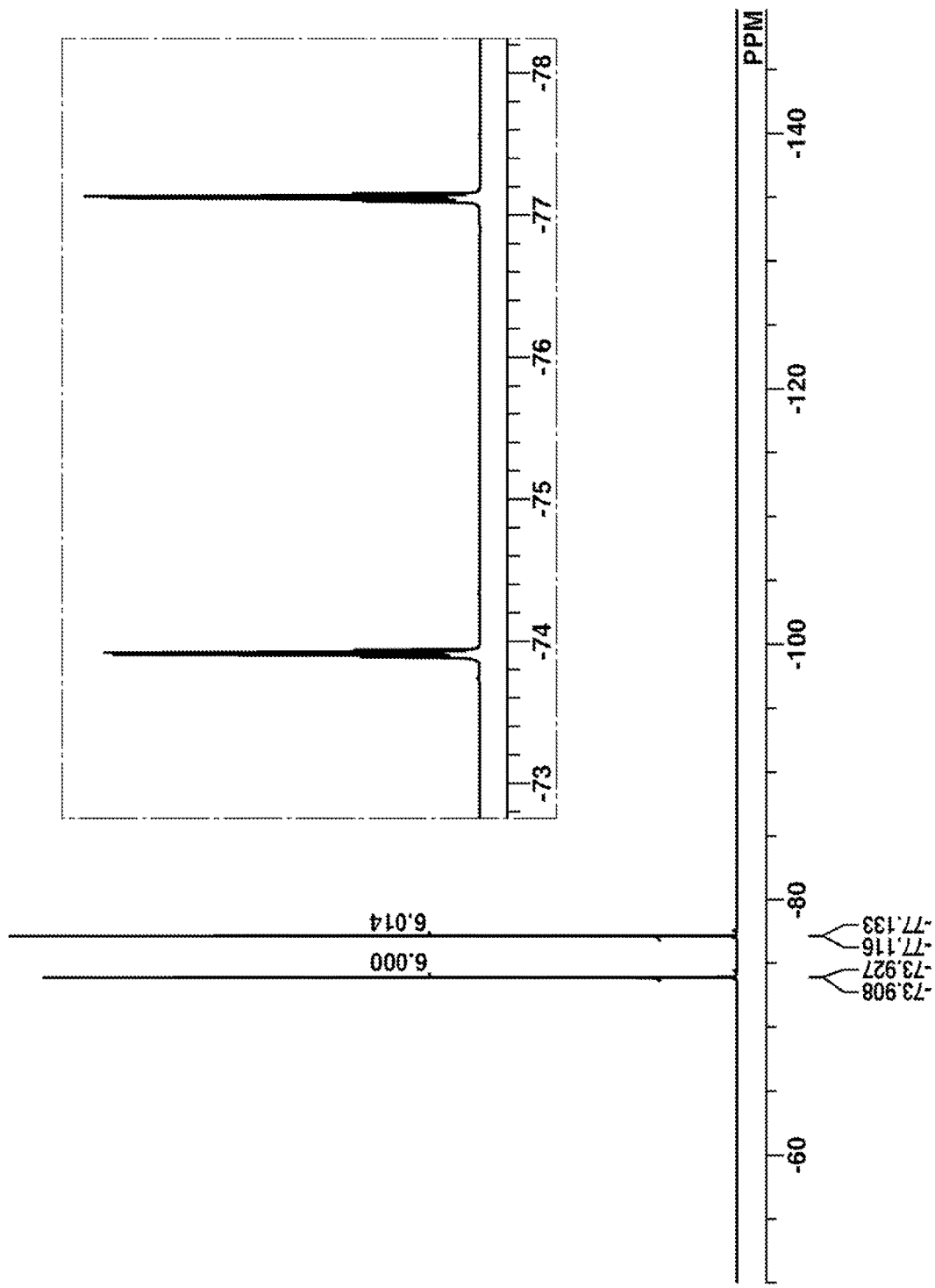
FIG. 2 is a diagram of $^{19}$F-NMR spectrum of Compound Q-A obtained in Synthesis Example 1-1.

The compound Q-A was analyzed by spectroscopy. The NMR spectra, $^1$H-NMR and $^{19}$F-NMR in DMSO-$d_6$ are shown in FIGS. 1 and 2, respectively. In $^1$H-NMR analysis, a minute amount of water was observed.

IR (D-ATR): 3133, 1466, 1448, 1299, 1271, 1210, 1169, 1146, 1115, 1048, 972, 965, 956, 767, 738, 703, 679, 665, 571, 535, 526, 497 cm$^{-1}$

LC/MS: Positive [M+H]$^+$ 517

Synthesis Example 1-2

Synthesis of Compound Q-B 1-chloro-1-[2-(1-hydroxy-1-methylethyl)phenyl]-3,3'-dimethyl[3H-2,1-benzoxathiol]

(1) Synthesis of Intermediate In-1: bis(2-carboxyphenyl) sulfide

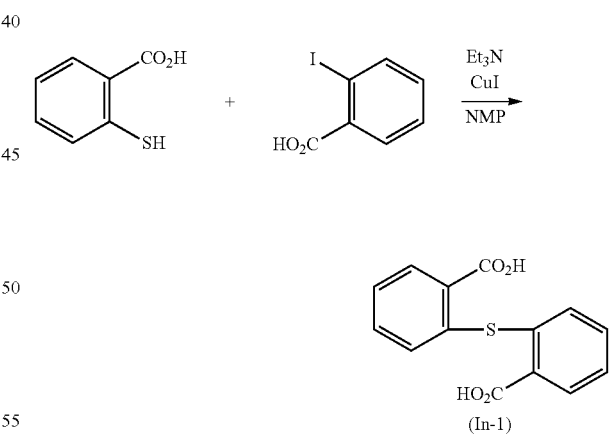

(In-1)

At room temperature, 34.0 g of triethylamine was added dropwise to a mixture of 15.4 g of thiosalicylic acid, 24.8 g of 2-iodobenzoic acid, 0.5 g of copper iodide, and N-methylpyrrolidone (NMP). The solution was aged at 100° C. for 15 hours. Dilute hydrochloric acid was added to the reaction solution. The insoluble or powder was collected by filtration. The powder was dissolved in methanol, after which deionized water was added thereto for recrystallization. The crystals were collected by filtration and heat dried in vacuum, obtaining 23 g of Intermediate In-1 (yield 84%).

(2) Synthesis of Intermediate In-2: 2,2'-dicarboxydiphenylsulfide dimethyl ester

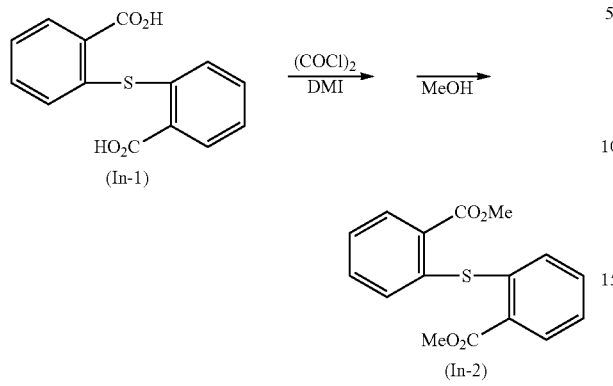

Intermediate In-1, 19.2 g, was dissolved in 100 g of 1,3-dimethyl-2-imidazolidinone (DMI). At room temperature, 26.7 g of oxalyl chloride was added dropwise to the solution, followed by 2 hours of aging. At room temperature, 100 g of methanol was added dropwise to the solution, followed by 3 hours of aging. Thereafter, 300 g of deionized water was added to quench the reaction. 200 g of toluene was added to the solution. The organic layer was taken out, washed with water, and concentrated under reduced pressure. The solvent removal left 22.9 g of concentrated residue. The residue as Intermediate In-2 was to subjected to the subsequent reaction.

(3) Synthesis of Intermediate In-3: bis[2-(1-hydroxy-1-methylethyl)phenyl]sulfide

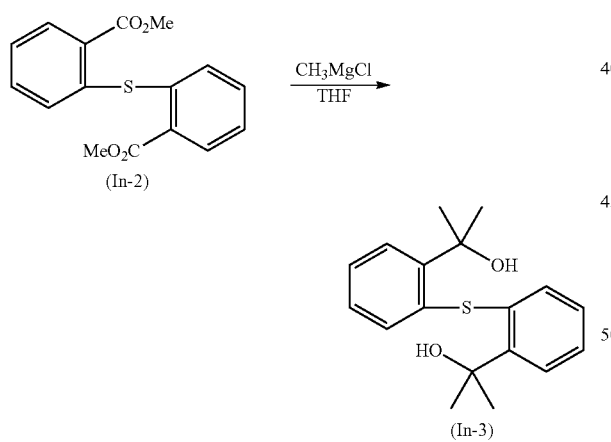

Intermediate In-2, 22.9 g, was dissolved in 75 g of THF. Under ice cooling, 100 g of THF solution of methylmagnesium chloride was added dropwise to the solution, followed by 20 hours of aging. Dilute hydrochloric acid was added to quench the reaction. Thereafter, 220 g of toluene was added to the reaction solution. The organic layer was taken out, washed with water, and concentrated under reduced pressure. To the concentrated residue, 100 g of hexane was added for crystallization. The crystals were collected by filtration and heat dried in vacuum, obtaining 15.7 g of the desired compound, Intermediate In-3 (yield 77%).

(4) Synthesis of Intermediate In-4:
1-chloro-1-[2-(1-hydroxy-1-methylethyl)phenyl]-3,3'-dimethyl[3H-2,1-benzoxathiol]

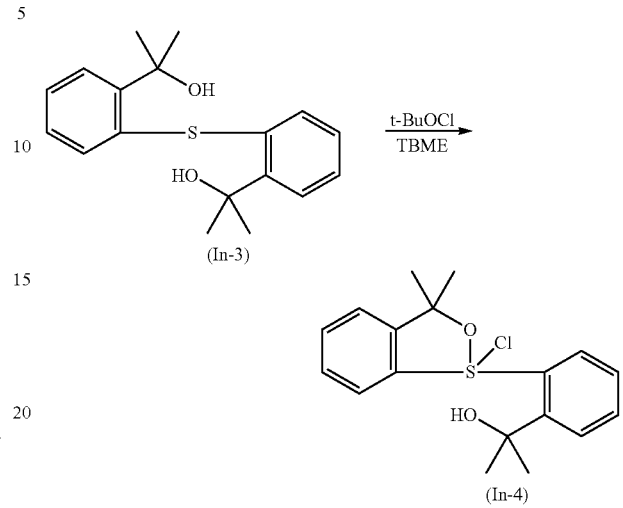

Intermediate In-3, 9.1 g, was dissolved in 50 g of tert-butyl methyl ether (TBME). Under ice cooling, 3.3 g of tert-butyl hypochlorite was added dropwise to the solution, followed by 3 hours of aging. The insoluble or powder was collected by filtration, washed with TBME, and heat dried in vacuum, obtaining 8.2 g of the desired compound, Intermediate In-4 (yield 81%).

(5) Synthesis of Compound Q-B:
1-chloro-1-[2-(1-hydroxy-1-methylethyl)phenyl]-3,3'-dimethyl[3H-2,1-benzoxathiol]

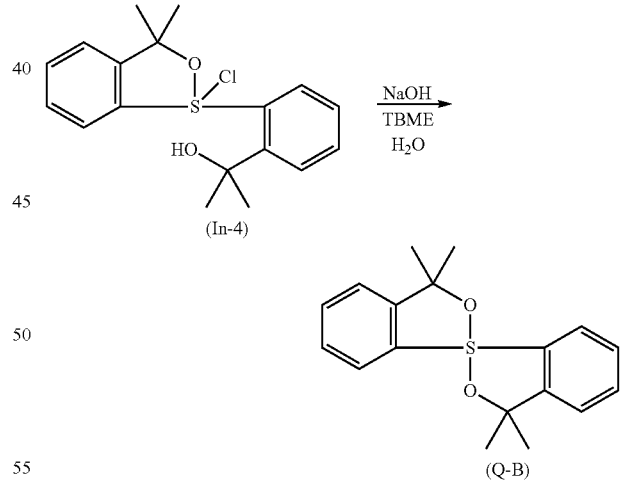

At room temperature, a sodium hydroxide aqueous solution was added dropwise to a mixture of 8.2 g of Intermediate In-4 and 40 g of TBME, followed by 1 hour of aging. Then, 20 g of methyl isobutyl ketone was added to the solution. The organic layer was taken out, washed with deionized water, and concentrated under reduced pressure. Hexane was added to the concentrate for crystallization. The crystals were collected by filtration and heat dried in vacuum, obtaining 5.1 g of the target compound Q-B (yield 73%).

The compound Q-B was analyzed by spectroscopy. The NMR spectrum, $^1$H-NMR in DMSO-$d_6$ is shown in FIG. 3.

IR (D-ATR): 2974, 2928, 1468, 1446, 1436, 1374, 1357, 1285, 1251, 1165, 1156, 960, 945, 869, 782, 768, 743, 631, 622, 539, 532, 481, 458, 430 cm$^{-1}$

LC/MS: Positive [M+H]$^+$ 301

[2] Synthesis of Base Polymers

Synthesis Example 2-1

Synthesis of Polymer P-1

In nitrogen atmosphere, 19 g of 1-ethylcyclopentyl methacrylate, 17 g of 2-oxotetrahydrofuran-3-yl mechacrylate, 0.48 g of dimethyl 2,2'-azobis(2-methylpropionate) (V-601 by Fuji Film Wako Pure Chemical Corp.), 0.41 g of 2-mercaptoethanol, and 50 g of methyl ethyl ketone were fed into a funnel to form a monomer/initiator solution. A flask in nitrogen atmosphere was charged with 23 g of methyl ethyl ketone, which was heated at 80° C. with stirring. With stirring, the monomer/initiator solution was added dropwise to the flask over 4 hours. After the completion of dropwise addition, the polymerization solution was continuously stirred for 2 hours while maintaining its temperature at 80° C. After the polymerization solution was cooled to room temperature, it was added dropwise to 640 g of methanol under vigorous stirring. The precipitate was collected by filtration, washed twice with 240 g of methanol, and vacuum dried at 50° C. for 20 hours, obtaining a polymer P-1 in white powder form. Amount 36 g, yield 90%. On GPC analysis, Polymer P-1 had a Mw of 8,755 and a Mw/Mn of 1.94.

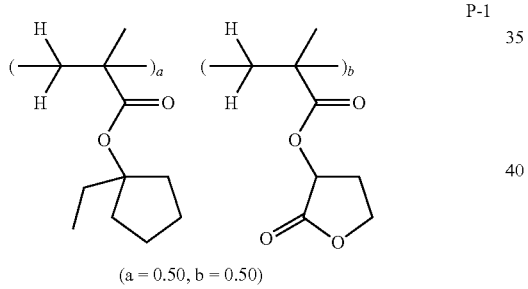

P-1

(a = 0.50, b = 0.50)

Synthesis Examples 2-2 to 2-14

Synthesis of Polymers P-2 to P-14

Polymers consisting of units in Table 1 were synthesized by the same procedure as in Synthesis Example 2-1 aside from changing the type and amount of monomers. Table 1 shows the proportion (in molar ratio) of repeat units incorporated in the polymers.

TABLE 1

| Polymer | Unit 1 (ratio) | Unit 2 (ratio) | Unit 3 (ratio) | Unit 4 (ratio) |
|---|---|---|---|---|
| P-1 | A-1 (0.50) | B-1 (0.50) | — | — |
| P-2 | A-2 (0.50) | B-2 (0.40) | B-4 (0.10) | — |
| P-3 | A-1 (0.50) | B-1 (0.30) | B-3 (0.20) | — |
| P-4 | A-1 (0.30) | A-4 (0.20) | B-3 (0.50) | — |
| P-5 | A-1 (0.30) | A-2 (0.20) | B-1 (0.40) | B-4 (0.10) |
| P-6 | A-1 (0.30) | A-2 (0.20) | B-2 (0.40) | B-4 (0.10) |
| P-7 | A-4 (0.50) | B-3 (0.50) | — | — |
| P-8 | A-1 (0.30) | A-3 (0.20) | B-3 (0.40) | B-4 (0.10) |
| P-9 | A-2 (0.30) | B-2 (0.40) | B-5 (0.20) | PM-1 (0.10) |

TABLE 1-continued

| Polymer | Unit 1 (ratio) | Unit 2 (ratio) | Unit 3 (ratio) | Unit 4 (ratio) |
|---|---|---|---|---|
| P-10 | A-1 (0.50) | B-6 (0.40) | PM-2 (0.10) | — |
| P-11 | A-1 (0.50) | B-6 (0.40) | PM-3 (0.10) | — |
| P-12 | A-1 (0.60) | B-6 (0.40) | — | — |
| P-13 | A-5 (0.60) | B-6 (0.40) | — | — |
| P-14 | A-6 (0.60) | B-6 (0.40) | — | — |

The structure of repeat units in Table 1 is shown below.

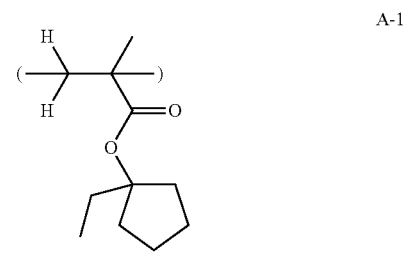

A-1

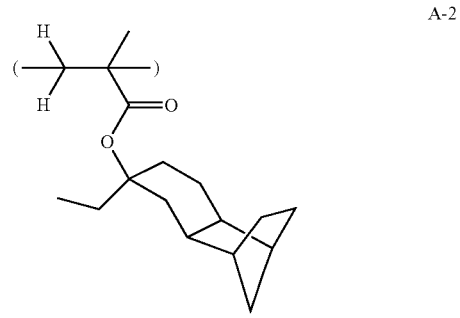

A-2

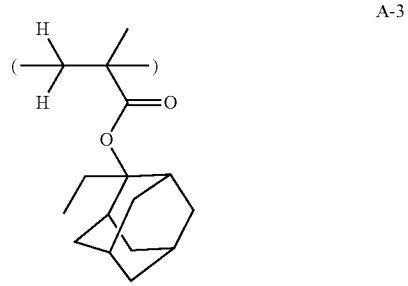

A-3

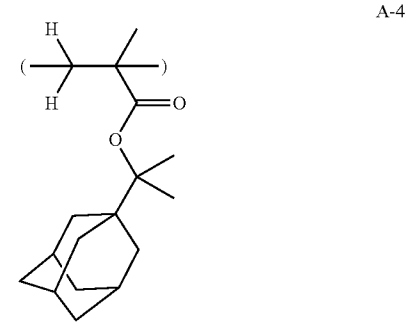

A-4

A-5 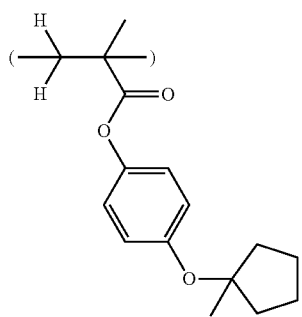
A-6 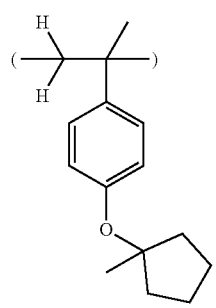
B-1 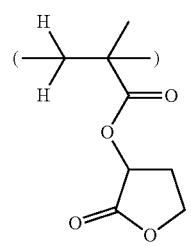
B-2 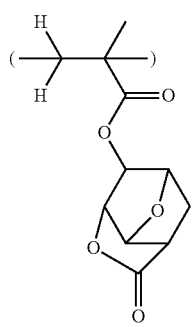
B-3 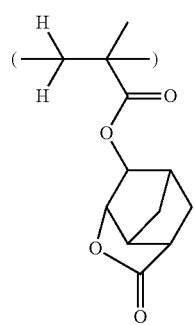
B-4 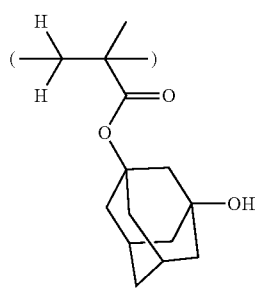
B-5 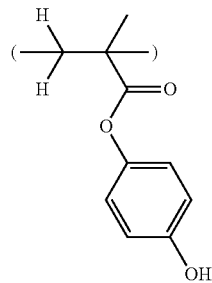
B-6 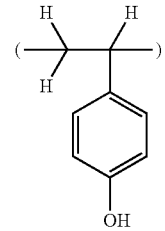
PM-1 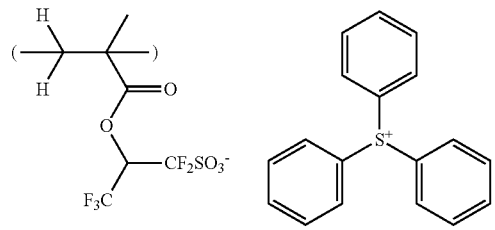
PM-2 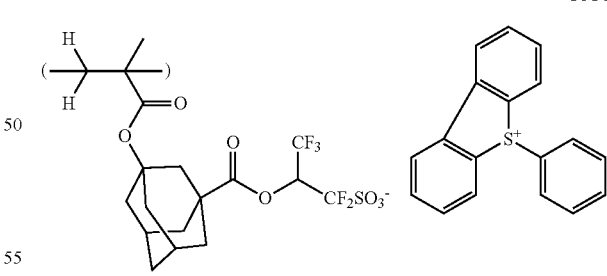
PM-3 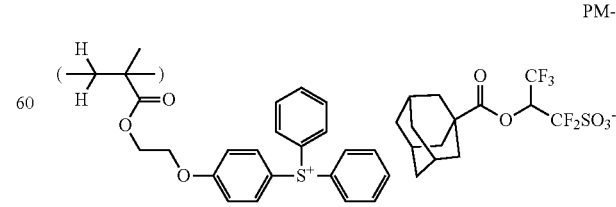

[3] Preparation of Resist Composition

Examples 1-1 to 1-18 and Comparative Examples 1-1 to 1-6

A resist composition (R-01 to R-18, CR-01 to CR-06) was prepared by dissolving an acid diffusion inhibitor (inventive Q-A and Q-B, comparative Q-1 to Q-3), base polymer (P-1 to P-14), photoacid generator (PAG-X), and surfactant (SF-1) in an organic solvent containing 0.01 wt % of surfactant A in accordance with the formulation shown in Table 2, and filtering the solution through a Teflon® filter with a pore size of 0.2 μm.

TABLE 2

|  |  | Resist composition | Base polymer (pbw) | Acid generator (pbw) | Acid diffusion inhibitor (pbw) | Surfactant (pbw) | Solvent 1 (pbw) | Solvent 2 (pbw) |
|---|---|---|---|---|---|---|---|---|
| Example | 1-1 | R-01 | P-1 (80) | PAG-X (7.6) | Q-A (4.0) | F-1 (3.0) | PGMEA (1728) | GBL (192) |
|  | 1-2 | R-02 | P-1 (80) | PAG-X (7.6) | Q-B (2.3) | F-1 (3.0) | PGMEA (1728) | GBL (192) |
|  | 1-3 | R-03 | P-2 (80) | PAG-X (7.6) | Q-B (2.3) | F-1 (3.0) | PGMEA (1728) | GBL (192) |
|  | 1-4 | R-04 | P-3 (80) | PAG-X (7.6) | Q-B (2.3) | F-1 (3.0) | PGMEA (1728) | GBL (192) |
|  | 1-5 | R-05 | P-4 (80) | PAG-X (7.6) | Q-B (2.3) | F-1 (3.0) | PGMEA (1728) | GBL (192) |
|  | 1-6 | R-06 | P-5 (80) | PAG-X (7.6) | Q-B (2.3) | F-1 (3.0) | PGMEA (1728) | GBL (192) |
|  | 1-7 | R-07 | P-6 (80) | PAG-X (7.6) | Q-B (2.3) | F-1 (3.0) | PGMEA (1728) | GBL (192) |
|  | 1-8 | R-08 | P-7 (80) | PAG-X (7.6) | Q-B (2.3) | F-1 (3.0) | PGMEA (1728) | GBL (192) |
|  | 1-9 | R-09 | P-8 (80) | PAG-X (7.6) | Q-B (2.3) | F-1 (3.0) | PGMEA (1728) | GBL (192) |
|  | 1-10 | R-10 | P-9 (80) | PAG-X (7.6) | Q-A (10.0) | F-1 (3.0) | PGMEA (1728) | GBL (192) |
|  | 1-11 | R-11 | P-9 (80) | PAG-X (7.6) | Q-B (5.8) | F-1 (3.0) | PGMEA (1728) | GBL (192) |
|  | 1-12 | R-12 | P-10 (80) | PAG-X (7.6) | Q-B (5.8) | F-1 (3.0) | PGMEA (1728) | GBL (192) |
|  | 1-13 | R-13 | P-11 (80) | PAG-X (7.6) | Q-B (5.8) | F-1 (3.0) | PGMEA (1728) | GBL (192) |
|  | 1-14 | R-14 | P-12 (80) | PAG-X (7.6) | Q-B (5.8) | F-1 (3.0) | PGMEA (1728) | GBL (192) |
|  | 1-15 | R-15 | P-13 (80) | PAG-X (7.6) | Q-B (5.8) | F-1 (3.0) | PGMEA (1728) | GBL (192) |
|  | 1-16 | R-16 | P-14 (80) | PAG-X (7.6) | Q-B (5.8) | F-1 (3.0) | PGMEA (1728) | GBL (192) |
|  | 1-17 | R-17 | P-1 (80) | PAG-X (7.6) | Q-B (1.2) Q.1 (0.7) | F-1 (3.0) | PGMEA (1728) | GBL (192) |
|  | 1-18 | R-18 | P-9 (80) | PAG-X (7.6) | Q-B (2.9) Q-3 (1.9) | F-1 (3.0) | PGMEA (1728) | GBL (192) |
| Comparative Example | 1-1 | CR-01 | P-1 (80) | PAG-X (7.6) | Q-1 (1.3) | F-1 (3.0) | PGMEA (1728) | GBL (192) |
|  | 1-2 | CR-02 | P-1 (80) | PAG-X (7.6) | Q-2 (3.8) | F-1 (3.0) | PGMEA (1728) | GBL (192) |
|  | 1-3 | CR-03 | P-2 (80) | PAG-X (7.6) | Q-3 (3.1) | F-1 (3.0) | PGMEA (1728) | GBL (192) |
|  | 1-4 | CR-04 | P-9 (80) | PAG-X (7.6) | Q-1 (1.9) Q-3 (1.9) | F-1 (3.0) | PGMEA (1728) | GBL (192) |
|  | 1-5 | CR-05 | P-9 (80) | PAG-X (7.6) | Q-2 (3.8) | F-1 (3.0) | PGMEA (1728) | GBL (192) |
|  | 1-6 | CR-06 | P-12 (80) | PAG-X (7.6) | Q-3 (3.1) | F-1 (3.0) | PGMEA (1728) | GBL (192) |

The solvents, photoacid generator PAG-X, surfactant SF-1, Surfactant A, and comparative acid diffusion inhibitors Q-1 to Q-3 in Table 2 are identified below.

Solvents
　PGMEA (propylene glycol monomethyl ether acetate)
　GBL (γ-butyrolactone)

Photoacid Generator PAG-X:
　triphenylsulfonium 2-(adamantane-1-carbonyloxy)-1,1,3,3-pentafluoropropane-1-sulfonate Comparative Acid Diffusion Inhibitors
　Q-1: 2-(4-morpholinyl)ethyl laurate
　Q-2: triphenylsulfonium 10-camphorsulfonate
　Q-3: triphenylsulfonium salicylate (Q-1)

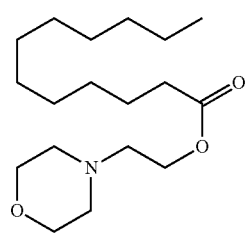

(Q-2)

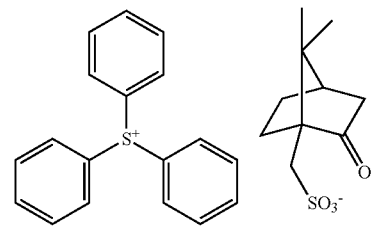

(Q-3)

Alkali-Soluble Surfactant SF-1:
　poly(2,2,3,3,4,4,4-heptafluoro-1-isobutyl-1-butyl methacrylate/9-(2,2,2-trifluoro-1-trifluoroethyloxycarbonyl)-4-oxatricyclo[4.2.1.0$^{3,7}$]nonan-5-on-2-yl methacrylate)
　Mw=7,700
　Mw/Mn=1.82

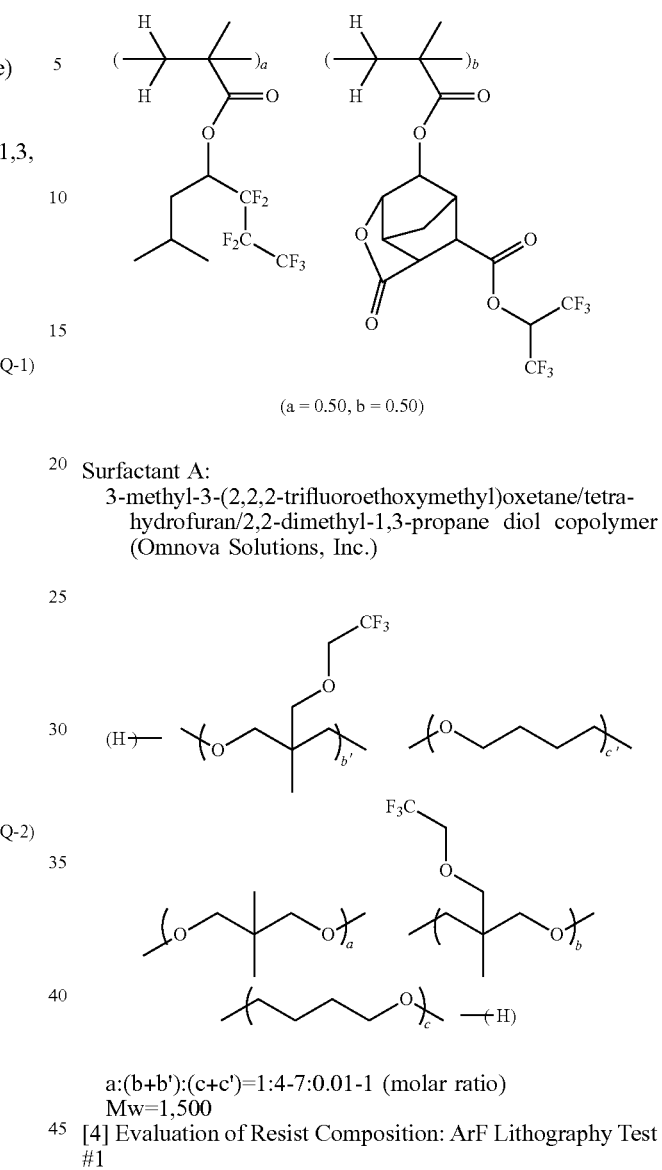

SF-1

(a = 0.50, b = 0.50)

Surfactant A:
　3-methyl-3-(2,2,2-trifluoroethoxymethyl)oxetane/tetrahydrofuran/2,2-dimethyl-1,3-propane diol copolymer (Omnova Solutions, Inc.)

a:(b+b'):(c+c')=1:4-7:0.01-1 (molar ratio)
Mw=1,500

[4] Evaluation of Resist Composition: ArF Lithography Test #1

Examples 2-1 to 2-10 and Comparative Examples 2-1 to 2-3

An antireflective coating solution (ARC29A, Nissan Chemical Corp.) was coated on a silicon substrate and baked at 200° C. for 60 seconds to form an antireflective coating of 100 nm thick. Each of the resist compositions (R-01 to R-09, R-17, CR-01 to CR-03) was spin coated on the substrate and prebaked on a hotplate at 90° C. for 60 seconds to form a resist film of 90 nm thick. The resist film was exposed by ArF immersion lithography using an ArF excimer laser scanner (NSR-S610C by Nikon Corp., NA 1.30, quadrupole, 6% halftone phase shift mask). Water was used as the immersion liquid. After exposure, the resist film was baked (PEB) at the temperature shown in Table 3 for 60 seconds and developed in a 2.38 wt % TMAH aqueous solution for 60 seconds, forming a 1:1 line-and-space (LS) pattern of 40 nm.

The LS pattern was observed under an electron microscope CD-SEM (CG-500 by Hitachi High-Technologies Corp.) and evaluated for sensitivity, LWR, and collapse resistance by the following methods.

Evaluation of Sensitivity

The optimum dose (Eop) is a dose (mJ/cm$^2$) which provides a LS pattern having a line width of 40 nm.

Evaluation of LWR

With respect to the LS pattern formed by exposure in the optimum dose, the space width was measured at longitudinally spaced apart 30 points, from which a 3-fold value ($3\sigma$) of standard deviation ($\sigma$) was determined and reported as LWR. A smaller value of LWR indicates that the line pattern has little or no fluctuation and is more satisfactory.

Evaluation of Collapse Resistance

In the process, the line size was reduced as the exposure dose was increased. The minimum size (nm) above which lines can be resolved without collapse is determined and reported as collapse limit. A smaller value indicates greater collapse resistance and is preferable.

The results are shown in Table 3.

TABLE 3

|  |  | Resist composition | PEB temp. (° C.) | Eop (mJ/cm$^2$) | LWR (nm) | Collapse limit (nm) |
|---|---|---|---|---|---|---|
| Example | 2-1 | R-01 | 85 | 36 | 3.2 | 32 |
|  | 2-2 | R-02 | 85 | 35 | 2.8 | 28 |
|  | 2-3 | R-03 | 85 | 36 | 2.9 | 29 |
|  | 2-4 | R-04 | 75 | 38 | 2.9 | 30 |
|  | 2-5 | R-05 | 95 | 40 | 3.1 | 28 |
|  | 2-6 | R-06 | 85 | 36 | 3.0 | 30 |
|  | 2-7 | R-07 | 85 | 39 | 3.1 | 32 |
|  | 2-8 | R-08 | 90 | 41 | 3.2 | 31 |
|  | 2-9 | R-09 | 90 | 40 | 3.2 | 31 |
|  | 2-10 | R-17 | 85 | 38 | 3.0 | 30 |
| Comparative Example | 2-1 | CR-01 | 85 | 38 | 4.1 | 43 |
|  | 2-2 | CR-02 | 85 | 34 | 3.8 | 40 |
|  | 2-3 | CR-03 | 85 | 40 | 3.6 | 38 |

It is evident from the data of Table 3 that the resist compositions within the scope of the invention form, through alkaline development, positive patterns having improved LWR and collapse resistance. They are thus best suited as the ArF immersion lithography material.

[5] Evaluation of Resist Composition: ArF Lithography Test #2

Examples 3-1 to 3-10 and Comparative Examples 3-1 to 3-3

On a silicon wafer, a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, each of the resist compositions (R-01 to R-09, R-17, CR-01 to CR-03) was spin coated and baked on a hotplate at 100° C. for 60 seconds to form a resist film of 90 nm thick. Using an ArF excimer laser immersion lithography scanner NSR-610C (Nikon Corp., NA 1.30, $\sigma$0.98/0.74, cross-pole opening 35 deg.), pattern exposure was performed through a photomask with a varying exposure dose and focus. Water was used as the immersion liquid. After exposure, the resist film was baked (PEB) at the temperature shown in Table 4 for 60 seconds and developed in butyl acetate for 30 seconds. The photomask used herein is a binary mask having an on-mask design corresponding to a 55 nm dot/90 nm pitch pattern (actual on-mask size is 4 times because of ¼ image reduction projection exposure). A hole pattern was printed on the resist film through pattern reversal.

The hole pattern was observed under an electron microscope CD-SEM (CG-500 by Hitachi High-Technologies Corp.) and evaluated for sensitivity, CDU, and DOF by the following methods.

Evaluation of Sensitivity

The optimum dose (Eop) is the dose (mJ/cm$^2$) that provides a hole inner diameter of 50 nm.

Evaluation of CDU

The diameter of 50 holes was measured, from which a 3-fold value ($3\sigma$) of standard deviation ($\sigma$) was computed and reported as CDU. A smaller value of CDU is better.

Evaluation of DOF

A focus range where a hole pattern could be resolved at the optimum dose was determined and reported as depth of focus (DOF, nm). A larger value of DOF indicates a wider permissible margin for focus offset and is preferable.

The results are shown in Table 4.

TABLE 4

|  |  | Resist composition | PEB temp. (° C.) | Eop (mJ/cm$^2$) | CDU (nm) | DOF (nm) |
|---|---|---|---|---|---|---|
| Example | 3-1 | R-01 | 85 | 39 | 3.1 | 120 |
|  | 3-2 | R-02 | 85 | 38 | 2.8 | 130 |
|  | 3-3 | R-03 | 85 | 39 | 2.9 | 140 |
|  | 3-4 | R-04 | 75 | 39 | 2.9 | 130 |
|  | 3-5 | R-05 | 95 | 37 | 3.0 | 120 |
|  | 3-6 | R-06 | 85 | 38 | 2.9 | 140 |
|  | 3-7 | R-07 | 85 | 36 | 3.1 | 140 |
|  | 3-8 | R-08 | 90 | 38 | 3.2 | 120 |
|  | 3-9 | R-09 | 90 | 37 | 3.1 | 130 |
|  | 3-10 | R-17 | 85 | 39 | 3.0 | 130 |
| Comparative Example | 3-1 | CR-01 | 85 | 39 | 4.3 | 90 |
|  | 3-2 | CR-02 | 85 | 38 | 4.0 | 80 |
|  | 3-3 | CR-03 | 85 | 39 | 3.8 | 90 |

It is evident from Table 4 that the resist compositions within the scope of the invention form, through organic solvent development, negative patterns having improved CDU and DOF. They are thus best suited for ArF lithography micropatterning.

[6] Evaluation of Resist Composition: EUV Lithography Test

Examples 4-1 to 4-8 and Comparative Examples 4-1 to 4-3

Each of the resist compositions (R-10 to R-18, CR-04 to CR-06) was spin coated on a silicon substrate having a 20-nm coating of silicon-containing spin-on hard mask SHB-A940 (Shin-Etsu Chemical Co., Ltd., silicon content 43 wt %) and prebaked on a hotplate at 100° C. for 60 seconds to form a resist film of 40 nm thick. Using an EUV scanner NXE3300 (ASML, NA 0.33, $\sigma$0.9, 90° dipole illumination), the resist film was exposed to EUV through a mask bearing a 1:1 LS pattern with a size of 22 nm. The resist film was baked (PEB) on a hotplate at the temperature shown in Table 5 for 60 seconds and developed in a 2.38 wt % TMAH aqueous solution for 30 seconds to form a LS pattern.

The LS pattern was observed under CD-SEM (CG-5000, Hitachi High-Technologies Corp.) and evaluated for sensitivity, LWR, and maximum resolution by the following methods.

Evaluation of Sensitivity

The optimum dose Eop is a dose (mJ/cm$^2$) which provides a LS pattern with a space width of 22 nm and a pitch of 44 nm and is reported as sensitivity.

Evaluation of LWR

For the LS pattern formed by exposure in the optimum dose Eop, the space width was measured at longitudinally spaced apart 10 points, from which a 3-fold value (3σ) of standard deviation (σ) was determined and reported as LWR. A smaller value of 3σ indicates a pattern having a lower roughness and more uniform space width.

Evaluation of Maximum Resolution

The minimum line width (nm) of the LS pattern which remains separate at the optimum dose Eop is reported as maximum resolution.

The results are shown in Table 5.

TABLE 5

|  |  | Resist composition | PEB temp. (° C.) | Eop (mJ/cm$^2$) | LWR (nm) | Maximum resolution (nm) |
|---|---|---|---|---|---|---|
| Example | 4-1 | R-10 | 90 | 40 | 5.0 | 18 |
|  | 4-2 | R-11 | 90 | 43 | 4.9 | 16 |
|  | 4-3 | R-12 | 95 | 45 | 4.6 | 14 |
|  | 4-4 | R-13 | 85 | 48 | 5.0 | 18 |
|  | 4-5 | R-14 | 85 | 42 | 4.9 | 16 |
|  | 4-6 | R-15 | 85 | 40 | 5.0 | 18 |
|  | 4-7 | R-16 | 85 | 43 | 4.8 | 16 |
|  | 4-8 | R-18 | 90 | 44 | 4.9 | 18 |
| Comparative Example | 4-1 | CR-04 | 90 | 52 | 6.1 | 22 |
|  | 4-2 | CR-05 | 90 | 50 | 5.9 | 22 |
|  | 4-3 | CR-06 | 95 | 55 | 5.7 | 20 |

It is evident from Table 5 that the resist compositions within the scope of the invention form positive patterns having satisfactory sensitivity, LWR and resolution when processed by the EUV lithography and alkaline solution development.

Japanese Patent Application No. 2020-192128 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising (A) a compound having the formula (1), (B) an organic solvent, and (C) a base polymer comprising repeat units having an acid labile group,

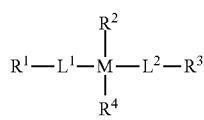

(1)

wherein R$^1$ to R$^4$ are each independently a C$_1$-C$_{20}$ hydrocarbyl group which may contain a heteroatom, R$^1$ and R$^2$ may bond together to form a ring with L$^1$ and M to which they are attached, each pair of R$^1$ and R$^2$, and R$^3$ and R$^4$ may bond together to form a spiro ring containing M as the spiro atom, L$^1$ and L$^2$ are each independently —O— or —N(R)—, R is hydrogen or a C$_1$-C$_{20}$ hydrocarbyl group which may contain a heteroatom, and M is sulfur or selenium.

2. The resist composition of claim 1 wherein the repeat units having an acid labile group are represented by the formula (a1) or (a2):

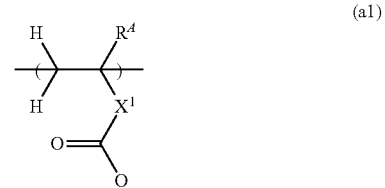

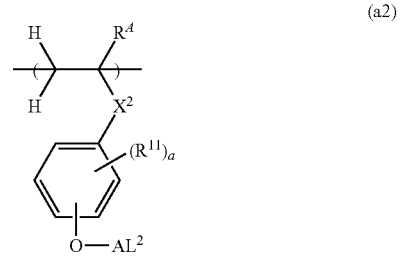

wherein R$^A$ is each independently hydrogen, fluorine, methyl or trifluoromethyl, X$^1$ is a single bond, phenylene group, naphthylene group, or *—C(=O)—O—X$^{11}$—, X$^{11}$ is a C$_1$-C$_{10}$ saturated hydrocarbylene group which may contain a hydroxy moiety, ether bond, ester bond or lactone ring, or phenylene group or naphthylene group, X$^2$ is a single bond or *—C(=O)—O—, the asterisk (*) designates a point of attachment to the carbon atom in the backbone, AL$^1$ and AL$^2$ are each independently an acid labile group, R$^{11}$ is a C$_1$-C$_{20}$ hydrocarbyl group which may contain a heteroatom, and a is an integer of 0 to 4.

3. The resist composition of claim 1 wherein the base polymer further comprises repeat units having the formula (b1) or (b2):

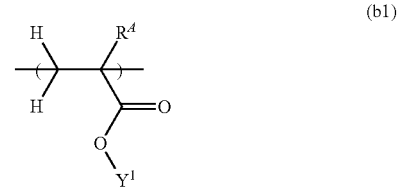

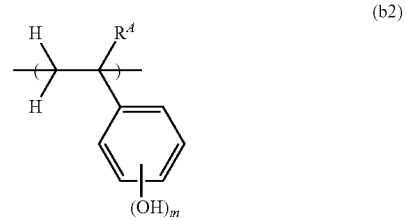

wherein $R^4$ is each independently hydrogen, fluorine, methyl or trifluoromethyl, $Y^1$ is hydrogen or a polar group containing at least one moiety selected from hydroxy, cyano, carbonyl, carboxy, ether bond, ester bond, sulfonic ester bond, carbonate bond, lactone ring, sultone ring, and carboxylic anhydride, and m is 1 or 2.

4. The resist composition of claim 1 wherein the base polymer further comprises repeat units having a photoacid generating group.

5. The resist composition of claim 1, further comprising (D) a photoacid generator.

6. The resist composition of claim 1, further comprising (E) an acid diffusion inhibitor other than the compound having formula (1).

7. The resist composition of claim 1, further comprising (F) a surfactant.

8. A pattern forming process comprising the steps of applying the resist composition of claim 1 to form a resist film on a substrate, exposing the resist film to KrF excimer laser radiation, ArF excimer laser radiation, EB, or EUV, and developing the exposed resist film in a developer.

* * * * *